US008117751B2

(12) United States Patent

Silverbrook

(10) Patent No.: US 8,117,751 B2
(45) Date of Patent: Feb. 21, 2012

(54) METHOD OF FORMING PRINTHEAD BY REMOVING SACRIFICIAL MATERIAL THROUGH NOZZLE APERTURES

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 173 days.

(21) Appl. No.: 12/501,473

(22) Filed: Jul. 12, 2009

(65) Prior Publication Data

US 2009/0275151 A1 Nov. 5, 2009

Related U.S. Application Data

(63) Continuation-in-part of application No. 11/926,109, filed on Oct. 28, 2007, now Pat. No. 7,568,788, which is a continuation of application No. 11/778,572, filed on Jul. 16, 2007, now Pat. No. 7,566,113, which is a continuation of application No. 11/349,074, filed on Feb. 8, 2006, now Pat. No. 7,255,424, which is a continuation of application No. 10/982,789, filed on Nov. 8, 2004, now Pat. No. 7,086,720, which is a continuation of application No. 10/421,823, filed on Apr. 24, 2003, now Pat. No. 6,830,316, which is a continuation of application No. 09/113,122, filed on Jul. 10, 1998, now Pat. No. 6,557,977.

(30) Foreign Application Priority Data

Jul. 15, 1997 (AU) ....................................... PO7991
Jul. 15, 1997 (AU) ....................................... PO8004

(51) Int. Cl.

| | |
|---|---|
| ***B21D 53/76*** | (2006.01) |
| ***B23P 17/00*** | (2006.01) |
| ***H01L 41/22*** | (2006.01) |
| ***H04R 17/00*** | (2006.01) |
| ***B41J 2/15*** | (2006.01) |
| ***B41J 2/145*** | (2006.01) |
| ***B41J 2/135*** | (2006.01) |

(52) U.S. Cl. ........... 29/890.1; 29/25.35; 347/40; 347/44

(58) Field of Classification Search ................. 29/890.1, 29/25.35; 310/311, 316.01, 317; 347/20, 347/40, 44, 65, 68–70

See application file for complete search history.

(56) References Cited

U.S. PATENT DOCUMENTS

| | | | | | |
|---|---|---|---|---|---|
| 4,032,929 | A | * | 6/1977 | Fischbeck et al. | 347/42 |
| 4,210,920 | A | * | 7/1980 | Burnett et al. | 347/75 |
| 4,460,905 | A | * | 7/1984 | Thomas | 347/54 |
| 4,499,480 | A | * | 2/1985 | Takatori et al. | 347/42 |
| 4,576,111 | A | * | 3/1986 | Slomianny | 118/313 |
| 4,633,267 | A | * | 12/1986 | Meinhof | 347/54 |
| 4,684,913 | A | * | 8/1987 | Yaeger | 337/140 |

(Continued)

FOREIGN PATENT DOCUMENTS

DE 3245283 A 6/1984

(Continued)

*Primary Examiner* — David Angwin

(57) ABSTRACT

A method of fabricating an inkjet printhead by forming a plurality of actuators on a monolithic substrate, covering the actuators with a sacrificial material, covering the sacrificial material with a printhead surface layer, defining a plurality of nozzle apertures in the printhead surface layer such that each of the actuators corresponds to one of the nozzle apertures and then, removing at least some of the sacrificial material on each of the actuators through the nozzle aperture corresponding to each of the actuators.

1 Claim, 32 Drawing Sheets

U.S. PATENT DOCUMENTS

| | | | | |
|---|---|---|---|---|
| 4,723,131 | A * | 2/1988 | Droit | 347/54 |
| 4,737,802 | A * | 4/1988 | Mielke | 347/54 |
| 5,059,989 | A * | 10/1991 | Eldridge et al. | 347/63 |
| 5,387,314 | A * | 2/1995 | Baughman et al. | 216/27 |
| 5,427,846 | A * | 6/1995 | McGaffigan | 428/329 |
| 5,463,413 | A * | 10/1995 | Ho et al. | 347/65 |
| 5,719,604 | A * | 2/1998 | Inui et al. | 347/54 |
| 5,729,262 | A * | 3/1998 | Akiyama et al. | 347/70 |
| 5,828,275 | A * | 10/1998 | Kita et al. | 333/207 |
| 5,854,644 | A * | 12/1998 | Eun | 347/54 |
| 5,903,380 | A * | 5/1999 | Motamedi et al. | 359/224.1 |
| 5,982,521 | A * | 11/1999 | Bessho et al. | 359/198.1 |
| 6,027,205 | A * | 2/2000 | Herbert | 347/54 |
| 6,174,050 | B1 * | 1/2001 | Kashino et al. | 347/65 |
| 6,227,652 | B1 * | 5/2001 | Silverbrook | 347/54 |
| 6,257,705 | B1 * | 7/2001 | Silverbrook | 347/54 |
| 6,312,107 | B1 * | 11/2001 | Silverbrook | 347/54 |
| 6,312,110 | B1 * | 11/2001 | Darty | 347/55 |
| 6,394,581 | B1 * | 5/2002 | Silverbrook | 347/54 |
| 6,481,821 | B1 * | 11/2002 | Yun et al. | 347/20 |
| 6,557,977 | B1 * | 5/2003 | Silverbrook | 347/54 |
| 6,574,958 | B1 * | 6/2003 | MacGregor | 60/527 |
| 6,830,316 | B2 * | 12/2004 | Silverbrook | 347/54 |
| 6,880,916 | B2 * | 4/2005 | Kim | 347/47 |
| 7,073,890 | B2 * | 7/2006 | Cabal et al. | 347/54 |
| 7,086,720 | B2 * | 8/2006 | Silverbrook | 347/54 |
| 7,108,355 | B2 * | 9/2006 | Silverbrook | 347/57 |
| 7,140,719 | B2 * | 11/2006 | Silverbrook | 347/54 |
| 7,175,775 | B2 * | 2/2007 | Silverbrook | 216/27 |
| 7,255,424 | B2 * | 8/2007 | Silverbrook | 347/54 |
| 7,364,271 | B2 * | 4/2008 | Silverbrook | 347/54 |
| 7,566,113 | B2 * | 7/2009 | Silverbrook | 347/54 |
| 7,568,788 | B2 * | 8/2009 | Silverbrook | 347/54 |
| 7,578,582 | B2 * | 8/2009 | Silverbrook | 347/54 |
| 7,591,539 | B2 * | 9/2009 | Silverbrook | 347/54 |
| 7,628,468 | B2 * | 12/2009 | Silverbrook | 347/54 |
| 7,631,956 | B2 | 12/2009 | Silverbrook | |
| 7,635,178 | B2 * | 12/2009 | Silverbrook | 347/54 |
| 7,669,970 | B2 * | 3/2010 | Silverbrook | 347/54 |
| 7,703,890 | B2 * | 4/2010 | Silverbrook | 347/54 |
| 7,748,827 | B2 * | 7/2010 | Silverbrook | 347/44 |
| 7,758,166 | B2 * | 7/2010 | Silverbrook | 347/54 |
| 7,784,919 | B2 * | 8/2010 | Weaver | 347/65 |
| 7,798,603 | B2 * | 9/2010 | Silverbrook | 347/40 |
| 7,934,806 | B2 * | 5/2011 | Silverbrook | 347/54 |
| 2005/0018015 | A1 * | 1/2005 | Silverbrook | 347/54 |
| 2007/0126826 | A1 * | 6/2007 | Hibbard et al. | 347/86 |

FOREIGN PATENT DOCUMENTS

| | | | |
|---|---|---|---|
| DE | 4139731 | | 6/1993 |
| EP | 0189794 | A | 8/1986 |
| EP | 0371763 | A2 | 6/1990 |
| EP | 0417673 | A | 3/1991 |
| EP | 0479441 | A | 4/1992 |
| EP | 0671271 | A | 9/1995 |
| GB | 1569425 | A | 6/1980 |
| GB | 2262152 | | 6/1993 |
| JP | 55-059972 | A | 7/1980 |
| JP | 59-093356 | A | 5/1984 |
| JP | 60-131254 | A | 7/1985 |
| JP | 03-202351 | A | 12/1989 |
| JP | 02-034342 | A | 2/1990 |
| JP | 02-150353 | A | 6/1990 |
| JP | 02-219655 | A | 9/1990 |
| JP | 02-265751 | A | 10/1990 |
| JP | 02-273241 | A | 11/1990 |
| JP | 03-065349 | A | 3/1991 |
| JP | 04-001051 | A | 1/1992 |
| JP | 04-126255 | A | 4/1992 |
| JP | 04-129745 | A | 4/1992 |
| JP | 04-357039 | A | 12/1992 |
| JP | 04-368851 | A | 12/1992 |
| JP | 05-318724 | A | 12/1993 |
| JP | 06-106725 | A | 4/1994 |
| JP | 06-134985 | A | 5/1994 |
| JP | 06-336011 | A | 12/1994 |
| SE | 9601403 | | 10/1997 |
| WO | WO 86/05722 | | 10/1986 |
| WO | WO 97/12689 | A | 4/1997 |

* cited by examiner

METHOD OF FORMING PRINTHEAD BY REMOVING SACRIFICIAL MATERIAL THROUGH NOZZLE APERTURES

CROSS REFERENCE TO RELATED APPLICATIONS

The present application is a continuation-in-part of U.S. application Ser. No. 11/926,109 filed on Oct. 28, 2007, now issued U.S. Pat. No. 7,568,788 which is a continuation of U.S. application Ser. No. 11/778,572, now issued U.S. Pat. No. 7,566,113 filed on Jul. 16, 2007, which is a continuation of U.S. application Ser. No. 11/349,074 filed on Feb. 8, 2006, now issued U.S. Pat. No. 7,255,424, which is a continuation of U.S. application Ser. No. 10/982,789 filed on Nov. 8, 2004, now issued U.S. Pat. No. 7,086,720, which is a continuation of U.S. application Ser. No. 10/421,823 filed on Apr. 24, 2003, now issued U.S. Pat. No. 6,830,316, which is a continuation of U.S. application Ser. No. 09/113,122 filed on Jul. 10, 1998, now issued U.S. Pat. No. 6,557,977, all of which are herein incorporated by reference.

CROSS REFERENCES TO RELATED APPLICATIONS

The following US Patents and US Patent Applications are hereby incorporated by cross-reference.

| U.S. patent/patent application Incorporated by Reference: |
|---|
| 6,750,901 |
| 6,476,863 |
| 6,788,336 |
| 6,322,181 |
| 6,597,817 |
| 6,227,648 |
| 6,727,948 |
| 6,690,419 |
| 6,727,951 |
| 6,196,541 |
| 6,195,150 |
| 6,362,868 |
| 6,831,681 |
| 6,431,669 |
| 6,362,869 |
| 6,472,052 |
| 6,356,715 |
| 6,894,694 |
| 6,636,216 |
| 6,366,693 |
| 6,329,990 |
| 6,459,495 |
| 6,137,500 |
| 6,690,416 |
| 7,050,143 |
| 6,398,328 |
| 7,110,024 |
| 6,431,704 |
| 6,879,341 |
| 6,415,054 |
| 6,665,454 |
| 6,542,645 |
| 6,486,886 |
| 6,381,361 |
| 6,317,192 |
| 6,850,274 |
| 09/113,054 |
| 6,646,757 |
| 6,624,848 |
| 6,357,135 |
| 6,271,931 |
| 6,353,772 |

-continued

| U.S. patent/patent application Incorporated by Reference: |
|---|
| 6,106,147 |
| 6,665,008 |
| 6,304,291 |
| 6,305,770 |
| 6,289,262 |
| 6,315,200 |
| 6,217,165 |
| 6,786,420 |
| 6,350,023 |
| 6,318,849 |
| 6,227,652 |
| 6,213,588 |
| 6,213,589 |
| 6,231,163 |
| 6,247,795 |
| 6,394,581 |
| 6,244,691 |
| 6,257,704 |
| 6,416,168 |
| 6,220,694 |
| 6,257,705 |
| 6,247,794 |
| 6,234,610 |
| 6,247,793 |
| 6,264,306 |
| 6,241,342 |
| 6,247,792 |
| 6,264,307 |
| 6,254,220 |
| 6,234,611 |
| 6,302,528 |
| 6,283,582 |
| 6,239,821 |
| 6,338,547 |
| 6,247,796 |
| 6,557,977 |
| 6,390,603 |
| 6,362,843 |
| 6,293,653 |
| 6,312,107 |
| 6,227,653 |
| 6,234,609 |
| 6,238,040 |
| 6,188,415 |
| 6,227,654 |
| 6,209,989 |
| 6,247,791 |
| 6,336,710 |
| 6,217,153 |
| 6,416,167 |
| 6,243,113 |
| 6,283,581 |
| 6,247,790 |
| 6,260,953 |
| 6,267,469 |
| 6,224,780 |
| 6,235,212 |
| 6,280,643 |
| 6,284,147 |
| 6,214,244 |
| 6,071,750 |
| 6,267,905 |
| 6,251,298 |
| 6,258,285 |
| 6,225,138 |
| 6,241,904 |
| 6,299,786 |
| 6,866,789 |
| 6,231,773 |
| 6,190,931 |
| 6,248,249 |
| 6,290,862 |
| 6,241,906 |
| 6,565,762 |
| 6,241,905 |
| 6,451,216 |
| 6,231,772 |

-continued

| U.S. patent/patent application Incorporated by Reference: |
|---|
| 6,274,056 |
| 6,290,861 |
| 6,248,248 |
| 6,306,671 |
| 6,331,258 |
| 6,110,754 |
| 6,294,101 |
| 6,416,679 |
| 6,264,849 |
| 6,254,793 |
| 6,235,211 |
| 6,491,833 |
| 6,264,850 |
| 6,258,284 |
| 6,312,615 |
| 6,228,668 |
| 6,180,427 |
| 6,171,875 |
| 6,267,904 |
| 6,245,247 |
| 6,315,914 |
| 6,231,148 |
| 6,293,658 |
| 6,614,560 |
| 6,238,033 |
| 6,312,070 |
| 6,238,111 |
| 6,378,970 |
| 6,196,739 |
| 6,270,182 |
| 6,152,619 |
| 6,087,638 |
| 6,340,222 |
| 6,041,600 |
| 6,299,300 |
| 6,067,797 |
| 6,286,935 |
| 6,044,646 |
| 6,382,769 |

FIELD OF THE INVENTION

The present invention relates to the field of drop on demand ink jet printing.

BACKGROUND OF THE INVENTION

Many different types of printing have been invented, a large number of which are presently in use. The known forms of print have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on ink jet printing have been invented. For a survey of the field, reference is made to an article by J Moore, "Non-Impact Printing: Introduction and Historical Perspective", Output Hard Copy Devices, Editors R Dubeck and S Sherr, pages 207-220 (1988).

Inkjet printers themselves come in many different types. The utilization of a continuous stream ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous inkjet printing including the step wherein the ink jet stream is modulated by a high frequency electro-static field so as to cause drop separation. This technique is still utilized by several manufacturers including Elmjet and Scitex (see also U.S. Pat. No. 3,373,437 by Sweet et al)

Piezoelectric inkjet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal inkjet printing has become an extremely popular form of inkjet printing. The ink jet printing techniques include those disclosed by Endo et al in GB 2007162 (1979) and Vaught et al in U.S. Pat. No. 4,490,728. Both the aforementioned references disclosed inkjet printing techniques rely upon the activation of an electrothermal actuator which results in the creation of a bubble in a constricted space, such as a nozzle, which thereby causes the ejection of ink from an aperture connected to the confined space onto a relevant print media. Printing devices utilizing the electrothermal actuator are manufactured by manufacturers such as Canon and Hewlett Packard.

These printheads have nozzle arrays that share a common basic construction. The electrothermal actuators are fabricated on one supporting substrate and the nozzles through which the ink is ejected are formed in a separate substrate or plate. The nozzle plate and thermal actuators are then aligned and assembled. The nozzle plate and the thermal actuator substrate can be sealed together in a variety of different ways, for example, epoxy adhesive, anodic bonding or sealing glass.

Accurate registration between the thermal actuators and the nozzles can be problematic. These problems effectively restrict the size of the nozzle array in any one monolithic plate and corresponding actuator substrate. Any misalignment between the nozzles and the underlying actuators will compound as the dimensions of the array increase. Furthermore, differential thermal expansion between the nozzle plate and the actuator substrate create greater misalignments as the array sizes increase. In light of these registration issues, printhead nozzle arrays have a nozzle densities of the order of 10 to 20 nozzles per square mm and less than about 300 nozzles in any one monolithic plate and corresponding actuator substrate.

Given these limits on nozzle array size, pagewidth printheads using this two-part design are impractical. A stationary printhead extending the printing width of the media substrate would require many separate printhead arrays mounted in precise alignment with each other. The complexity of this arrangement makes such printers commercially unrealistic.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

SUMMARY OF THE INVENTION

According to a first aspect, the present invention provides a method of fabricating an inkjet printhead comprising the steps of:

forming a plurality of actuators on a monolithic substrate;

covering the actuators with a sacrificial material;

covering the sacrificial material with a printhead surface layer;

defining a plurality of nozzle apertures in the printhead surface layer such that each of the actuators corresponds to one of the nozzle apertures; and, removing at least some of the sacrificial material on each of the actuators through the nozzle aperture corresponding to each of the actuators.

By forming the nozzle apertures in a printhead surface layer that is a lithographically deposited structure on the monolithic substrate, the alignment with the actuators is within tolerances while fabrication remains cost effective. Greater precision allows the printhead to have a higher nozzle density and the array can be larger before CTE mismatch causes the nozzle to actuator alignment to exceed the required tolerances.

Preferably, the method further comprises the step of supporting the actuators on the monolithic substrate by CMOS drive circuitry positioned between the monolithic substrate and the actuators and the monolithic substrate. Preferably, the method further comprises the step of depositing a protective layer over the CMOS drive circuitry and etching the protective layer to expose areas of the CMOS drive circuitry configured to be electrical contacts for the actuators. Preferably, the protective layer is a nitride material. Silicon nitride is particularly suitable.

Preferably, the method further comprises the step of forming etchant holes in the printhead surface layer for exposing the sacrificial material beneath the printhead surface layer to etchant, the etchant holes being smaller than the nozzle apertures such that during printer operation, ink is not ejected through the etchant holes.

Preferably, the printhead surface layer is a nitride material deposited over a sacrificial layer. In a further preferred form, the printhead surface layer is silicon nitride. Preferably, the monolithic substrate has an ink ejection side providing a planar support surface for the CMOS drive circuitry and the plurality of actuators, the monolithic substrate also having an ink supply surface opposing the ink ejection side, the printhead surface layer has a roof layer extending in a plane parallel to the planar support surface, and side wall structures formed integrally with the roof layer and extending toward the planar support surface. Preferably, the printhead surface layer has a plurality of filter structures formed integrally with the roof layer and positioned to filter ink flow to each of the actuators respectively. Preferably, the method further comprises the step of etching ink supply channels from the ink supply surface of the monolithic substrate to the planar support surface of the ink ejection side. In a further preferred form, the step of removing at least some of the sacrificial material on each of the actuators through the nozzle apertures is performed after the ink supply channels are etched from the ink supply surface.

According to a second aspect, the present invention provides an inkjet printhead comprising:

an array of droplet ejectors supported on a printhead integrated circuit (IC), each of the droplet ejectors having a nozzle aperture and an actuator for ejecting a droplet of ink through the nozzle aperture; wherein, each of the actuators is configured to consume less than 100 mW during activation.

By configuring the electro-thermal actuators for low activation power, the voltage and current of the activation pulse is more compatible with standard CMOS used in the semiconductor fabrication industry. Lowering the voltage addresses problems such as 'ground bounce' (as it is referred to in the art) and smaller current densities generate less internal resistance in 0.5 micron to 0.2 micron metal layers in the CMOS.

In a further preferred form, each of the actuators is configured to consume less than 50 mW during activation. In some embodiments, each of the actuators is configured to consume between 10 mW and 30 mW during activation.

Preferably, the printhead IC has drive circuitry for providing the actuators with power, the drive circuitry having patterned layers of metal separated by interleaved layers of dielectric material, the layers of metal being interconnected by conductive vias, wherein the drive circuitry has more than two of the metal layers and each of the metal layers are less than 2 microns thick.

Incorporating the drive circuitry and the droplet ejectors onto the same supporting substrate reduces the number of electrical connections needed on the printhead IC and the resistive losses when transmitting power to the actuators. The circuitry on the printhead IC needs to have more than just power and ground metal layers in order to provide the necessary drive FETs, shift registers and so on. However, each metal layer can be thinner and fabricated using well known and efficient techniques employed in standard semiconductor fabrication. Overall, this yields production efficiencies in time and cost.

Preferably, the metal layers are each less than 1 micron thick. In a still further preferred form, the metal layers are 0.5 microns thick. Half micron CMOS is often used in semiconductor fabrication and is thick enough to ensure that the connections at the bond pads are reliable.

Preferably, the array has a nozzle aperture density of more than 100 nozzle apertures per square millimeter. Preferably, the array has a nozzle aperture density of more than 200 nozzle apertures per square millimeter. In a further preferred form, the array has a nozzle aperture density of more than 300 nozzle apertures per square millimeter.

Forming the nozzle apertures within a layer on one side of the underlying wafer instead of laser ablating nozzles in a separated plate that is subsequently mounted to the printhead integrated circuit significantly improves the accuracy of registration between an actuator and its corresponding nozzle. With more precise registration between the nozzle aperture and the actuator, a greater nozzle density is possible. Nozzle density has a direct bearing on the print resolution and or print speeds. A high density array of nozzles can print to all the addressable locations (the grid of locations on the media substrate at which the printer can print a dot) with less passes of the printhead or ideally, a single pass.

In some embodiments, the array has more than 2000 droplet ejectors. Preferably, the array has more than 10,000 droplet ejectors. In a further preferred form, the array has more than 15,000 droplet ejectors. Increasing the number of nozzles fabricated on a printhead IC allows larger arrays, faster print speeds and ultimately pagewidth printheads.

Preferably, the printhead surface layer is less than 10 microns thick. In a further preferred form, the printhead surface layer is less than 8 microns thick. In a still further preferred form, the printhead surface layer is less than 5 microns thick. In particular embodiments, the printhead surface layer is between 1.5 microns and 3.0 microns.

Forming the nozzle apertures in a thin surface layer reduces stresses caused by differential thermal expansion. Thin surface layers mean that the 'barrel' of the nozzle aperture is short and has less fluidic drag on the droplets as they are ejected. This reduces the ejection energy that the actuator needs to impart to the ink which in turn reduces the energy needed to be input into the actuator. With the actuators operating at lower power, they can be placed closer together on the printhead IC because there is less cross talk between nozzles and less excess heat generated. The close spacing increases the density of droplet ejectors within the array.

Preferably, each of the droplet ejectors in the array is configured to eject droplets with a volume less than 3 pico-liters each. In a further preferred form, each of the droplet ejectors in the array is configured to eject droplets with a volume less than 2 pico-liters each. In a particularly preferred form, the droplets ejected have a volume between 1 pico-liter and 2 pico-liters.

Configuring the ejector so that it ejects small volume drops reduces the energy needed to eject drops.

Preferably, the actuator in each of the droplet ejectors is configured to generate a pressure pulse in a quantity of ink adjacent the nozzle aperture, the pressure pulse being directed towards the nozzles aperture such that the droplet of ink is ejected through the nozzle aperture, the actuator being positioned in the droplet ejector such that it is less than 30 microns from an exterior surface of the printhead surface layer. Preferably, the actuator is positioned in the droplet ejector such that it is less than 20 microns from an exterior surface of the printhead surface layer. In a further preferred form, the actuator being positioned in the droplet ejector such that it is less than 15 microns from an exterior surface of the printhead surface layer.

In some preferred embodiments, the nozzle apertures each have an area less than 600 microns squared. In a further preferred form, the nozzle apertures each have an area less than 400 microns squared. In a particularly preferred form, the nozzle apertures each have an area between 150 microns squared and 200 microns squared.

Preferably, during printing 100% coverage at full print rate, each of the actuators has an average power consumption less than 1.5 mW. In a further preferred form, the average power consumption is between 0.5 mW and 1.0 mW. In a still further preferred form, the array has more than 15,000 of the droplet ejectors and operates at less than 10 Watts during printing 100% coverage at full print rate. Configuring the actuators for low power ejection causes less cross talk between nozzles and less, if any, excess heat generation. As a result, the density of the droplet ejectors on the printhead IC can increase. Droplet ejector density has a direct bearing on the print resolution and or print speeds. A high density array of nozzles can print to all the addressable locations (the grid of locations on the media substrate at which the printer can print a dot) with less passes of the printhead or ideally, a single pass, as is the case with a pagewidth printhead.

Preferably, each of the actuators is configured to consume less than 1 Watt during activation. In a further preferred form, each of the actuators is configured to consume less than 500 mW during activation. In some embodiments, each of the actuators is configured to consume between 100 mW and 500 mW during activation.

Preferably, each of the droplet ejectors has a chamber in which the actuator is positioned, the chamber having an inlet for fluid communication with an ink supply, and a filter structure in the inlet to inhibit ingress of contaminants and air bubbles into the chamber. In a particularly preferred form, the filter structure is a plurality of spaced columns. In some embodiments, the spaced columns each extend generally parallel to the droplet ejection direction. A filter structure at the inlet to each ink chamber is more likely to remove contaminants than a filter positioned further upstream in the in the ink supply flow. Contaminants, including air bubbles, can originate at all points along the ink supply line, so there is less chance of nozzle clogging or other detrimental effects if the ink flow is filtered at each of the chamber inlets.

Preferably, the array of droplet ejectors is arranged as a plurality of rows of the droplet ejectors, the inkjet printhead further comprising an ink supply channel extending parallel to the plurality of rows, and an inlet conduit extending from the supply channel to an opposing surface of the printhead IC. Preferably, the supply channel extends between at least two of the plurality of rows. Feeding ink to the rows of droplet ejectors via a parallel supply channel that has a supply conduit to the 'back' of the IC, reduces the number of deep anisotropic back etches. Less back etching preserves the structural integrity of the printhead IC which is more robust and less likely to be damaged by die handling equipment.

Preferably, the droplet ejectors are configured to eject ink droplets at a velocity less than 4.5 m/s. In a further preferred form, the velocity is less than 4.0 m/s. The Applicant's work has found drop ejection velocities greater than 4.5 m/s have significantly more satellite drops. Furthermore, tests show a velocity less than 4.0 m/s have negligible satellite drops.

Preferably, each of the droplet ejectors has a chamber in which the actuator is positioned, the chamber having a volume less than 30,000 microns cubed. In a further preferred form, the volume is less than 25,000 microns cubed. Low energy ejection of ink droplets generates little, if any, excess heat in the printhead. A build up of excess heat in the printhead imposes a limit on the nozzle firing frequency and thereby limits the print speed. The IJ30 printhead is self cooling (the heat generated by the thermal actuator is removed from the printhead with the ejected drop). In this case, the print speed is only limited by the rate at which the ink can be supplied to the printhead or the speed that the media substrate can be fed past the printhead. Reducing the volume of the ink chambers reduces the volume of ink in which the heat can dissipate. However, a reduced volume ink chamber has a fast refill time and relies solely on capillary action. As the actuator is configured for low energy input, the reduced volume of ink does not cause problems for heat dissipation.

Preferably, the printhead IC has a back face that is opposite said one face on which the printhead surface layer is formed, and at least one supply conduit extending from the back face to the array of droplet ejectors such that the at least one supply conduit is in fluid communication with a plurality of the droplet ejectors in the array. In a further preferred form, the printhead IC has a plurality of the supply conduits and drive circuitry for providing the actuators with power, the drive circuitry having patterned layers of metal separated by interleaved layers of dielectric material, the layers of metal being interconnected by conductive vias, wherein the drive circuitry extends between the plurality of supply conduits. Supplying the array of droplet ejectors with ink from the back face of the printhead IC instead of along the front face provides more room to the electrical contacts and drive circuitry. This in turn, provides the scope to increase the density of droplet ejectors per unit area on the printhead IC.

Preferably, the array of droplet ejectors is arranged as a plurality of rows of the droplet ejectors, the printhead IC further comprises an ink supply channel extending parallel to the plurality of rows, such that the ink supply channel connects to the plurality of supply conduits extending from the back face of the printhead IC. Preferably, the supply channel extends between at least two of the plurality of rows. In a particularly preferred form, the printhead IC has an elongate configuration with its longitudinal extent parallel to the rows of droplet ejectors, the printhead IC further comprising a series of electrical contacts along of its longitudinal sides for receiving power and print data for all the droplet ejectors in the array.

According to a third aspect, the present invention provides an inkjet printer comprising:

a printhead mounted adjacent a media feed path;

an array of droplet ejectors for ejecting ink droplets on to a media substrate, each of the droplet ejectors having an electro-thermal actuator; and, a media feed drive for moving the media substrate relative to the array of droplet ejectors at a speed greater than 0.1 m/s.

Increasing the speed of the media substrate relative to the printhead, whether the printhead is a scanning or pagewidth type, reduces the time needed to complete printjobs.

Preferably, the media feed drive is configured for moving the media substrate relative to the array of droplet ejectors at a speed greater than 0.15 m/s.

The nozzle chamber structure may be defined by the substrate as a result of an etching process carried out on the substrate, such that one of the layers of the substrate defines the ejection port on one side of the substrate and the actuator is positioned on an opposite side of the substrate.

According to a fourth aspect of the present invention there is provided a method of ejecting ink from a chamber comprising the steps of: a) providing a cantilevered beam actuator incorporating a shape memory alloy; and b) transforming said shape memory alloy from its martensitic phase to its austenitic phase or vice versa to cause the ink to eject from said chamber. Further, the actuator comprises a conductive shape memory alloy panel in a quiescent state and which transfers to an ink ejection state upon heating thereby causing said ink ejection from the chamber. Preferably, the heating occurs by means of passing a current through the shape memory alloy. The chamber is formed from a crystallographic etch of a silicon wafer so as to have one surface of the chamber substantially formed by the actuator. Advantageously, the actuator is formed from a conductive shape memory alloy arranged in a serpentine form and is attached to one wall of the chamber opposite a nozzle port from which ink is ejected. Further, the nozzle port is formed by the back etching of a silicon wafer to the epitaxial layer and etching a nozzle port hole in the epitaxial layer. The crystallographic etch includes providing side wall slots of non-etched layers of a processed silicon wafer so as to extend the dimensions of the chamber as a result of the crystallographic etch process. Preferably, the shape memory alloy comprises nickel titanium alloy.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

In the preferred embodiment, shape memory materials are utilised to construct an actuator suitable for injecting ink from the nozzle of an ink chamber.

Figure 1:
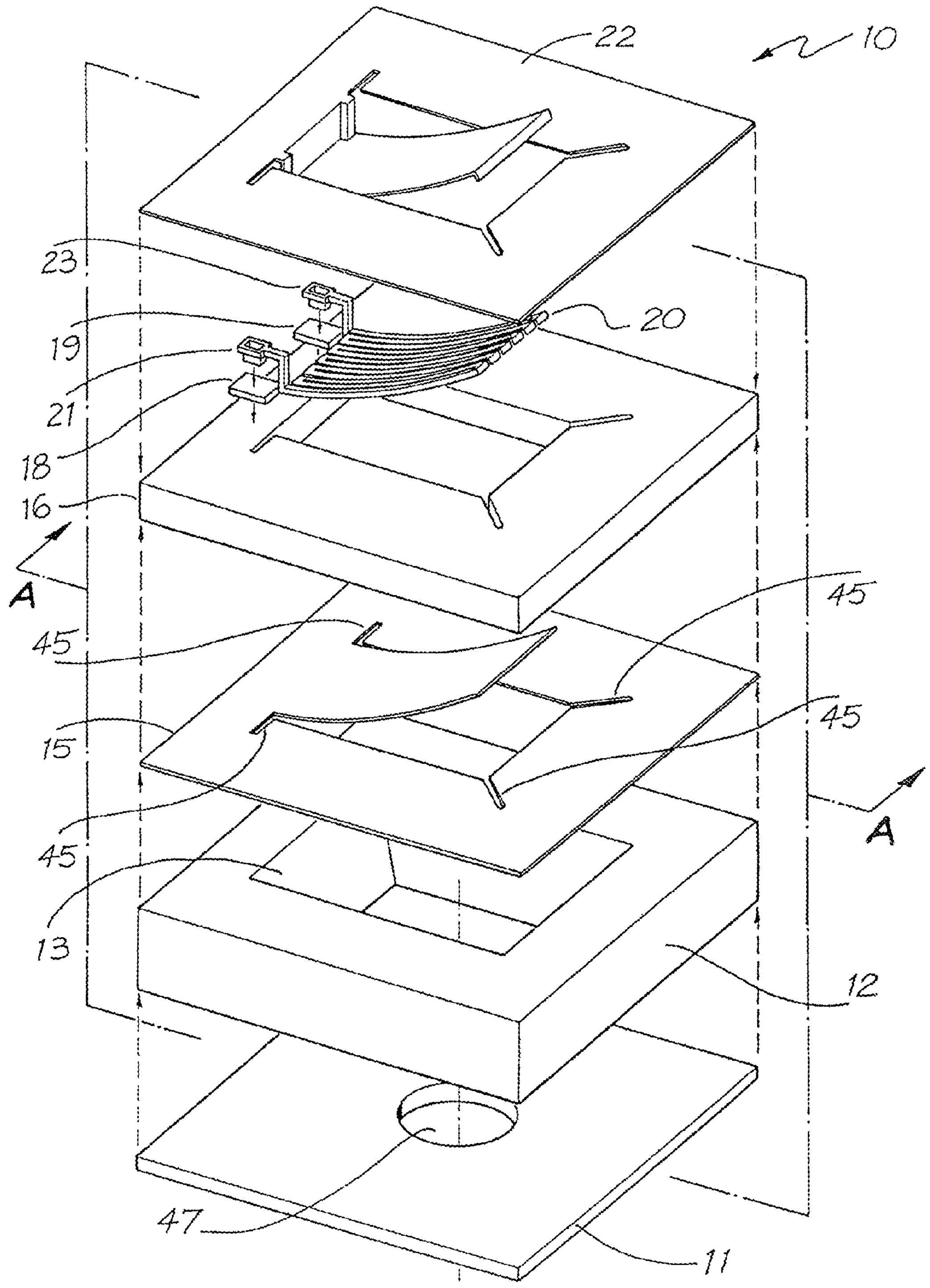
FIG. 1 is an exploded, perspective view of a single ink jet nozzle as constructed in accordance with the preferred embodiment of the invention.

Turning to FIG. 1, there is illustrated an exploded perspective view 10 of a single ink jet nozzle as constructed in accordance with the preferred embodiment. The ink jet nozzle 10 is constructed from a silicon wafer base utilizing back etching of the wafer to a boron doped epitaxial layer. Hence, the ink jet nozzle 10 comprises a lower layer 11 which is constructed from boron-doped silicon. The boron doped silicon layer is also utilized as a crystallographic etch stop layer. The next layer comprises the silicon layer 12 that includes a crystallographic pit that defines a nozzle chamber 13 having side walls etched at the conventional angle of 54.74 degrees. The layer 12 also includes the various required circuitry and transistors for example, a CMOS layer (not shown). After this, a 0.5-micron thick thermal silicon oxide layer 15 is grown on top of the silicon wafer 12.

After this, come various layers which can comprise two-level metal CMOS process layers which provide the metal interconnect for the CMOS transistors formed within the layer 12. The various metal pathways etc. are not shown in FIG. 1 but for two metal interconnects 18, 19 which provide interconnection between a shape memory alloy layer 20 and the CMOS metal layers 16. The shape memory metal layer is next and is shaped in the form of a serpentine coil to be heated by end interconnect/via portions 21,23. A top nitride layer 22 is provided for overall passivation and protection of lower layers in addition to providing a means of inducing tensile stress to curl the shape memory alloy layer 20 in its quiescent state.

The preferred embodiment relies upon the thermal transition of a shape memory alloy 20 (SMA) from its martensitic phase to its austenitic phase. The basis of a shape memory effect is a martensitic transformation from a thermoelastic martensite at a relatively low temperature to an austenite at a higher temperature. The thermal transition is achieved by passing an electrical current through the SMA. The layer 20 is suspended at the entrance to a nozzle chamber connected via leads 18, 19 to the layers 16.

Figure 2:
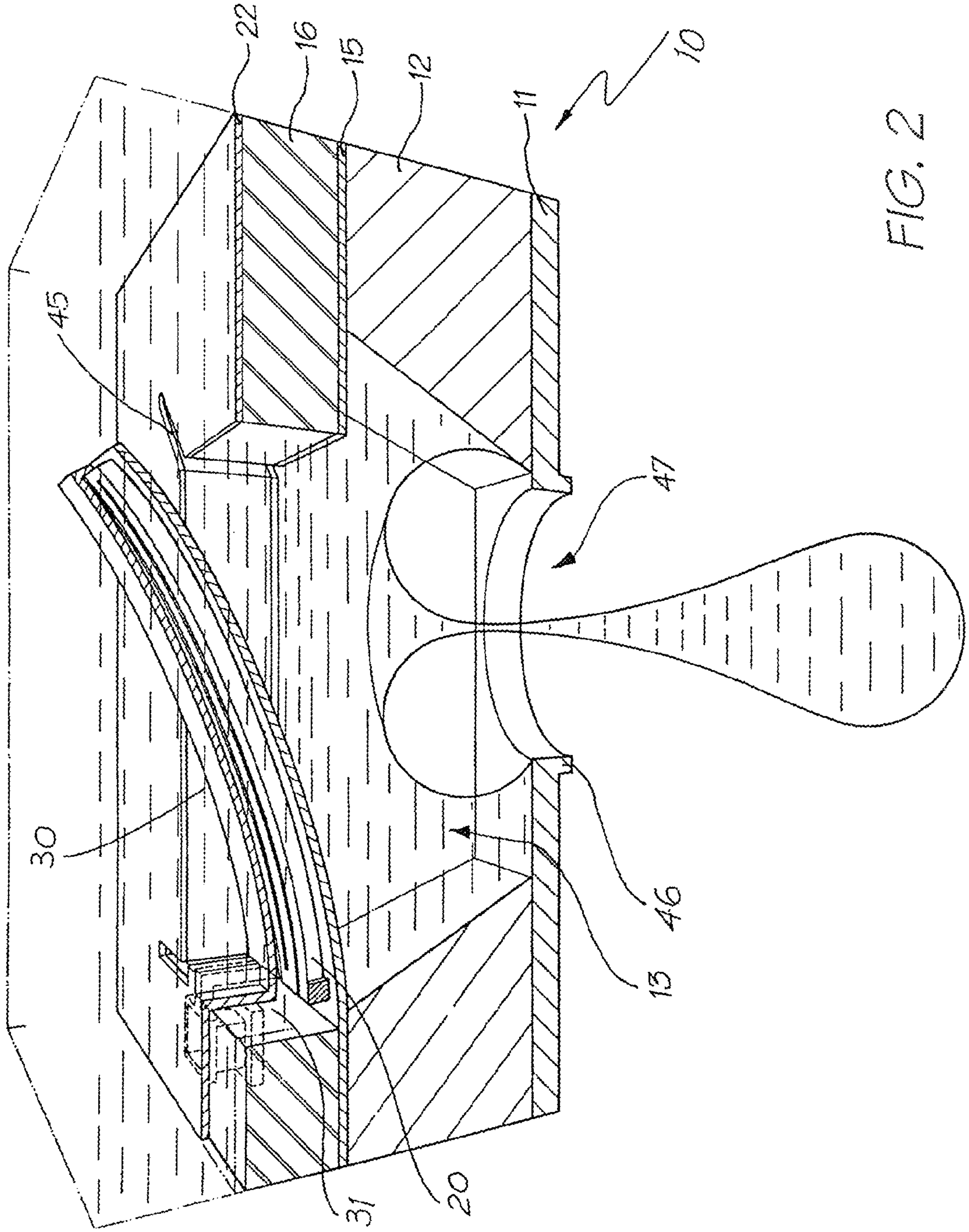
FIG. 2 is a cross-sectional view of a single ink jet nozzle in its quiescent state taken along line A-A in FIG. 1.
Figure 3:
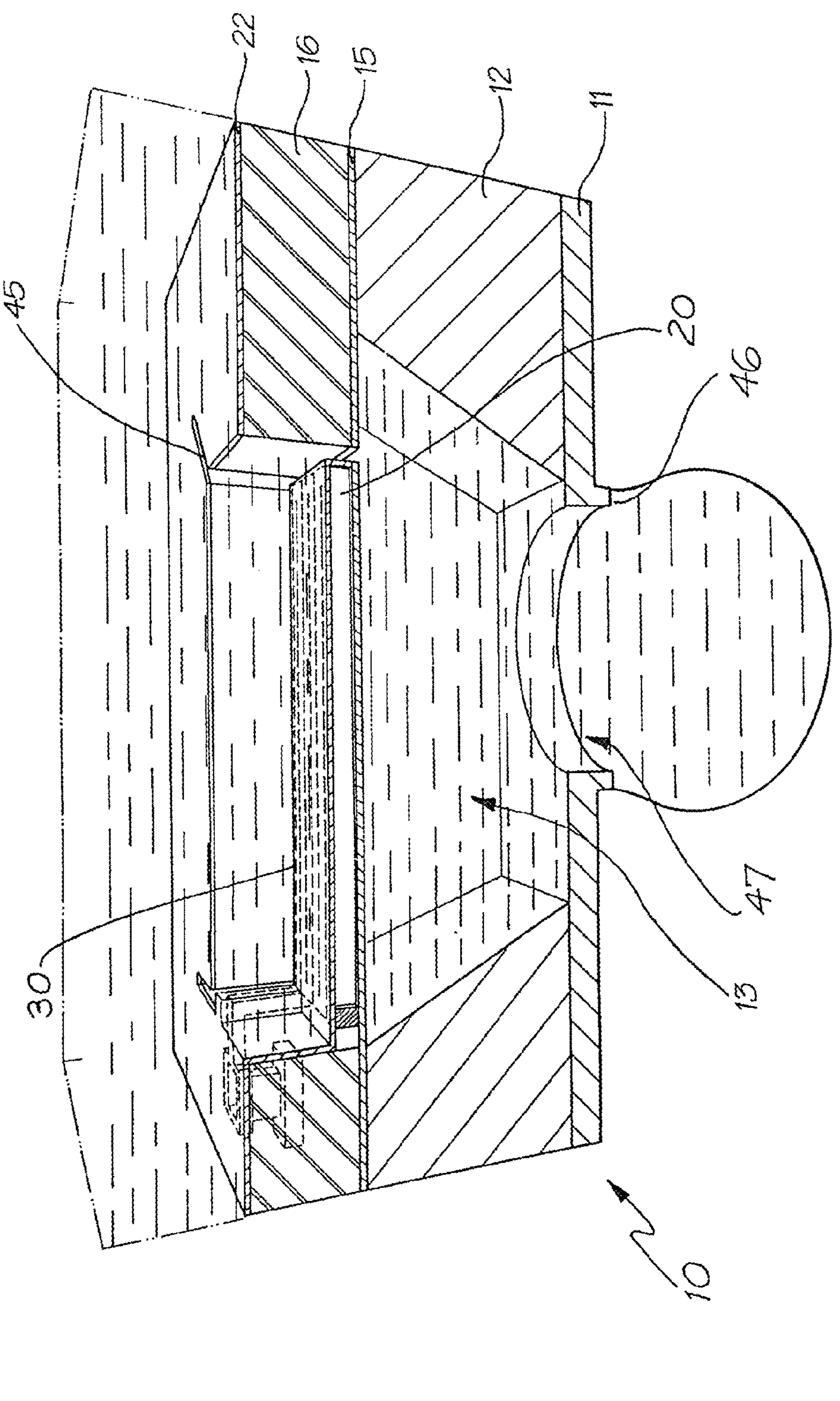
FIG. 3 is a top cross sectional view of a single ink jet nozzle in its actuated state taken along line A-A in FIG. 1.

In FIG. 2, there is shown a cross-section of a single nozzle 10 when in its quiescent state, the section being taken through the line A-A of FIG. 1. An actuator 30 that includes the layers 20, 22, is bent away from a nozzle port 47 when in its quiescent state. In FIG. 3, there is shown a corresponding cross-section for the nozzle 10 when in an actuated state. When energized, the actuator 30 straightens, with the corresponding result that the ink is pushed out of the nozzle. The process of energizing the actuator 30 requires supplying enough energy to raise the SMA layer 20 above its transition temperature so that the SMA layer 20 moves as it is transformed into its austenitic phase.

The SMA martensitic phase must be pre-stressed to achieve a different shape from the austenitic phase. For printheads with many thousands of nozzles, it is important to achieve this pre-stressing in a bulk manner. This is achieved by depositing the layer of silicon nitride 22 using Plasma Enhanced Chemical Vapour Deposition (PECVD) at around 300° C. over the SMA layer. The deposition occurs while the SMA is in the austenitic shape. After the printhead cools to room temperature the substrate under the SMA bend actuator is removed by chemical etching of a sacrificial substance. The silicon nitride layer 22 is thus placed under tensile stress and curls away from the nozzle port 47. The weak martensitic phase of the SMA provides little resistance to this curl. When the SMA is heated to its austenitic phase, it returns to the flat shape into which it was annealed during the nitride deposition. The transformation is rapid enough to result in the ejection of ink from the nozzle chamber.

There is one SMA bend actuator 30 for each nozzle. One end 31 of the SMA bend actuator 30 is mechanically connected to the substrate. The other end is free to move under the stresses inherent in the layers.

Returning to FIG. 1, the actuator layer is composed of three layers:

1. The $SiO_2$ lower layer 15. This layer acts as a stress 'reference' for the nitride tensile layer. It also protects the SMA from the crystallographic silicon etch that forms the nozzle chamber. This layer can be formed as part of the standard CMOS process for the active electronics of the printhead.

2. An SMA heater layer 20. An SMA such as a nickel titanium (NiTi) alloy is deposited and etched into a serpentine form to increase the electrical resistance so that the SMA is heated when an electrical current is passed through the SMA.

3. A silicon nitride top layer 22. This is a thin layer of high stiffness which is deposited using PECVD. The nitride stoichiometry is adjusted to achieve a layer with significant tensile stress at room temperature relative to the $SiO_2$ lower layer. Its purpose is to bend the actuator at the low temperature martensitic phase, away from the nozzle port 47.

As noted previously, the ink jet nozzle of FIG. 1 can be constructed by utilizing a silicon wafer having a buried boron epitaxial layer. The 0.5 micron thick dioxide layer 15 is then formed having side slots 45 which are utilized in a subsequent crystallographic etch. Next, the various CMOS layers 16 are formed including drive and control circuitry (not shown). The SMA layer 20 is then created on top of layers 15/16 and is connected with the drive circuitry. The silicon nitride layer 22 is then formed on the layer 20. Each of the layers 15, 16, 22 includes the various slots 45 which are utilized in a subsequent crystallographic etch. The silicon wafer is subsequently thinned by means of back etching with the etch stop being the boron-doped silicon layer 11. Subsequent etching of the layer 11 forms the nozzle port 47 and a nozzle rim 46. A nozzle chamber is formed by means of a crystallographic etch with the slots 45 defining the extent of the etch within the silicon oxide layer 12.

A large array of nozzles can be formed on the same wafer which in turn is attached to an ink chamber for filling the nozzle chambers.

One form of detailed manufacturing process which can be used to fabricate monolithic ink jet printheads operating in accordance with the principles taught by the present embodiment can proceed utilizing the following steps:

1. Using a double-sided polished wafer 50, deposit 3 microns of epitaxial silicon 11 heavily doped with boron.

2. Deposit 10 microns of epitaxial silicon 12, either p-type or n-type, depending on the CMOS process used.

Figure 4:
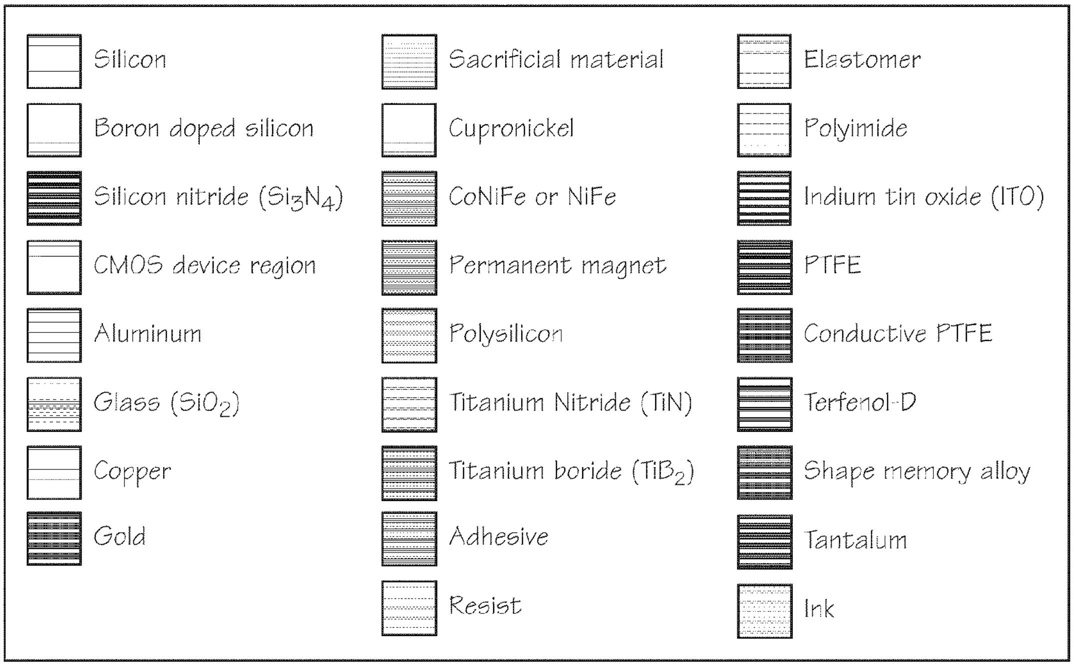
FIG. 4 provides a legend of the materials indicated in FIG. 5 to 15.
Figure 5:
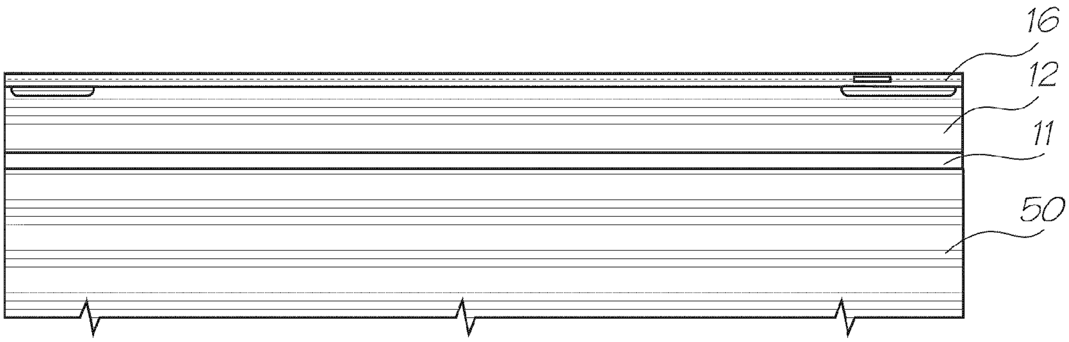
FIG. 5 to FIG. 15 illustrate sectional views of the manufacturing steps in one form of construction of an ink jet printhead nozzle.

3. Complete drive transistors, data distribution, and timing circuits using a 0.5-micron, one poly, 2 metal CMOS process to define the CMOS metal layers 16. This step is shown in FIG. 5. For clarity, these diagrams may not be to scale, and may not represent a cross section though any single plane of the nozzle. FIG. 4 is a key to representations of various materials in these manufacturing diagrams, and those of other cross-referenced ink jet configurations.

Figure 6:
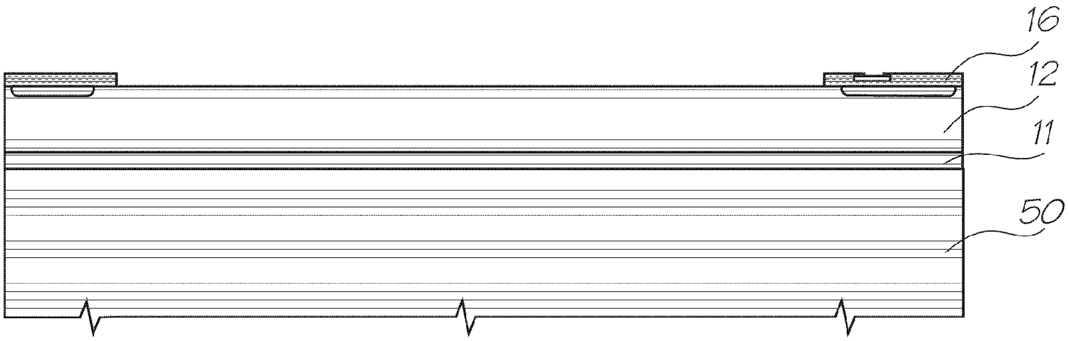

4. Etch the CMOS oxide layers down to silicon or aluminum using Mask 1. This mask defines the nozzle chamber, and the edges of the printheads chips. This step is shown in FIG. 6.

Figure 7:
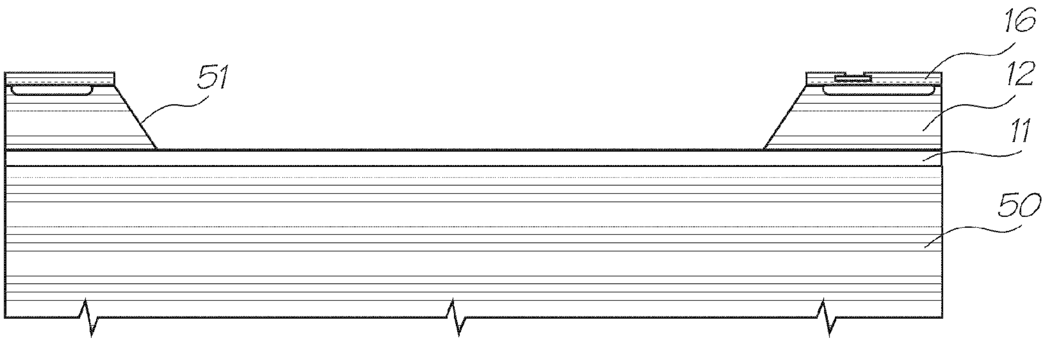

5. Crystallographically etch the exposed silicon using, for example, KOH or EDP (ethylenediamine pyrocatechol). This etch stops on <111> crystallographic planes 51, and on the boron doped silicon buried layer. This step is shown in FIG. 7.

Figure 8:
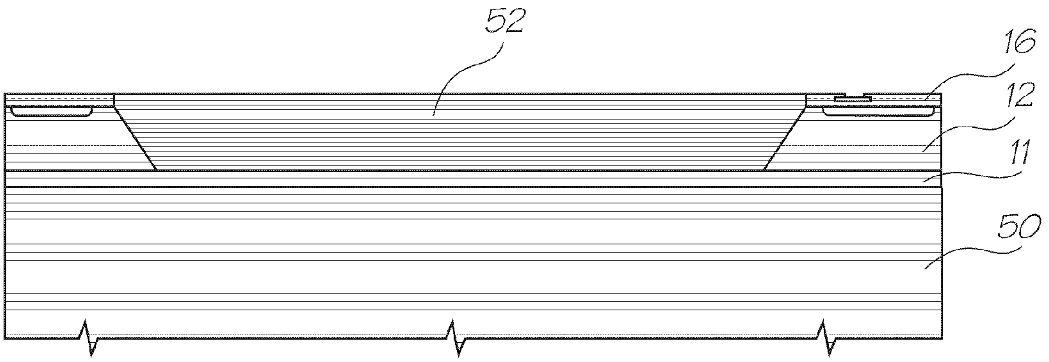

6. Deposit 12 microns of sacrificial material 52. Planarize down to oxide using CMP. The sacrificial material 52 temporarily fills the nozzle cavity. This step is shown in FIG. 8.

7. Deposit 0.1 microns of high stress silicon nitride (Si3N4) 53.

8. Etch the nitride layer 53 using Mask 2. This mask defines the contact vias from the shape memory heater to the second-level metal contacts.

9. Deposit a seed layer.

Figure 9:
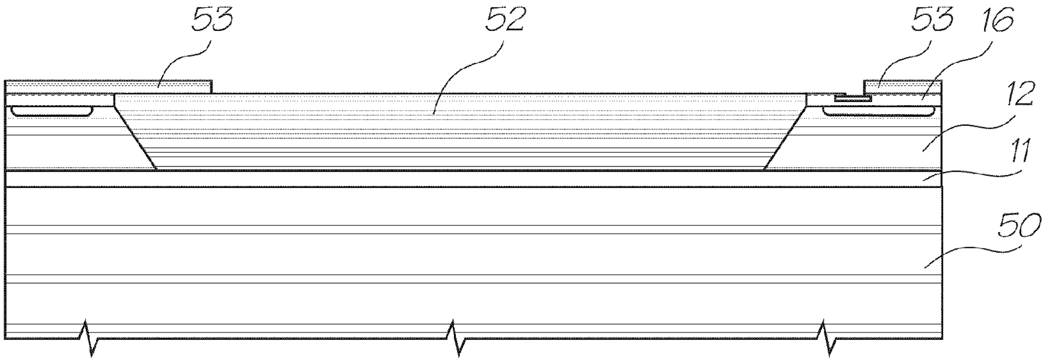

10. Spin on 2 microns of resist, expose with Mask 3, and develop. This mask defines the shape memory wire embedded in the paddle. The resist acts as an electroplating mold. This step is shown in FIG. 9.

11. Electroplate 1 micron of Nitinol 55 on the sacrificial material 52 to fill the electroplating mold. Nitinol is a 'shape memory' alloy of nickel and titanium, developed at the Naval Ordnance Laboratory in the US (hence Ni—Ti-NOL). A shape memory alloy can be thermally switched between its weak martensitic state and its high stiffness austenitic state.

Figure 10:
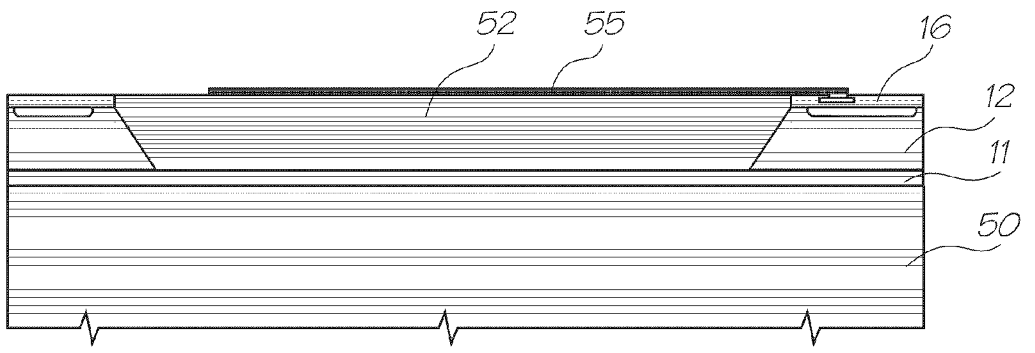

12. Strip the resist and etch the exposed seed layer. This step is shown in FIG. 10.

13. Wafer probe. All electrical connections are complete at this point, bond pads are accessible, and the chips are not yet separated.

14. Deposit 0.1 microns of high stress silicon nitride. High stress nitride is used so that once the sacrificial material is etched, and the paddle is released, the stress in the nitride layer will bend the relatively weak martensitic phase of the shape memory alloy. As the shape memory alloy, in its austenitic phase, is flat when it is annealed by the relatively high temperature deposition of this silicon nitride layer, it will return to this flat state when electrothermally heated.

Figure 11:
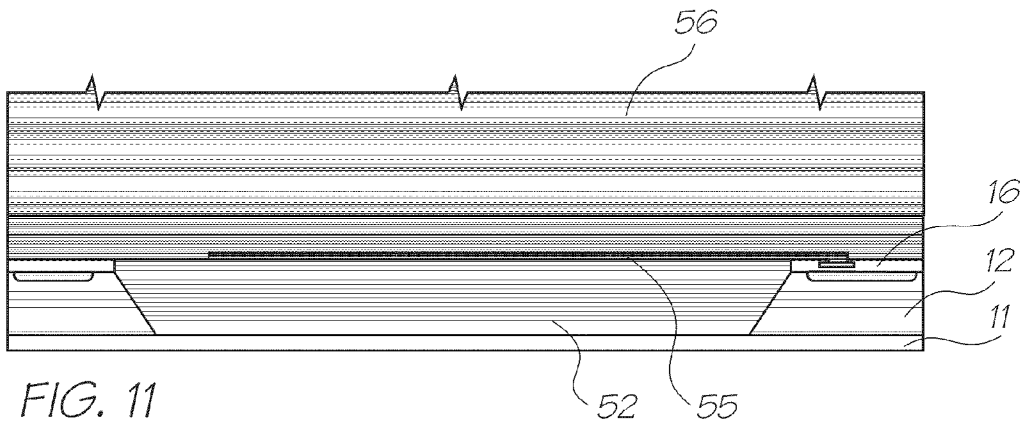

15. Mount the wafer 50 on a glass blank 56 and back-etch the wafer using KOH with no mask. This etch thins the wafer and stops at the buried boron doped silicon layer. This step is shown in FIG. 11.

Figure 12:
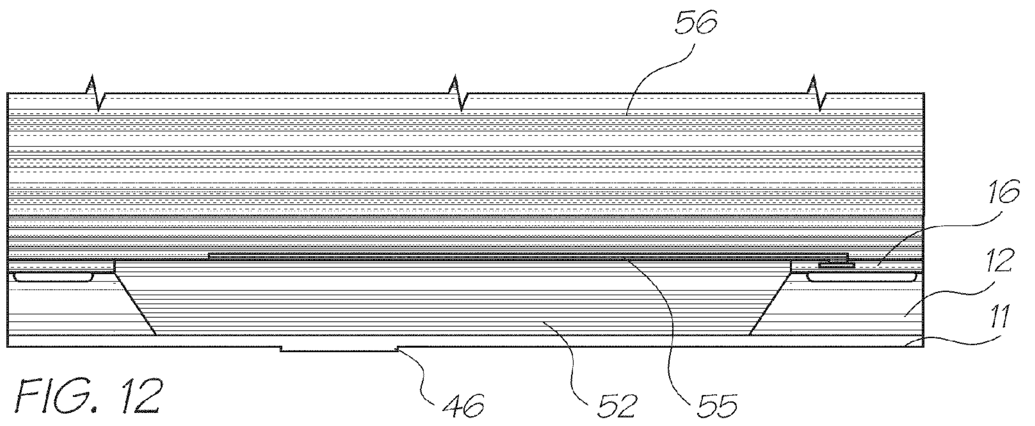

16. Plasma back-etch the boron doped silicon layer to a depth of 1 micron using Mask 4. This mask defines the nozzle rim 46. This step is shown in FIG. 12.

Figure 13:
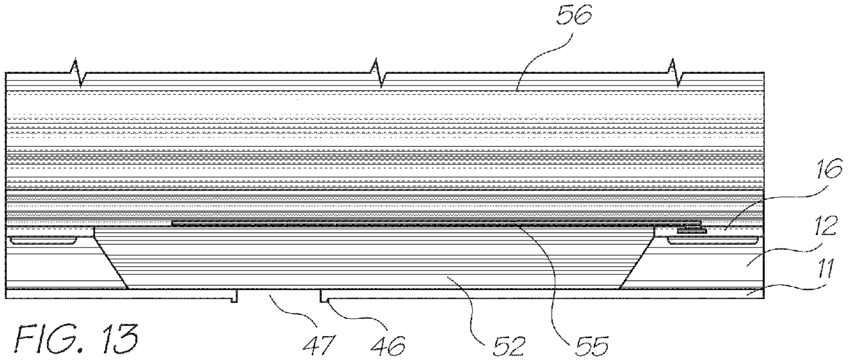

17. Plasma back-etch through the boron doped layer using Mask 5. This mask defines the nozzle port 47, and the edge of the chips. At this stage, the chips are still mounted on the glass blank 56. This step is shown in FIG. 13.

Figure 14:
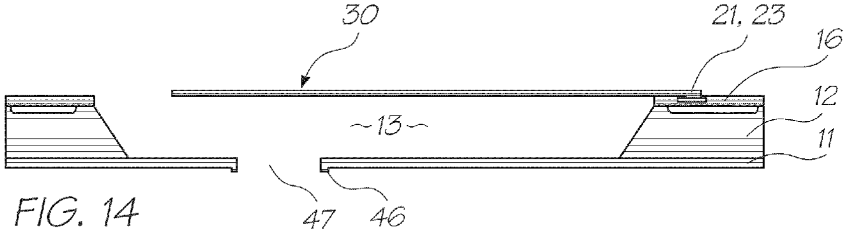

18. Strip the adhesive layer to detach the chips from the glass blank. Etch the sacrificial layer 52 away. This process completely separates the chips. This step is shown in FIG. 14.

19. Mount the printheads in their packaging, which may be a molded plastic former incorporating ink channels which supply different colors of ink to the appropriate regions of the front surface of the wafer.

20. Connect the printheads to their interconnect systems.

21. Hydrophobize the front surface of the printheads.

Figure 15:
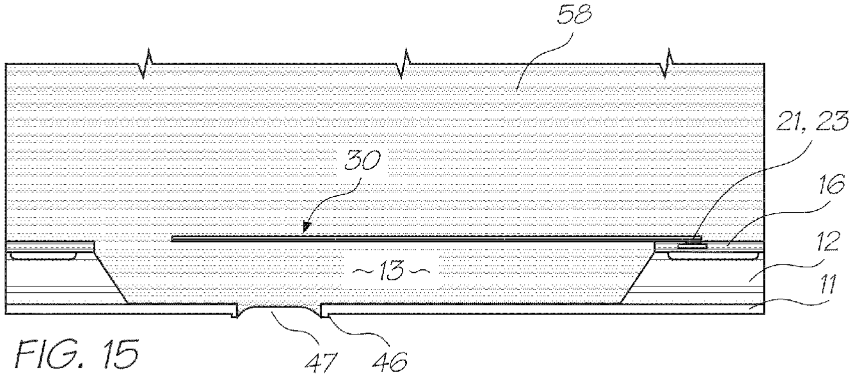

22. Fill with ink and test the completed printheads. A filled nozzle is shown in FIG. 15.

An embodiment of U.S. patent application Ser. No. 09/113,097 by the applicant is now described. This embodiment relies upon a magnetic actuator to “load” a spring, such that, upon deactivation of the magnetic actuator the resultant movement of the spring causes ejection of a drop of ink as the spring returns to its original position.

Figure 16:
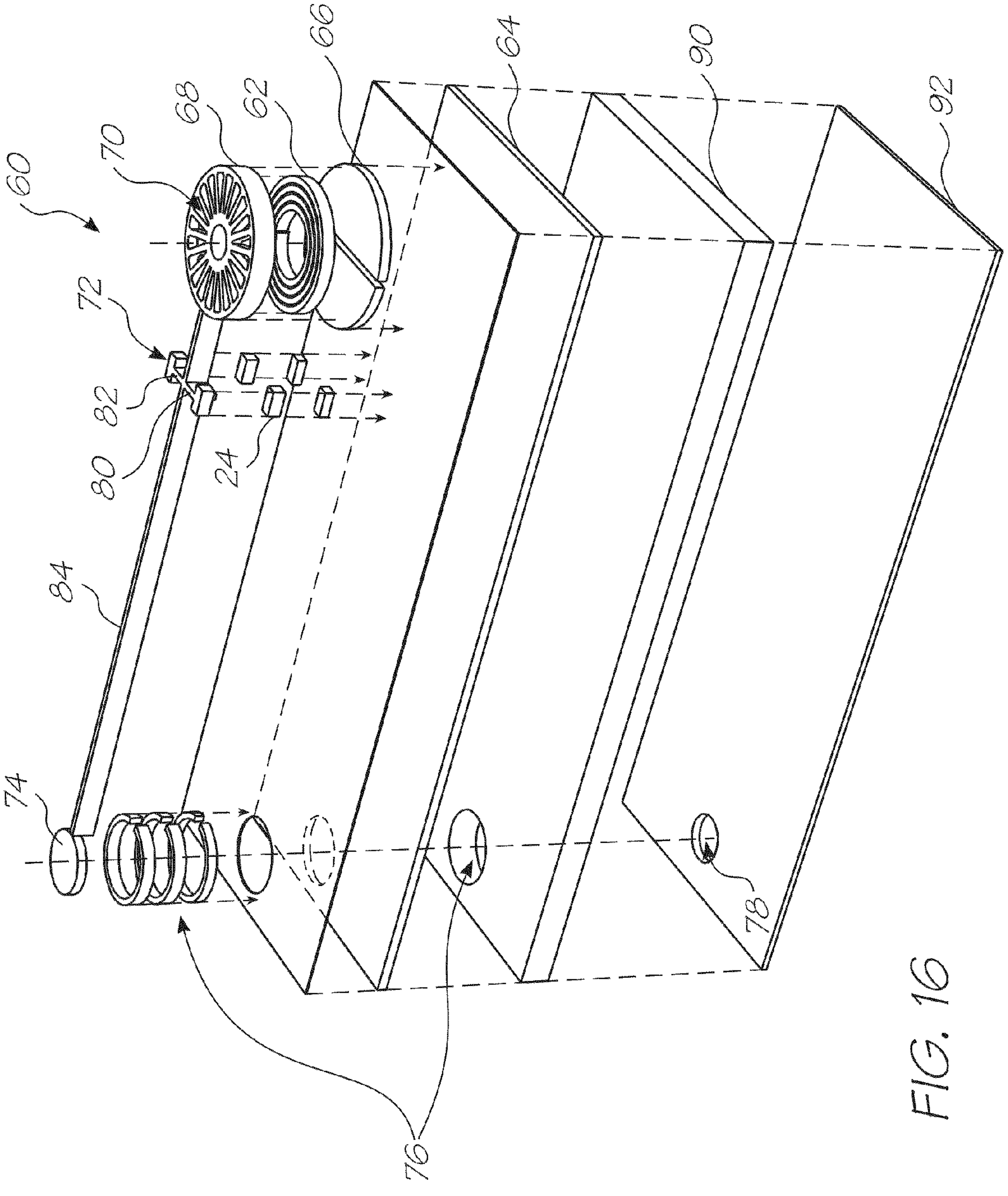
FIG. 16 is an exploded perspective view illustrating the construction of a single ink jet nozzle of U.S. patent application Ser. No. 09/113,097 by the Applicant, referred to in the table of cross-referenced material as set out above.

In FIG. 16, there is illustrated an exploded perspective view of an ink nozzle arrangement 60 constructed in accordance with the preferred embodiment. It would be understood that the preferred embodiment can be constructed as an array of nozzle arrangements 60 so as to together form an array for printing.

The operation of the ink nozzle arrangement 60 of FIG. 16 proceeds by a solenoid 62 being energized by way of a driving circuit 64 when it is desired to print out an ink drop. The energized solenoid 62 induces a magnetic field in a fixed soft magnetic pole 66 and a moveable soft magnetic pole 68. The solenoid power is turned on to a maximum current for long enough to move the moveable pole 68 from its rest position to a stopped position close to the fixed magnetic pole 66. The ink nozzle arrangement 60 of FIG. 1 sits within an ink chamber filled with ink. Therefore, holes 70 are provided in the moveable soft magnetic pole 68 for “squirting” out of ink from around the solenoid 62 when the pole 66 undergoes movement.

A fulcrum 72 with a piston head 74 balances the moveable soft magnetic pole 66. Movement of the magnetic pole 66 closer to the fixed pole 66 causes the piston head 74 to move away from a nozzle chamber 76 drawing air into the chamber 76 via an ink ejection port 78. The piston head 74 is then held open above the nozzle chamber 76 by means of maintaining a low “keeper” current through the solenoid 62. The keeper level current through solenoid 62 is sufficient to maintain the moveable pole 68 against the fixed soft magnetic pole 66. The level of current will be substantially less than the maximum current level because a gap 114 (FIG. 35) between the two poles 66 and 68 is at a minimum. For example, a keeper level current of 10% of the maximum current level may be suitable. During this phase of operation, the meniscus of ink at the nozzle tip or ink ejection port 78 is a concave hemisphere due to the inflow of air. The surface tension on the meniscus exerts a net force on the ink which results in ink flow from an ink chamber into the nozzle chamber 76. This results in the nozzle chamber 76 refilling, replacing the volume taken up by the piston head 74 which has been withdrawn. This process takes approximately 100 μs.

The current within solenoid 62 is then reversed to half that of the maximum current. The reversal demagnetises the magnetic poles 66, 68 and initiates a return of the piston 74 to its rest position. The piston 74 is moved to its normal rest position by both magnetic repulsion and by energy stored in a stressed torsional spring 80, 82 which was put in a state of torsion upon the movement of moveable pole 68.

The forces applied to the piston 74 as a result of the reverse current and spring 80, 82 is greatest at the beginning of the movement of the piston 74 and decreases as the spring elastic stress falls to zero. As a result, the acceleration of piston 74 is high at the beginning of a reverse stroke and the resultant ink velocity within the nozzle chamber 76 becomes uniform during the stroke. This results in an increased operating tolerance before ink flow over the printhead surface occurs.

At a predetermined time during the return stroke, the solenoid reverse current is turned off. The current is turned off when the residual magnetism of the movable pole is at a minimum. The piston 74 continues to move towards its original rest position.

The piston 74 overshoots the quiescent or rest position due to its inertia. Overshoot in the piston movement achieves two things: greater ejected drop volume and velocity, and improved drop break off as the piston 74 returns from overshoot to its quiescent position.

The piston 74 eventually returns from overshoot to the quiescent position. This return is caused by the springs 80, 82 which are now stressed in the opposite direction. The piston return “sucks” some of the ink back into the nozzle chamber 76, causing the ink ligament connecting the ink drop to the ink in the nozzle chamber 76 to thin. The forward velocity of the drop and the backward velocity of the ink in the nozzle chamber 76 are resolved by the ink drop breaking off from the ink in the nozzle chamber 76.

The piston 74 stays in the quiescent position until the next drop ejection cycle.

A liquid ink printhead has one ink nozzle arrangement 60 associated with each of the multitude of nozzles. The arrangement 60 has the following major parts:

(1) Drive circuitry 64 for driving the solenoid 62.

(2) The ejection port 78. The radius of the ejection port 78 is an important determinant of drop velocity and drop size.

(3) The piston 74. This is a cylinder which moves through the nozzle chamber 76 to expel the ink. The piston 74 is connected to one end of a lever arm 84. The piston radius is approximately 1.5 to 2 times the radius of the ejection port 78. The volume of ink displaced by the piston 74 during the piston return stroke mostly determines the ink drop volume output.

(4) The nozzle chamber 76. The nozzle chamber 76 is slightly wider than the piston 74. The gap 114 (FIGS. 34 & 35) between the piston 74 and the nozzle chamber walls is as small as is required to ensure that the piston does not make contact with the nozzle chamber 76 during actuation or return. If the printheads are fabricated using 0.5 μm semiconductor lithography, then a 1 μm gap 114 will usually be sufficient. The nozzle chamber 76 is also deep enough so that air ingested through the ejection port 78 when the piston 74 returns to its quiescent state does not extend to the piston 74. If it does, the ingested bubble may form a cylindrical surface instead of a hemispherical surface. If this happens, the nozzle will not refill properly.

(5) The solenoid 62. This is a spiral coil of copper. Copper is used for its low resistivity and high electro-migration resistance.

(6) The fixed magnetic pole 66 of ferromagnetic material.

(7) The moveable magnetic pole 68 of ferromagnetic material. To maximise the magnetic force generated, the moveable magnetic pole 68 and fixed magnetic pole 66 surround the solenoid 62 to define a torus. Thus, little magnetic flux is lost, and the flux is concentrated across the gap between the moveable magnetic pole 68 and the fixed pole 66. The moveable magnetic pole 68 has the holes 70 above the solenoid 62 to allow trapped ink to escape. These holes 70 are arranged and shaped so as to minimise their effect on the magnetic force generated between the moveable magnetic pole 68 and the fixed magnetic pole 66.

(8) The magnetic gap 114. The gap 114 between the fixed pole 66 and the moveable pole 68 is one of the most important "parts" of the print actuator. The size of the gap 114 strongly affects the magnetic force generated, and also limits the travel of the moveable magnetic pole 68. A small gap is desirable to achieve a strong magnetic force. The travel of the piston 74 is related to the travel of the moveable magnetic pole 68 (and therefore the gap 114) by the lever arm 84.

(9) Length of the lever arm 84. The lever arm 84 allows the travel of the piston 74 and the moveable magnetic pole 68 to be independently optimised. At the short end of the lever arm 84 is the moveable magnetic pole 68. At the long end of the lever arm 84 is the piston 74. The spring 80, 82 is at the fulcrum 72. The optimum travel for the moveable magnetic pole 68 is less than 1 mm, so as to minimise the magnetic gap. The optimum travel for the piston 74 is approximately 5 μm for a 1200 dpi printer. A lever 84 resolves the difference in optimum travel with a 5:1 or greater ratio in arm length.

(10) The springs 80, 82 (FIG. 1). The springs 80, 82 return the piston 74 to its quiescent position after a deactivation of the solenoid 62. The springs 80, 82 are at the fulcrum 72 of the lever arm 84.

(11) Passivation layers (not shown). All surfaces are preferably coated with passivation layers, which may be silicon nitride ($Si_3N_4$), diamond like carbon (DLC), or other chemically inert, highly impermeable layer. The passivation layers are especially important for device lifetime, as the active device is immersed in the ink.

As will be evident from the foregoing description, there is an advantage in ejecting the drop on deactivation of the solenoid 62. This advantage comes from the rate of acceleration of the moving magnetic pole 68.

The force produced by the moveable magnetic pole 68 by an electromagnetically induced field is approximately proportional to the inverse square of the gap between the moveable and static magnetic poles 68, 66. When the solenoid 62 is off, this gap is at a maximum. When the solenoid 62 is turned on, the moveable pole 68 is attracted to the static pole 66. As the gap decreases, the force increases, accelerating the movable pole 68 faster. The velocity increases in a highly non-linear fashion, approximately with the square of time. During the reverse movement of the moveable pole 68 upon deactivation, the acceleration of the moveable pole 68 is greatest at the beginning and then slows as the spring elastic stress falls to zero. As a result, the velocity of the moveable pole 68 is more uniform during the reverse stroke movement.

(1) The velocity of the piston or plunger 74 is constant over the duration of the drop ejection stroke.

(2) The piston or plunger 74 can be entirely removed from the ink chamber 76 during the ink fill stage, and thereby the nozzle filling time can be reduced, allowing faster printhead operation.

However, this approach does have some disadvantages over a direct firing type of actuator:

(1) The stresses on the spring 80, 82 are relatively large. Careful design is required to ensure that the springs operate at below the yield strength of the materials used.

(2) The solenoid 62 must be provided with a "keeper" current for the nozzle fill duration. The keeper current will typically be less than 10% of the solenoid actuation current. However, the nozzle fill duration is typically around 50 times the drop firing duration, so the keeper energy will typically exceed the solenoid actuation energy.

(3) The operation of the actuator is more complex due to the requirement for a "keeper" phase.

The printhead is fabricated from two silicon wafers. A first wafer is used to fabricate the print nozzles (the printhead wafer) and a second wafer (the Ink Channel Wafer) is utilised to fabricate the various ink channels in addition to providing a support means for the first channel. The fabrication process then proceeds as follows:

(1) Start with a single crystal silicon wafer 90, which has a buried epitaxial layer 92 of silicon which is heavily doped with boron. The boron should be doped to preferably $10^{20}$ atoms per $cm^3$ of boron or more, and be approximately 3 μm thick, and be doped in a manner suitable for the active semiconductor device technology chosen. The wafer diameter of the printhead wafer should be the same as the ink channel wafer.

(2) Fabricate the drive transistors and data distribution circuitry 64 according to the process chosen (eg. CMOS).

(3) Planarize the wafer 90 using chemical mechanical planarization (CMP).

(4) Deposit 5 mm of glass ($SiO_2$) over the second level metal.

(5) Using a dual damascene process, etch two levels into the top oxide layer. Level 1 is 4 μm deep, and level 2 is 5 μm deep. Level 2 contacts the second level metal. The masks for the static magnetic pole are used.

(6) Deposit 5 μm of nickel iron alloy (NiFe).

(7) Planarize the wafer using CMP, until the level of the $SiO_2$ is reached forming the magnetic pole 66.

(8) Deposit 0.1 μm of silicon nitride ($Si_3N_4$).

(9) Etch the $Si_3N_4$ for via holes for the connections to the solenoids, and for the nozzle chamber region 76.

(10) Deposit 4 μm of $SiO_2$.

(11) Plasma etch the $SiO_2$ in using the solenoid and support post mask.

(12) Deposit a thin diffusion barrier, such as Ti, TiN, or TiW, and an adhesion layer if the diffusion layer chosen has insufficient adhesion.

(13) Deposit 4 μm of copper for forming the solenoid 62 and spring posts 94. The deposition may be by sputtering, CVD, or electroless plating. As well as lower resistivity than aluminium, copper has significantly higher resistance to electro-migration. The electro-migration resistance is significant, as current densities in the order of $3\times10^6$ Amps/$cm^2$ may be required. Copper films deposited by low energy kinetic ion bias sputtering have been found to have 1,000 to 100,000 times larger electro-migration lifetimes larger than aluminium silicon alloy. The deposited copper should be alloyed and layered for maximum electro-migration lifetimes than aluminium silicon alloy. The deposited copper should be alloyed and layered for maximum electro-migration resistance, while maintaining high electrical conductivity.

(14) Planarize the wafer using CMP, until the level of the $SiO_2$ is reached. A damascene process is used for the copper layer due to the difficulty involved in etching copper. However, since the damascene dielectric layer is subsequently removed, processing is actually simpler if a standard deposit/etch cycle is used instead of damascene. However, it should be noted that the aspect ratio of the copper etch would be 8:1 for this design, compared to only 4:1 for a damascene oxide etch. This difference occurs because the copper is 1 μm wide and 4 μm thick, but has only 0.5 μm spacing. Damascene processing also reduces the lithographic difficultly, as the resist is on oxide, not metal.

(15) Plasma etch the nozzle chamber 76, stopping at the boron doped epitaxial silicon layer 92. This etch will be through around 13 μm of $SiO_2$, and 8 μm of silicon. The etch should be highly anisotropic, with near vertical sidewalls. The etch stop detection can be on boron in the exhaust gasses. If this etch is selective against NiFe, the masks for this step and the following step can be combined, and the following step can be eliminated. This step also etches the edge of the printhead wafer down to the boron layer, for later separation.

(16) Etch the $SiO_2$ layer. This need only be removed in the regions above the NiFe fixed magnetic poles, so it can be removed in the previous step if an Si and $SiO_2$ etch selective against NiFe is used.

(17) Conformably deposit 0.5 μm of high density $Si_3N_4$. This forms a corrosion barrier, so should be free of pinholes, and be impermeable to OH ions.

(18) Deposit a thick sacrificial layer. This layer should entirely fill the nozzle chambers, and coat the entire wafer to an added thickness of 8 μm. The sacrificial layer may be $SiO_2$.

(19) Etch two depths in the sacrificial layer for a dual damascene process. The deep etch is 8 μm, and the shallow etch is 3 μm. The masks define the piston 74, the lever arm 84, the springs 80, 82 and the moveable magnetic pole 68.

(20) Conformably deposit 0.1 μm of high density $Si_3N_4$. This forms a corrosion barrier, so should be free of pinholes, and be impermeable to OH ions.

(21) Deposit 8 μm of nickel iron alloy (NiFe).

(22) Planarize the wafer using CMP, until the level of the $SiO_2$ is reached.

(23) Deposit 0.1 μm of silicon nitride ($Si_3N_4$).

(24) Etch the $Si_3N_4$ everywhere except the top of the plungers.

(25) Open the bond pads.

(26) Permanently bond the wafer onto a pre-fabricated ink channel wafer. The active side of the printhead wafer faces the ink channel wafer. The ink channel wafer is attached to a backing plate, as it has already been etched into separate ink channel chips.

(27) Etch the printhead wafer to entirely remove the backside silicon to the level of the boron doped epitaxial layer 92. This etch can be a batch wet etch in ethylenediamine pyrocatechol (EDP).

(28) Mask a nozzle rim 96 from the underside of the printhead wafer. This mask also includes the chip edges.

(31) Etch through the boron doped silicon layer 92, thereby creating the nozzle holes 70. This etch should also etch fairly deeply into the sacrificial material in the nozzle chambers 76 to reduce time required to remove the sacrificial layer.

(32) Completely etch the sacrificial material. If this material is $SiO_2$ then a HF etch can be used. The nitride coating on the various layers protects the other glass dielectric layers and other materials in the device from HF etching. Access of the HF to the sacrificial layer material is through the nozzle, and simultaneously through the ink channel chip. The effective depth of the etch is 21 μm.

(33) Separate the chips from the backing plate. Each chip is now a full printhead including ink channels. The two wafers have already been etched through, so the printheads do not need to be diced.

(34) Test the printheads and TAB bond the good printheads.

(35) Hydrophobize the front surface of the printheads.

(36) Perform final testing on the TAB bonded printheads.

Figure 17:
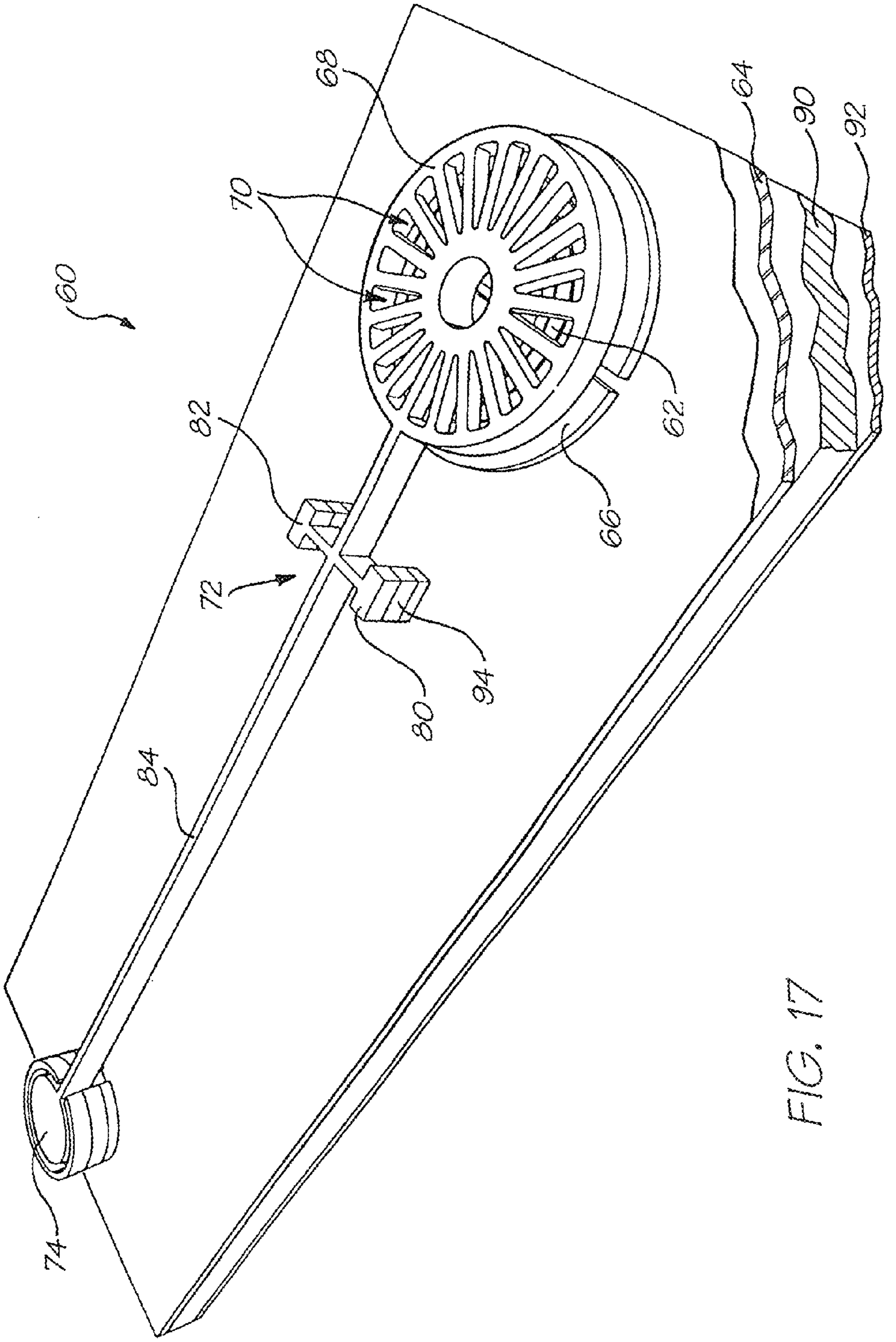
FIG. 17 is a perspective view, in part in section, of the ink jet nozzle of FIG. 16.

FIG. 17 shows a perspective view, in part in section, of a single ink jet nozzle arrangement 60 constructed in accordance with the preferred embodiment.

One alternative form of detailed manufacturing process which can be used to fabricate monolithic ink jet printheads operating in accordance with the principles taught by the present embodiment can proceed utilizing the following steps:

1. Using a double-sided polished wafer 90 deposit 3 microns of epitaxial silicon 92 heavily doped with boron.

2. Deposit 10 microns of epitaxial silicon 98, either p-type or n-type, depending upon the CMOS process used.

Figure 18:
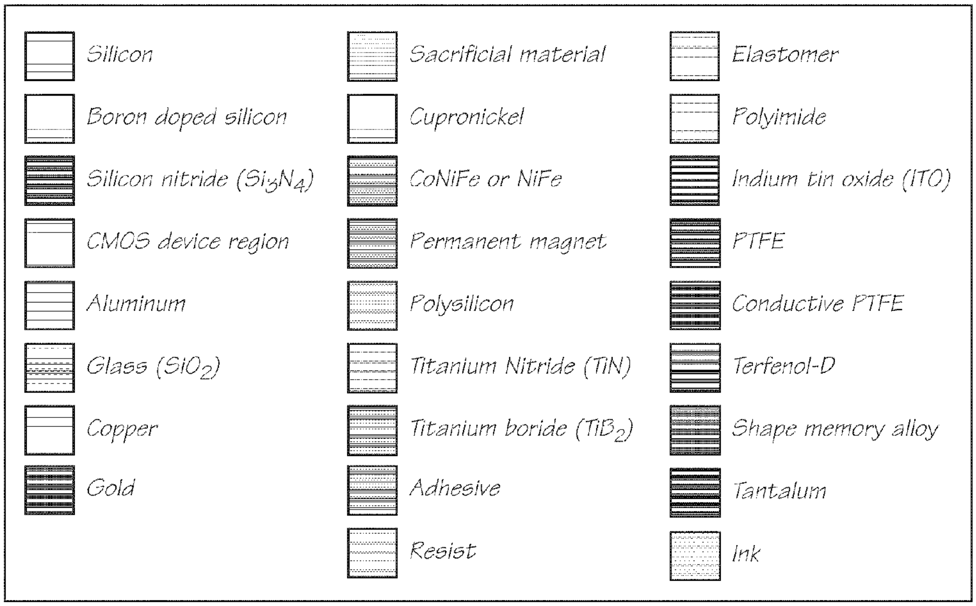
FIG. 18 provides a legend of the materials indicated in FIGS. 19 to 35.
Figure 19:
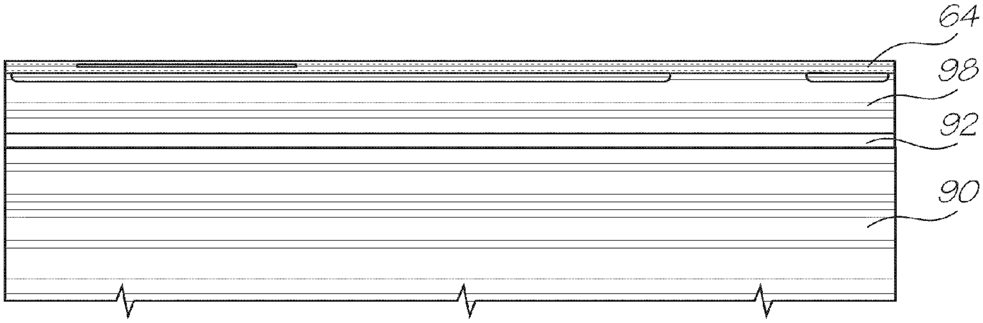
FIGS. 19 to 35 illustrate sectional views of the manufacturing steps in one form of construction of the ink jet printhead nozzle of FIG. 16.

3. Complete a 0.5-micron, one poly, 2 metal CMOS process. This step is shown in FIG. 19. For clarity, these diagrams may not be to scale, and may not represent a cross section though any single plane of the nozzle. FIG. 18 is a key to representations of various materials in these manufacturing diagrams.

4. Etch the CMOS oxide layers down to silicon or aluminum using Mask 1. This mask defines the nozzle chamber 76, the edges of the printheads chips, and the vias for the contacts from the aluminum electrodes to two halves of the fixed magnetic pole 66.

Figure 20:
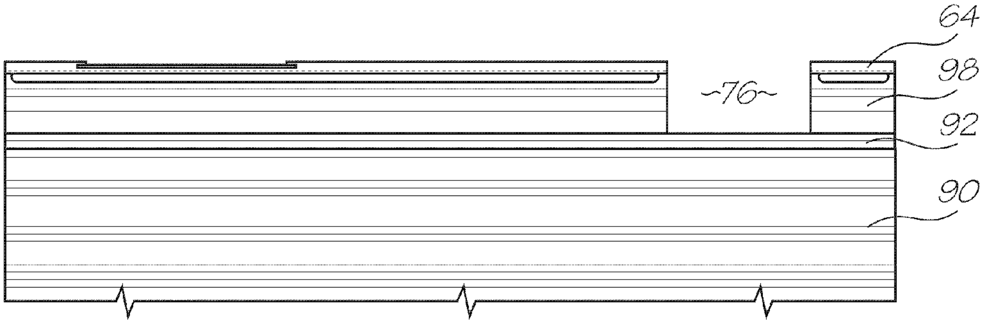

5. Plasma etch the silicon 90 down to the boron doped buried layer 92, using oxide from step 4 as a mask. This etch does not substantially etch the aluminum. This step is shown in FIG. 20.

6. Deposit a seed layer of cobalt nickel iron alloy. CoNiFe is chosen due to a high saturation flux density of 2 Tesla, and a low coercivity. [Osaka, Tetsuya et al, A soft magnetic CoNiFe film with high saturation magnetic flux density, Nature 392, 796-798 (1998)].

Figure 21:
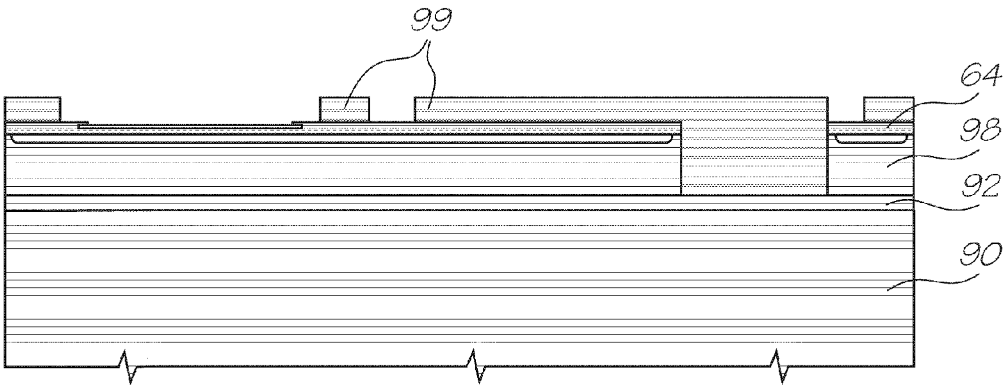

7. Spin on 4 microns of resist 99, expose with Mask 2, and develop. This mask defines the fixed magnetic pole 66 and the nozzle chamber wall, for which the resist 99 acts as an electroplating mold. This step is shown in FIG. 21.

Figure 22:
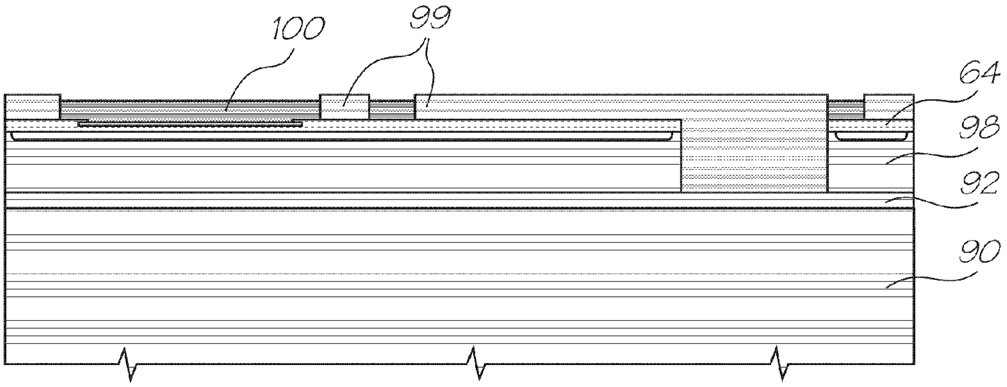

8. Electroplate 3 microns of CoNiFe 100. This step is shown in FIG. 22.

Figure 23:
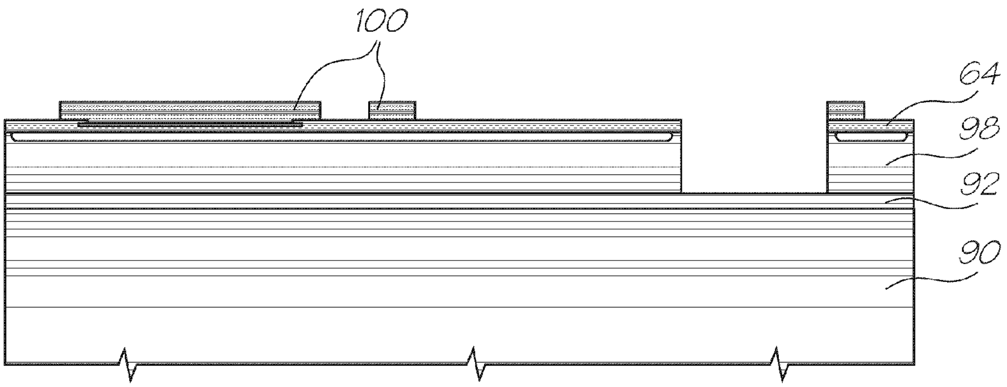

9. Strip the resist and etch the exposed seed layer. This step is shown in FIG. 23.

10. Deposit 0.1 microns of silicon nitride (Si3N4).

11. Etch the nitride layer using Mask 3. This mask defines the contact vias from each end of the solenoid 62 to the two halves of the fixed magnetic pole 66.

12. Deposit a seed layer of copper. Copper is used for its low resistivity (which results in higher efficiency) and its high electromigration resistance, which increases reliability at high current densities.

Figure 24:
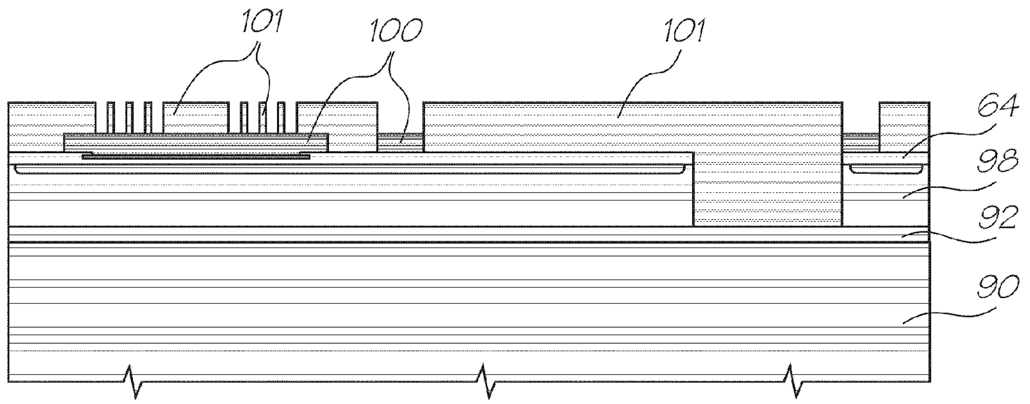

13. Spin on 5 microns of resist 101, expose with Mask 4, and develop. This mask defines a spiral coil for the solenoid 62, the nozzle chamber wall and the spring posts 94, for which the resist acts as an electroplating mold. This step is shown in FIG. 24.

14. Electroplate 4 microns of copper 103.

Figure 25:
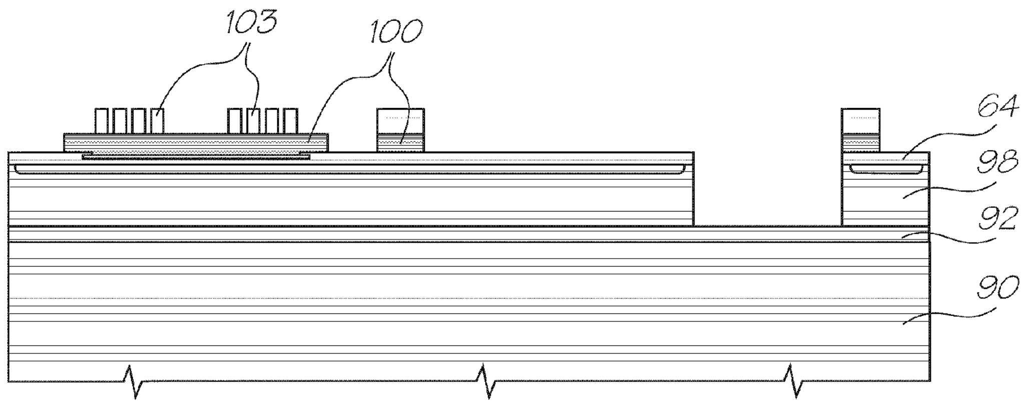

15. Strip the resist 101 and etch the exposed copper seed layer. This step is shown in FIG. 25.

16. Wafer probe. All electrical connections are complete at this point, bond pads are accessible, and the chips are not yet separated.

17. Deposit 0.1 microns of silicon nitride.

18. Deposit 1 micron of sacrificial material 102. This layer determines the magnetic gap 114.

Figure 26:
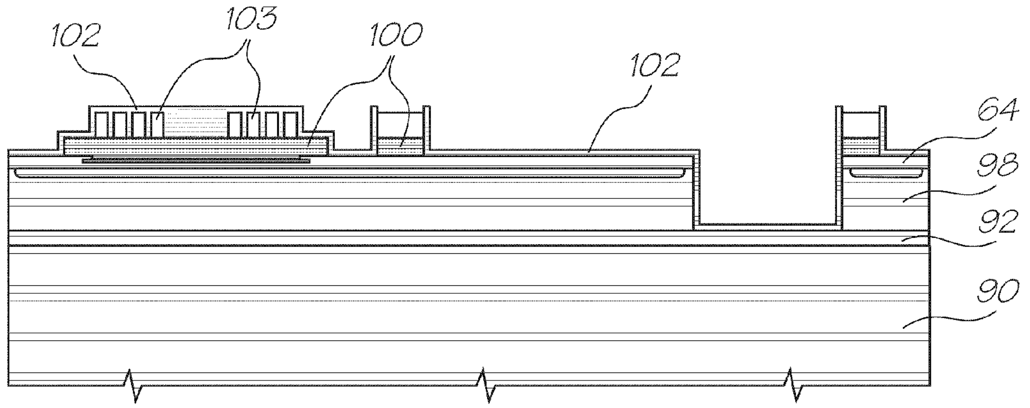

19. Etch the sacrificial material 102 using Mask 5. This mask defines the spring posts 94 and the nozzle chamber wall. This step is shown in FIG. 26.

20. Deposit a seed layer of CoNiFe.

Figure 27:
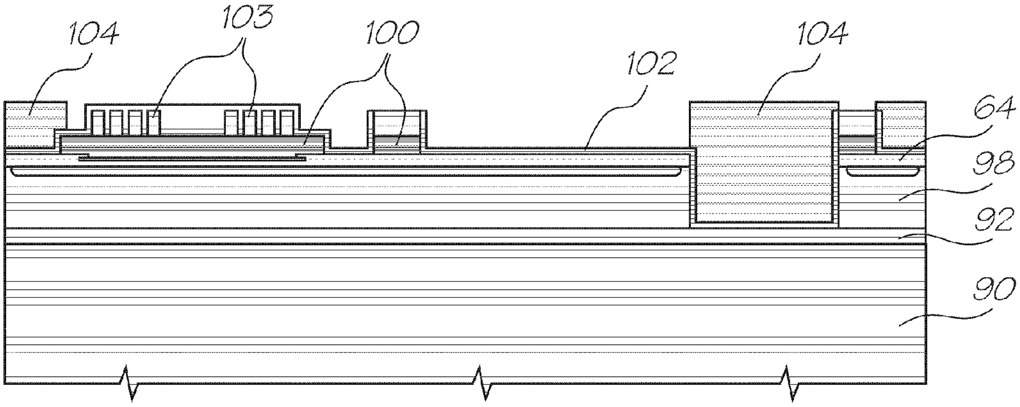
Figure 28:
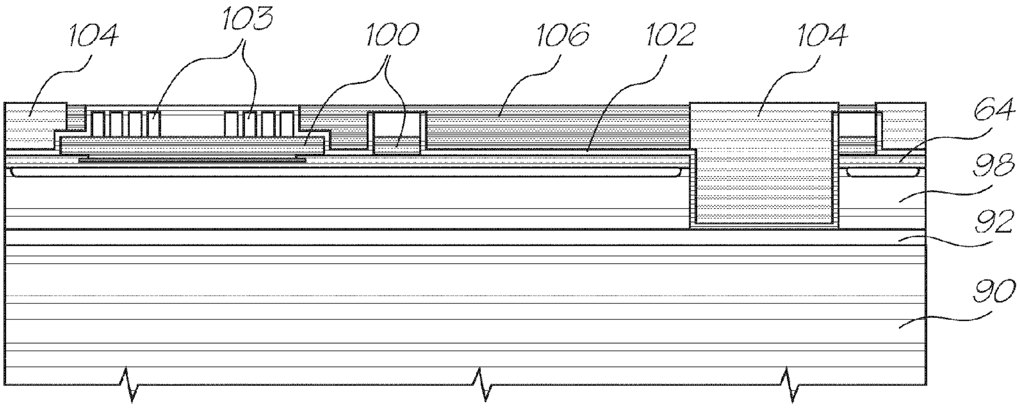

21. Spin on 4.5 microns of resist 104, expose with Mask 6, and develop. This mask defines the walls of the magnetic plunger or piston 74, the lever arm 84, the nozzle chamber wall and the spring posts 94. The resist forms an electroplating mold for these parts. This step is shown in FIG. 27.

22. Electroplate 4 microns of CoNiFe 106. This step is shown in FIG. 13.

23. Deposit a seed layer of CoNiFe.

Figure 29:
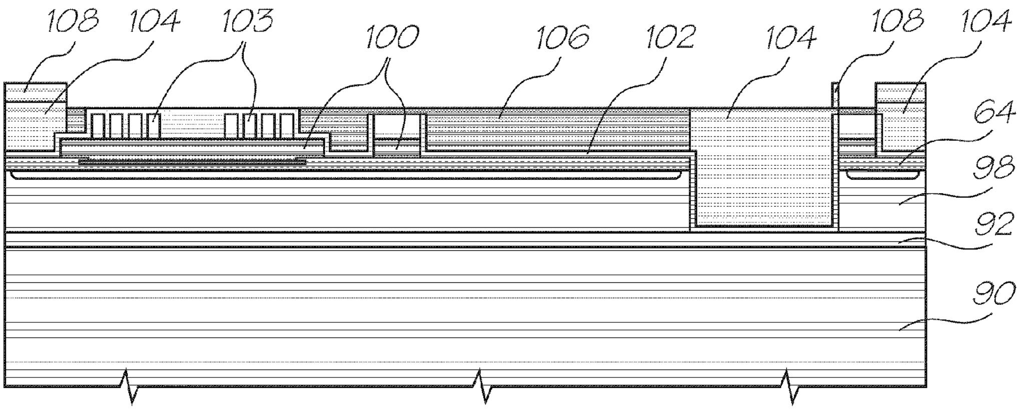

24. Spin on 4 microns of resist 108, expose with Mask 7, and develop. This mask defines the roof of the magnetic plunger 74, the nozzle chamber wall, the lever arm 84, the springs 80, 82, and the spring posts 94. The resist 108 forms an electroplating mold for these parts. This step is shown in FIG. 29.

Figure 30:
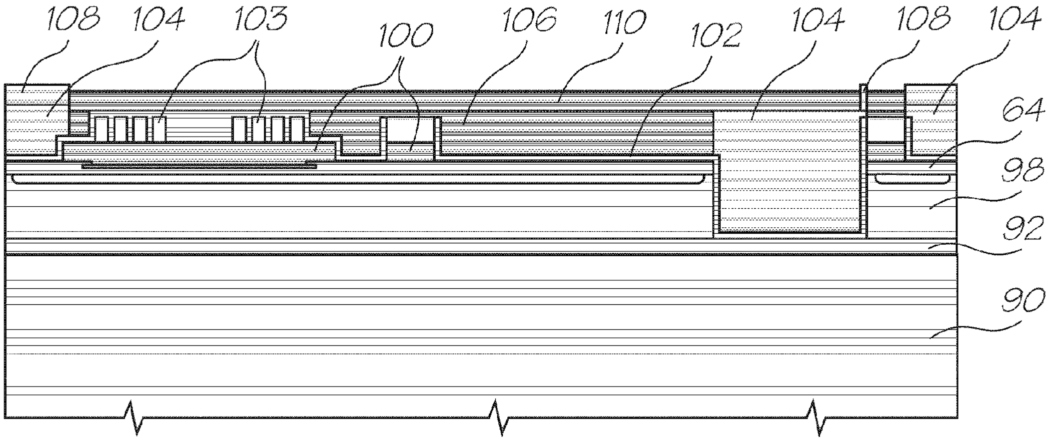

25. Electroplate 3 microns of CoNiFe 110. This step is shown in FIG. 30.

Figure 31:
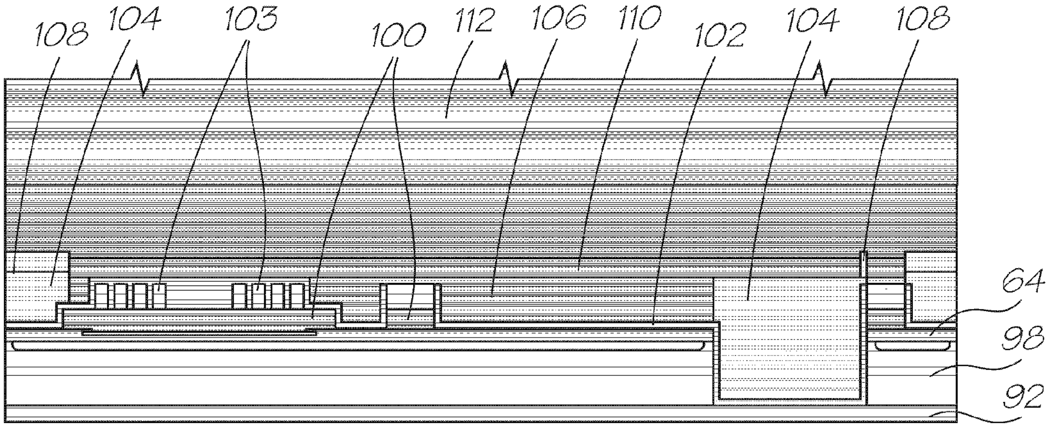

26. Mount the wafer 90 on a glass blank 112 and back-etch the wafer 90 using KOH, with no mask. This etch thins the wafer 90 and stops at the buried boron doped silicon layer 92. This step is shown in FIG. 31.

Figure 32:
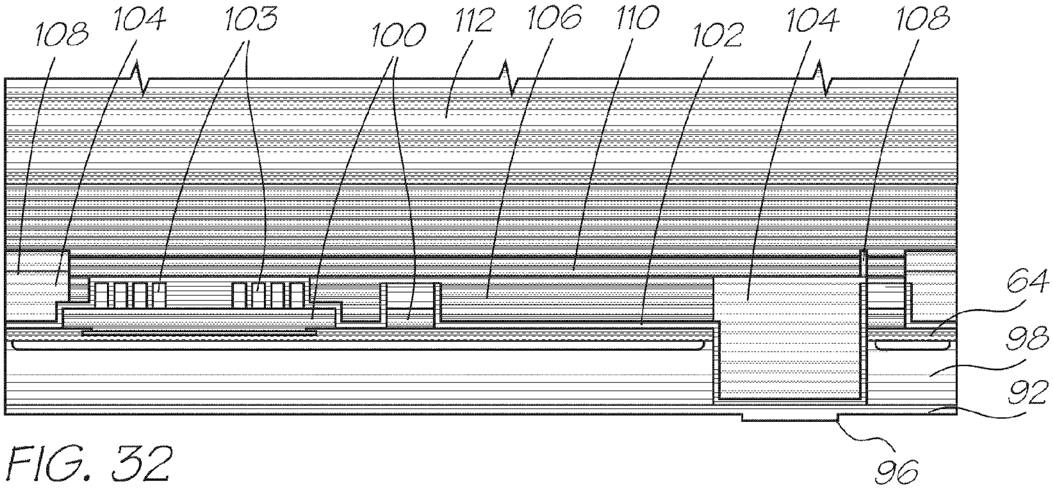

27. Plasma back-etch the boron doped silicon layer 92 to a depth of 1 micron using Mask 8. This mask defines the nozzle rim 96. This step is shown in FIG. 32.

Figure 33:
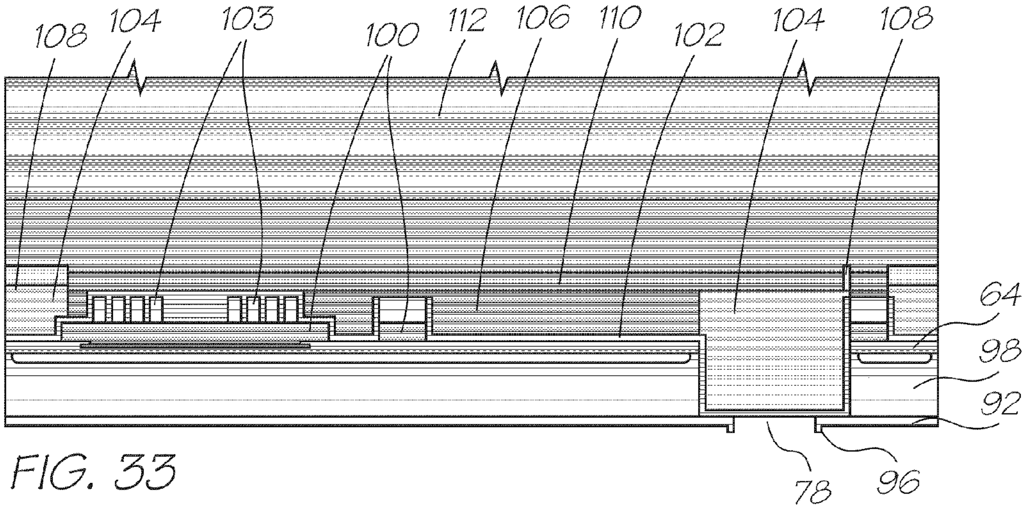

28. Plasma back-etch through the boron doped layer 92 using Mask 9. This mask defines the ink ejection port 78, and the edge of the chips. At this stage, the chips are separate, but are still mounted on the glass blank 112. This step is shown in FIG. 33.

Figure 34:
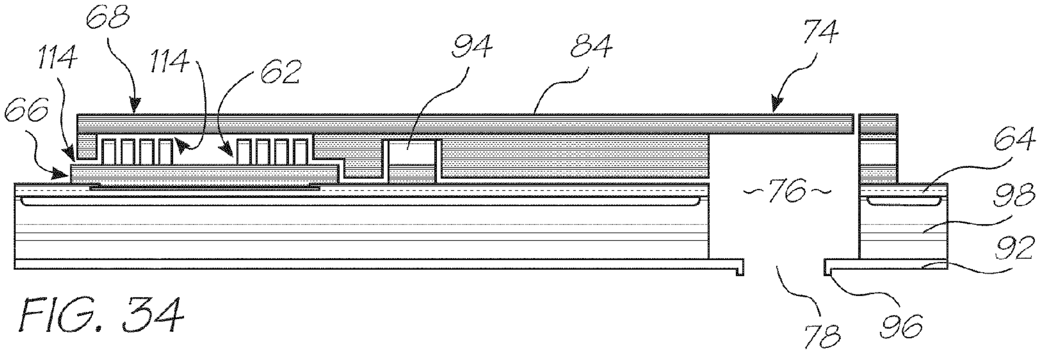

29. Detach the chips from the glass blank 112. Strip all adhesive, resist, sacrificial, and exposed seed layers. This step is shown in FIG. 34.

30. Mount the printheads in their packaging, which may be a molded plastic former incorporating ink channels which supply different colors of ink to the appropriate regions of the front surface of the wafer.

31. Connect the printheads to their interconnect systems.

32. Hydrophobize the front surface of the printheads.

Figure 35:
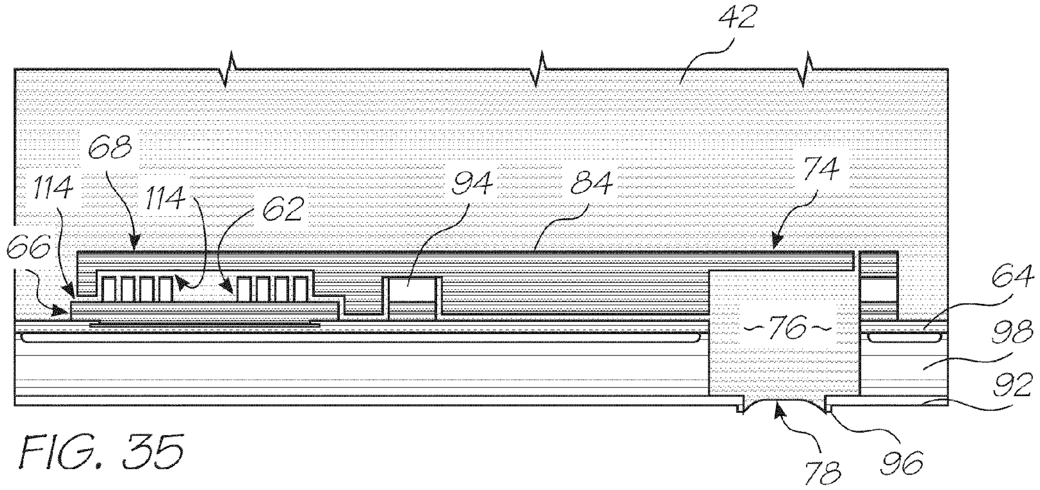

33. Fill the completed printheads with ink and test them. A filled nozzle is shown in FIG. 35.

The following description is of an embodiment of the invention covered by U.S. patent application Ser. No. 09/113,061 to the applicant. In this embodiment, a linear stepper motor is utilised to control a plunger device. The plunger device compresses ink within a nozzle chamber to cause the ejection of ink from the chamber on demand.

Figure 36:
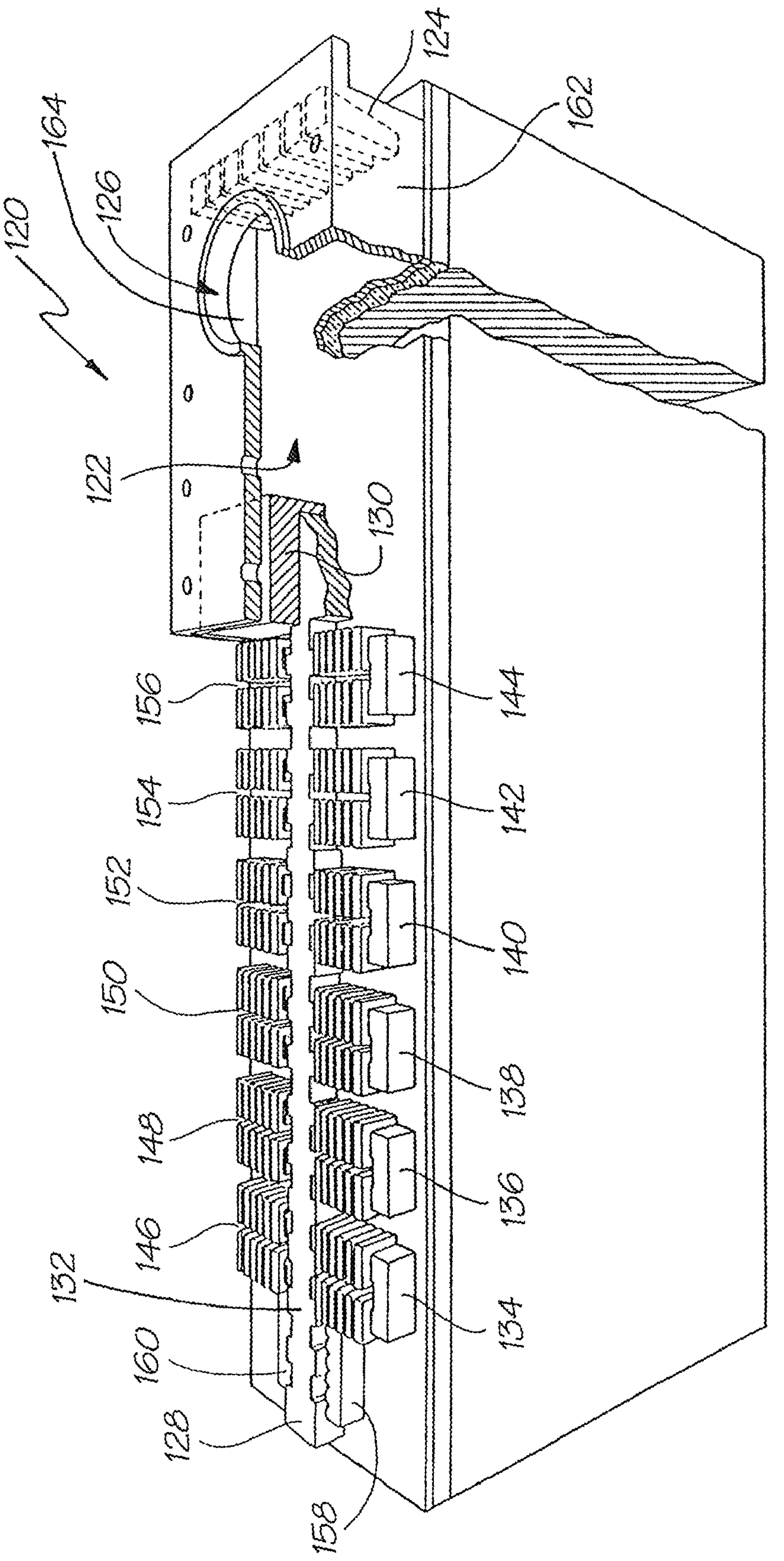
FIG. 36 is a cut-out top view of an ink jet nozzle of U.S. patent application Ser. No. 09/113,061 by the Applicant, referred to in the table of cross-referenced material as set out above.

Turning to FIG. 36, there is illustrated a single nozzle arrangement 120 as constructed in accordance with this embodiment. The nozzle arrangement 120 includes a nozzle chamber 122 into which ink flows via a nozzle chamber filter portion 124 which includes a series of posts which filter out foreign bodies in the ink inflow. The nozzle chamber 122 includes an ink ejection port 126 for the ejection of ink on demand. Normally, the nozzle chamber 122 is filled with ink.

A linear actuator 128 is provided for rapidly compressing a nickel ferrous plunger 130 into the nozzle chamber 122 so as to compress the volume of ink within the chamber 122 to thereby cause ejection of drops from the ink ejection port 126. The plunger 130 is connected to a stepper moving pole device 132 of the linear actuator 128 which is actuated by means of a three phase arrangement of electromagnets 134, 136, 138, 140, 142, 144, 146, 148, 150, 152, 154, 156. The electromagnets are driven in three phases with electromagnets 134, 146, 140 and 152 being driven in a first phase, electromagnets 136, 148, 142, 154 being driven in a second phase and electromagnets 138, 150, 144, 156 being driven in a third phase. The electromagnets are driven in a reversible manner so as to de-actuate the plunger 130 via actuator 128. The actuator 128 is guided at one end by a means of a guide 158, 160. At the other end, the plunger 130 is coated with a hydrophobic material such as polytetrafluoroethylene (PTFE) which can form a major part of the plunger 130. The PTFE acts to repel the ink from the nozzle chamber 122 resulting in the creation of menisci 224, 226 (FIG. 59(*a*)) between the plunger 130 and side walls 162, 164. The surface tension characteristics of the menisci 224, 226 act to guide the plunger 130 within the nozzle chamber 122. The menisci 224, 226 further stop ink from flowing out of the chamber 122 and hence the electromagnets 134 to 156 can be operated in the atmosphere.

The nozzle arrangement 120 is therefore operated to eject drops on demand by means of activating the actuator 128 by appropriately synchronized driving of electromagnets 134 to 156. The actuation of the actuator 128 results in the plunger 130 moving towards the nozzle ink ejection port 126 thereby causing ink to be ejected from the port 126.

Subsequently, the electromagnets 134 to 156 are driven in reverse thereby moving the plunger 130 in an opposite direction resulting in the inflow of ink from an ink supply connected to an ink inlet port 166.

Preferably, multiple ink nozzle arrangements 120 can be constructed adjacent to one another to form a multiple nozzle ink ejection mechanism. The nozzle arrangements 120 are preferably constructed in an array print head constructed on a single silicon wafer which is subsequently diced in accordance with requirements. The diced print heads can then be interconnected to an ink supply which can comprise a through chip ink flow or ink flow from the side of a chip.

Figure 37:
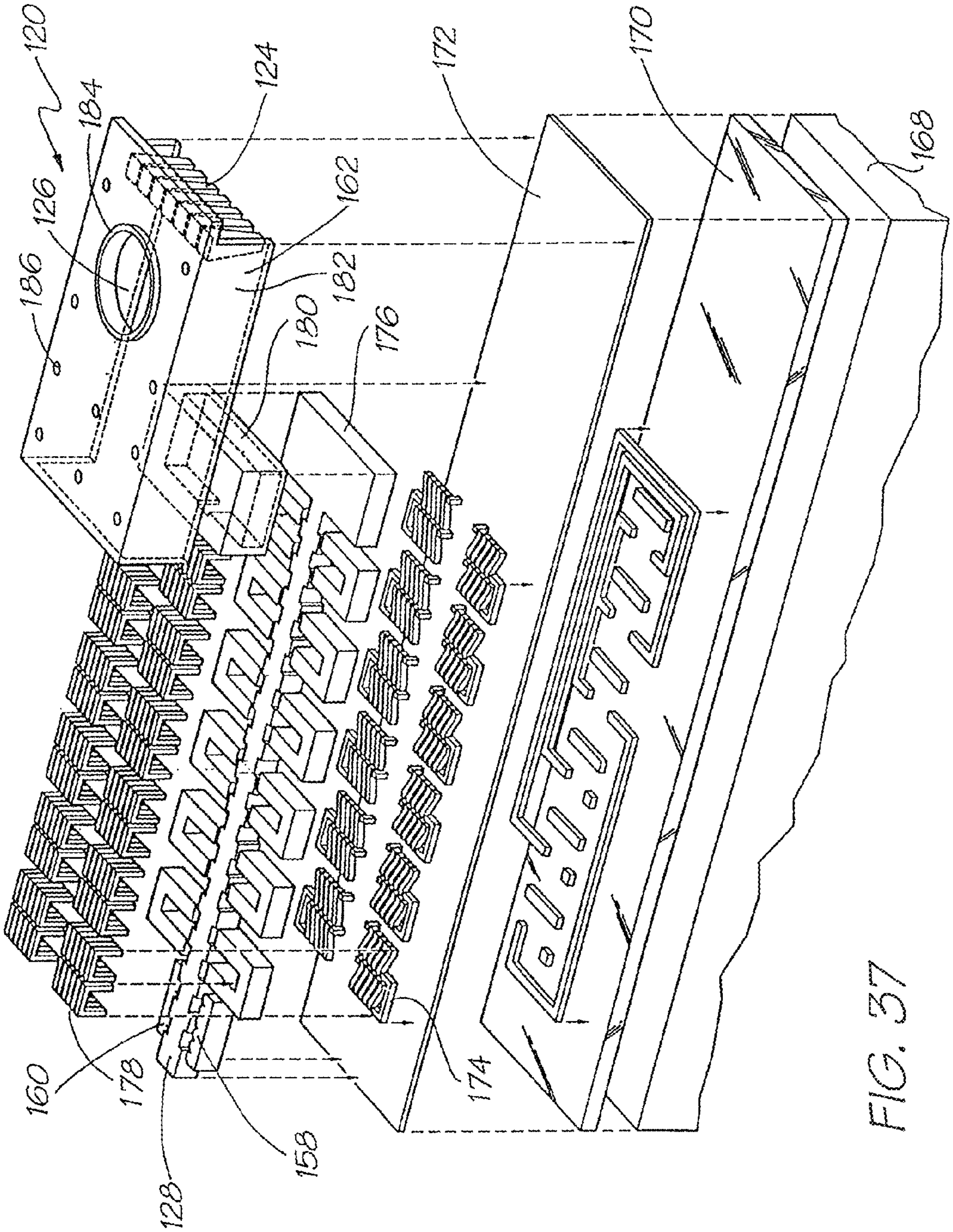
FIG. 37 is an exploded perspective view illustrating the construction of the ink jet nozzle of FIG. 36.

Turning now to FIG. 37, there is shown an exploded perspective of the various layers of the nozzle arrangement 120. The nozzle arrangement 120 can be constructed on top of a silicon wafer 168 which has a standard electronic circuitry layer such as a two level metal CMOS layer 170. The two metal CMOS layer 170 provides the drive and control circuitry for the ejection of ink from the nozzles 120 by interconnection of the electromagnets to the CMOS layer 170. On top of the CMOS layer 170 is a nitride passivation layer 172 which passiveness the lower layers against any ink erosion in addition to any etching of the lower CMOS glass layer 170 should a sacrificial etching process be used in the construction of the nozzle arrangement 120.

On top of the nitride layer 172 are constructed various other layers. The wafer layer 168, the CMOS layer 170 and the nitride passivation layer 172 are constructed with the appropriate vias for interconnection with the above layers. On top of the nitride layer 172 is constructed a bottom copper layer 174 which interconnects with the CMOS layer 170 as appropriate. Next, a nickel ferrous layer 176 is constructed which includes portions for the core of the electromagnets 134 to 156 and the actuator 128 and guides 158, 160. On top of the NiFe layer 176 is constructed a second copper layer 178 which forms the rest of the electromagnetic device. The copper layer 178 can be constructed using a dual damascene process. Next, a PTFE layer 180 is laid down followed by a nitride layer 182 which defines the side filter portions 124 and side wall portions 162, 164 of the nozzle chamber 122. The ejection port 126 and a nozzle rim 184 are etched into the nitride layer 182. A number of apertures 186 are defined in the nitride layer 182 to facilitate etching away any sacrificial material used in the construction of the various lower layers including the nitride layer 182.

It will be understood by those skilled in the art of construction of micro-electro-mechanical systems (MEMS) that the various layers 170 to 182 can be constructed using a sacrificial material to support the layers. The sacrificial material is then etched away to release the components of the nozzle arrangement 120.

For a general introduction to a micro-electro mechanical system (MEMS) reference is made to standard proceedings in this field including the proceedings of the SPIE (International Society for Optical Engineering), volumes 2642 and 2882 which contain the proceedings for recent advances and conferences in this field.

Figure 38:
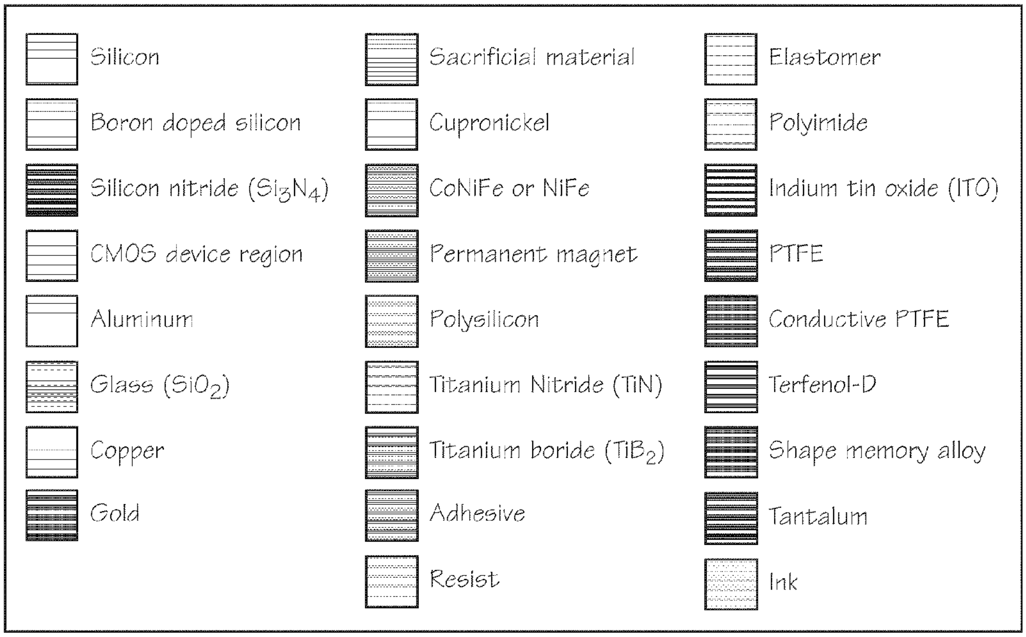
FIG. 38 provides a legend of the materials indicated in FIGS. 39 to 59.
Figure 39:
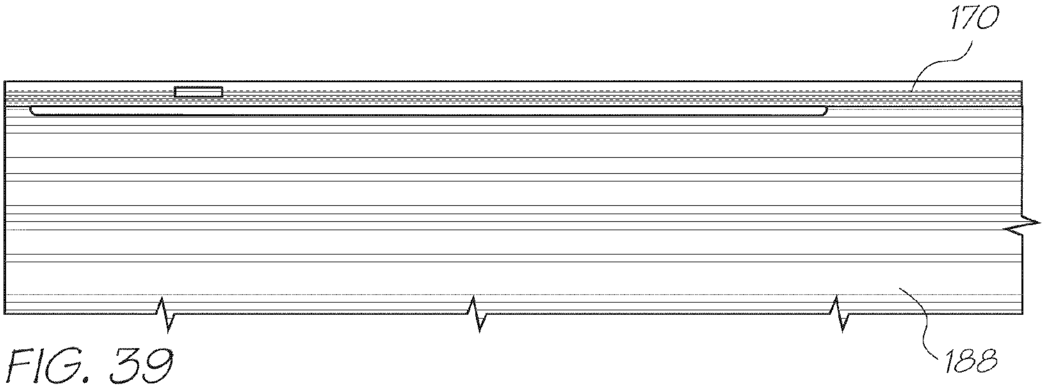
FIGS. 39 to 59 illustrate sectional views of the manufacturing steps in one form of construction of the ink jet printhead nozzle of FIG. 36.

One form of detailed manufacturing process which can be used to fabricate monolithic ink jet print heads operating in accordance with the principles taught by the present embodiment can proceed utilizing the following steps:

1. Using a double sided polished wafer 188, complete drive transistors, data distribution, and timing circuits using a 0.5 micron, one poly, 2 metal CMOS process. This step is shown in FIG. 39. For clarity, these diagrams may not be to scale, and may not represent a cross section though any single plane of the nozzle 120. FIG. 38 is a key to representations of various materials in these manufacturing diagrams, and those of other cross-referenced ink jet configurations.

2. Deposit 1 micron of sacrificial material 190.

Figure 40:
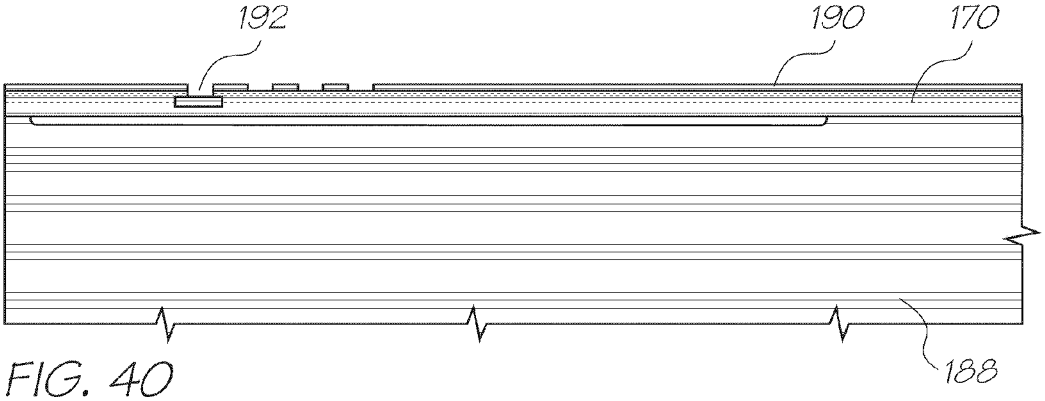

3. Etch the sacrificial material 190 and the CMOS oxide layers down to second level metal using Mask 1. This mask defines contact vias 192 from the second level metal electrodes to the solenoids. This step is shown in FIG. 40.

4. Deposit a barrier layer of titanium nitride (TiN) and a seed layer of copper.

Figure 41:
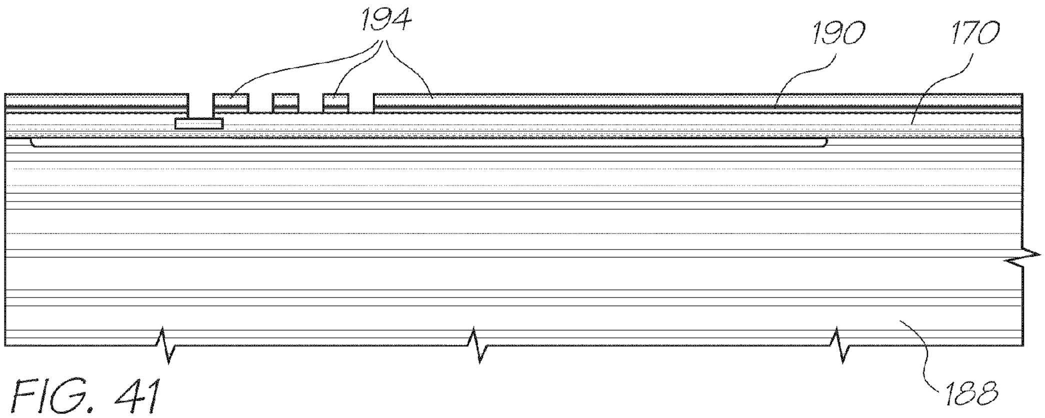

5. Spin on 2 microns of resist 194, expose with Mask 2, and develop. This mask defines the lower side of a solenoid square helix. The resist 194 acts as an electroplating mold. This step is shown in FIG. 41.

6. Electroplate 1 micron of copper 196. Copper is used for its low resistivity (which results in higher efficiency) and its high electromigration resistance, which increases reliability at high current densities.

Figure 42:
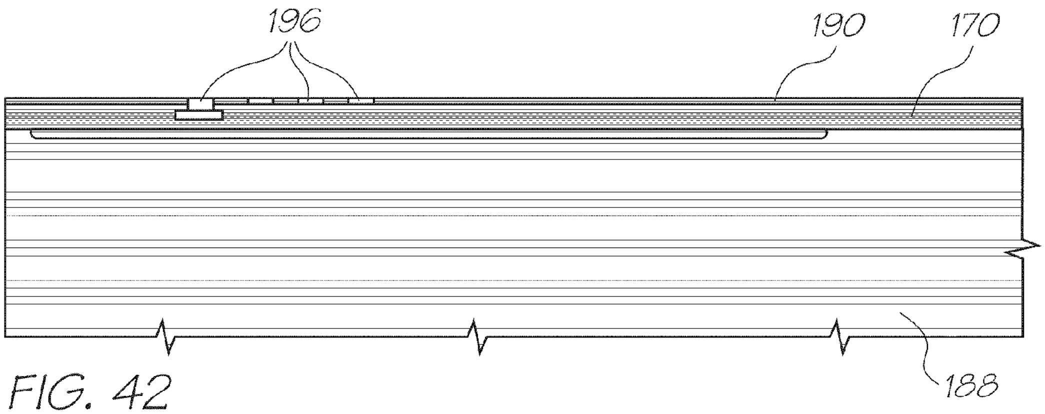

7. Strip the resist 198 and etch the exposed barrier and seed layers. This step is shown in FIG. 42.

8. Deposit 0.1 microns of silicon nitride.

9. Deposit a seed layer of cobalt nickel iron alloy. CoNiFe is chosen due to a high saturation flux density of 2 Tesla, and a low coercivity. [Osaka, Tetsuya et al, A soft magnetic CoNiFe film with high saturation magnetic flux density, Nature 392, 796-798 (1998)].

Figure 43:
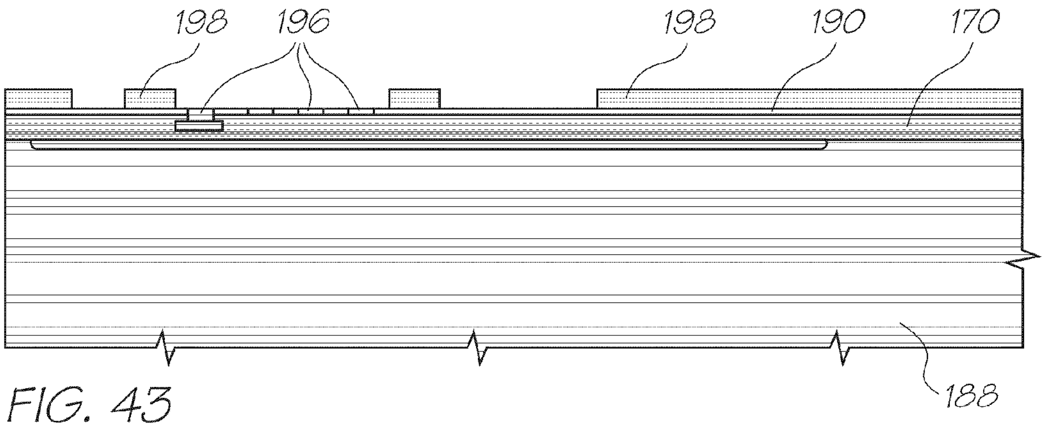

10. Spin on 3 microns of resist 198, expose with Mask 3, and develop. This mask defines all of the soft magnetic parts, being the fixed magnetic pole of the electromagnets, 134 to 156, the moving poles of the linear actuator 128, the horizontal guides 158, 160, and the core of the ink plunger 130. The resist 198 acts as an electroplating mold. This step is shown in FIG. 43.

Figure 44:
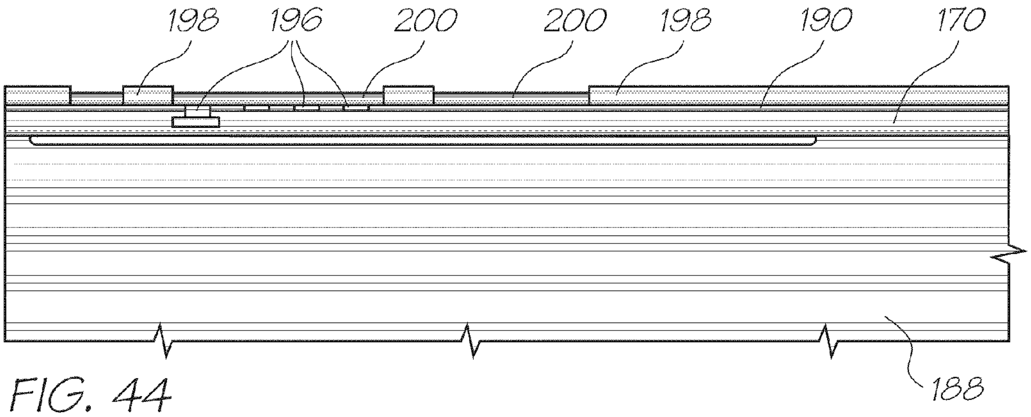

11. Electroplate 2 microns of CoNiFe 200. This step is shown in FIG. 44.

Figure 45:
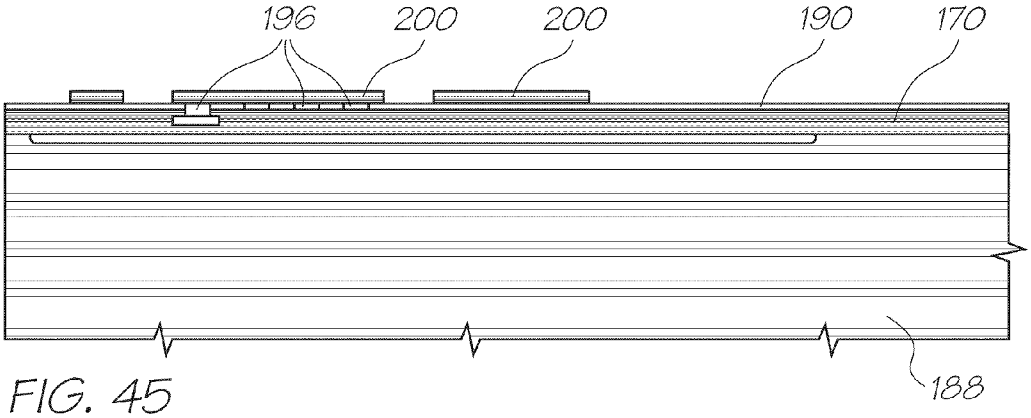

12. Strip the resist 198 and etch the exposed seed layer. This step is shown in FIG. 45.

13. Deposit 0.1 microns of silicon nitride ($Si_3N_4$) (not shown).

Figure 46:
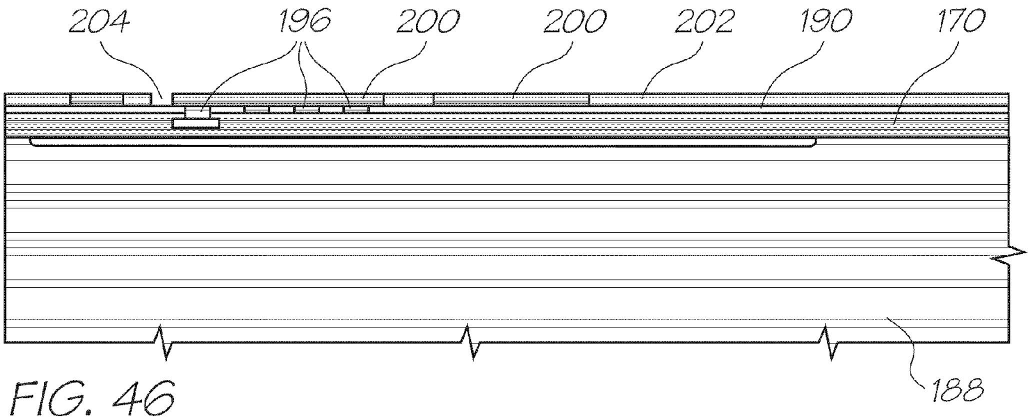

14. Spin on 2 microns of resist 202, expose with Mask 4, and develop. This mask defines solenoid vertical wire segments 204, for which the resist acts as an electroplating mold. This step is shown in FIG. 46.

15. Etch the nitride down to copper using the Mask 4 resist.

Figure 47:
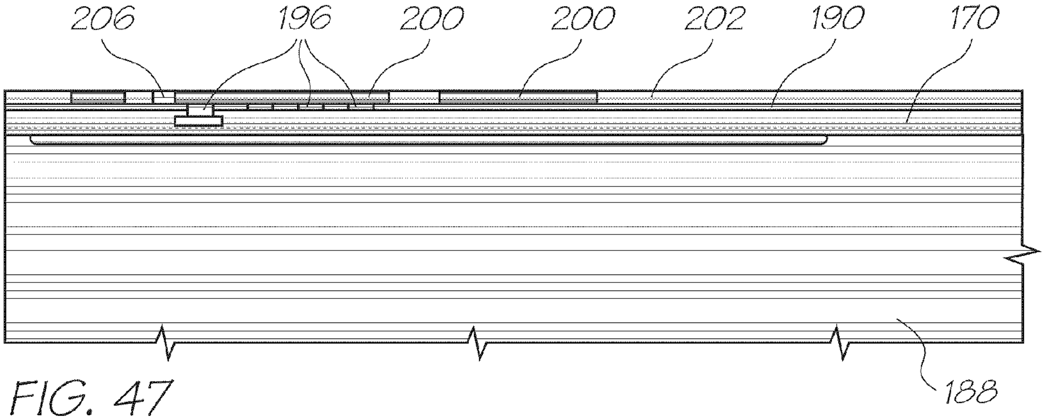

16. Electroplate 2 microns of copper 206. This step is shown in FIG. 47.

17. Deposit a seed layer of copper.

Figure 48:
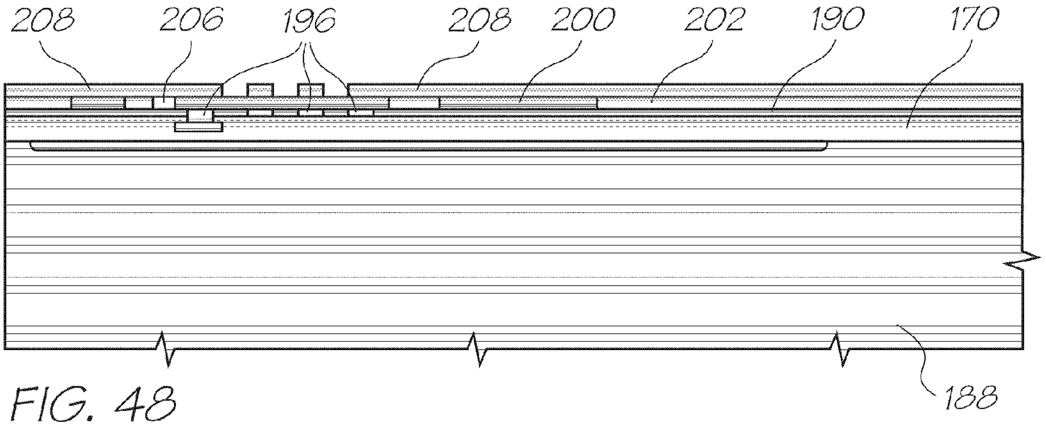

18. Spin on 2 microns of resist 208, expose with Mask 5, and develop. This mask defines the upper side of the solenoid square helix. The resist 208 acts as an electroplating mold. This step is shown in FIG. 48.

Figure 49:
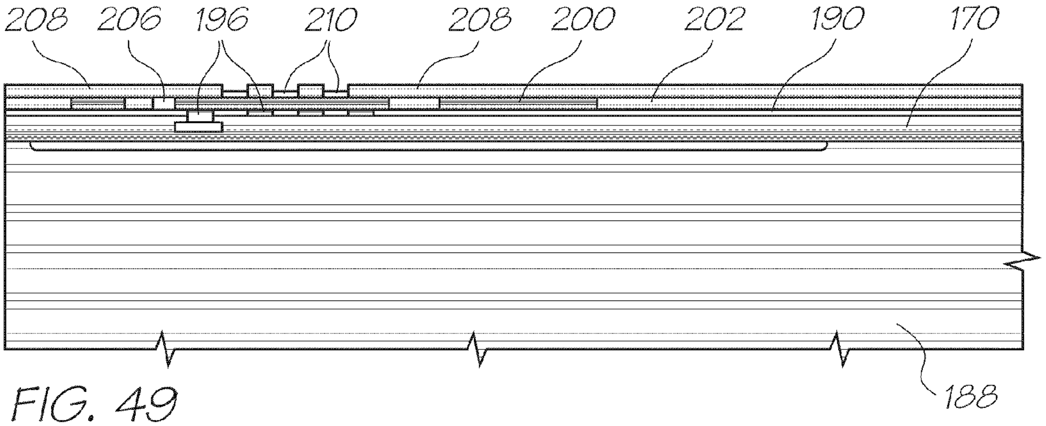

19. Electroplate 1 micron of copper 210. This step is shown in FIG. 49.

Figure 50:
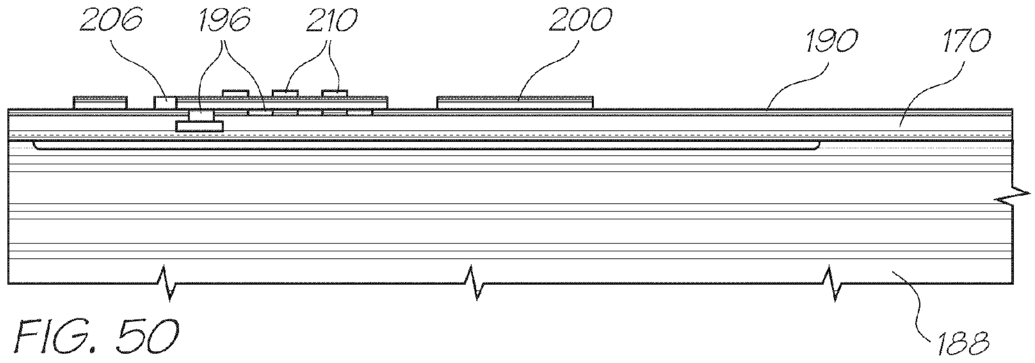

20. Strip the resist and etch the exposed copper seed layer, and strip the newly exposed resist. This step is shown in FIG. 50.

21. Open the bond pads using Mask 6.

22. Wafer probe. All electrical connections are complete at this point, bond pads are accessible, and the chips are not yet separated.

23. Deposit 5 microns of PTFE 212.

Figure 51:
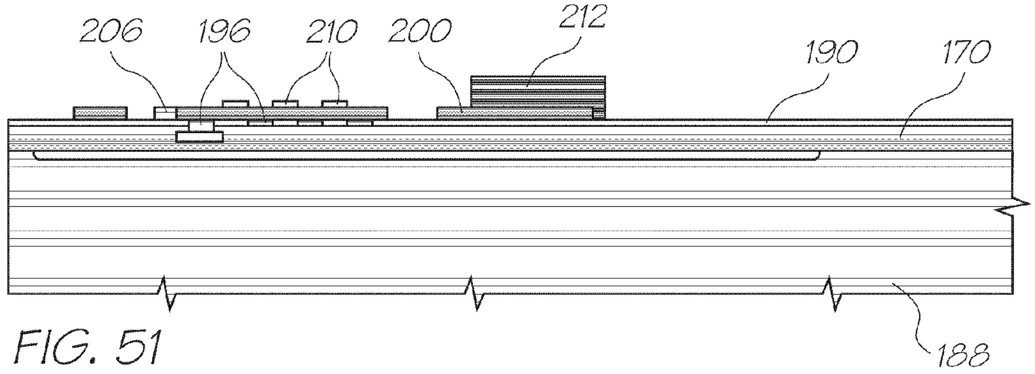

24. Etch the PTFE 212 down to the sacrificial layer using Mask 7. This mask defines the ink plunger 130. This step is shown in FIG. 51.

Figure 52:
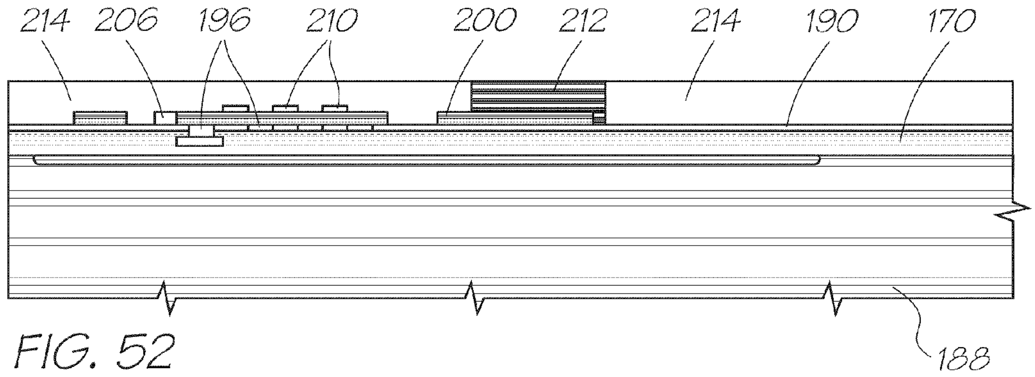

25. Deposit 8 microns of sacrificial material 214. Planarize using CMP to the top of the PTFE ink plunger 130. This step is shown in FIG. 52.

Figure 53:
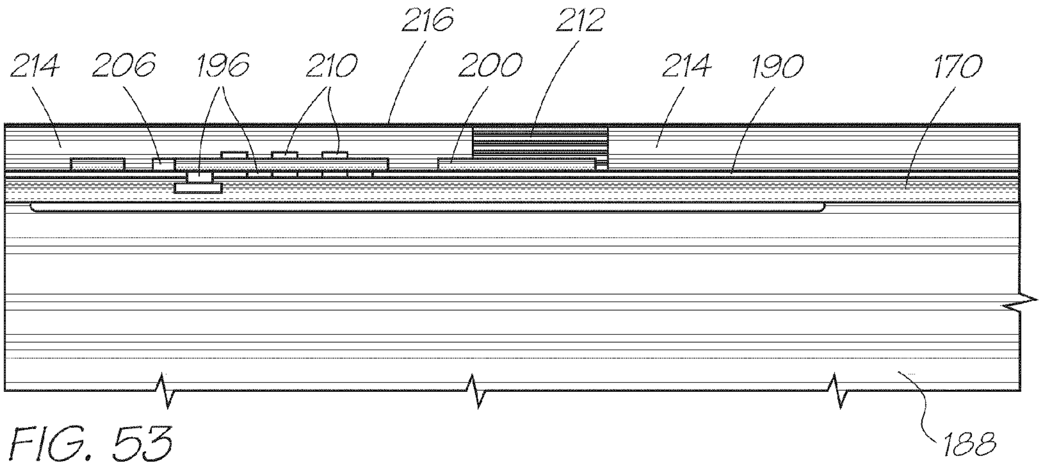

26. Deposit 0.5 microns of sacrificial material 216. This step is shown in FIG. 53.

Figure 54:
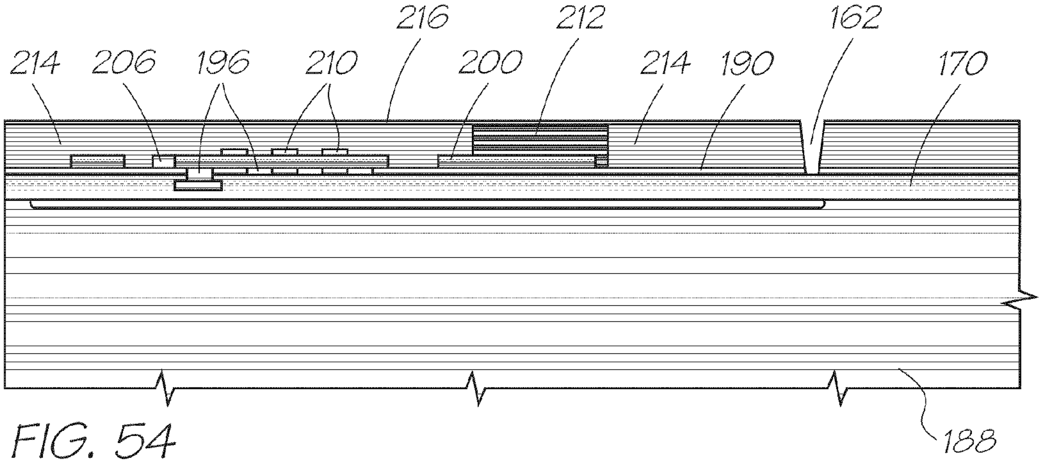

27. Etch all layers of sacrificial material using Mask 8. This mask defines the nozzle chamber walls 162, 164. This step is shown in FIG. 54.

28. Deposit 3 microns of PECVD glass 218.

Figure 55:
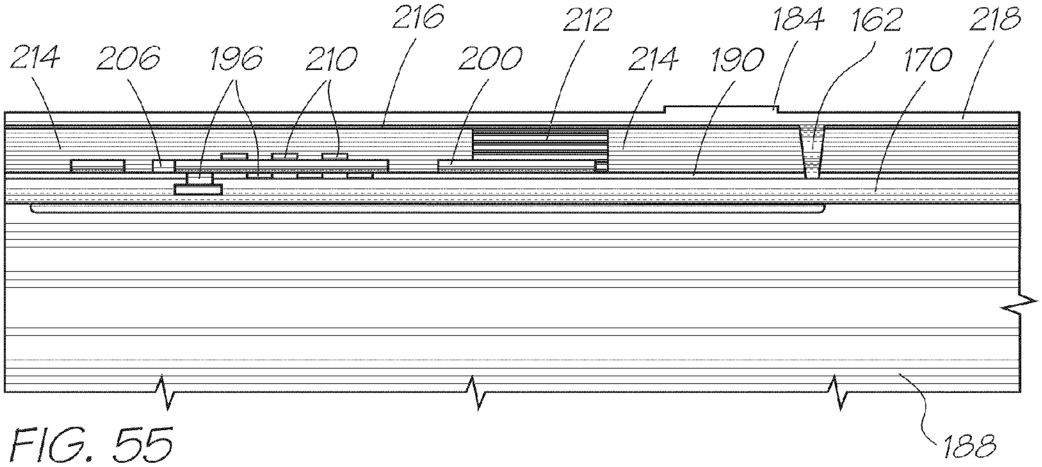

29. Etch to a depth of (approx.) 1 micron using Mask 9. This mask defines the nozzle rim 184. This step is shown in FIG. 55.

Figure 56:
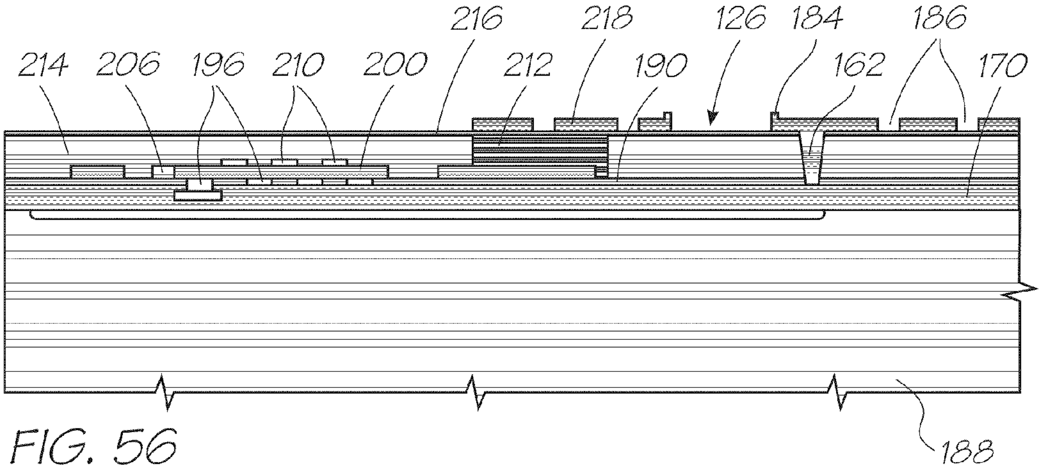

30. Etch down to the sacrificial layer using Mask 10. This mask defines the roof of the nozzle chamber 122, the ink ejection port 126, and the sacrificial etch access apertures 186. This step is shown in FIG. 56.

Figure 57:
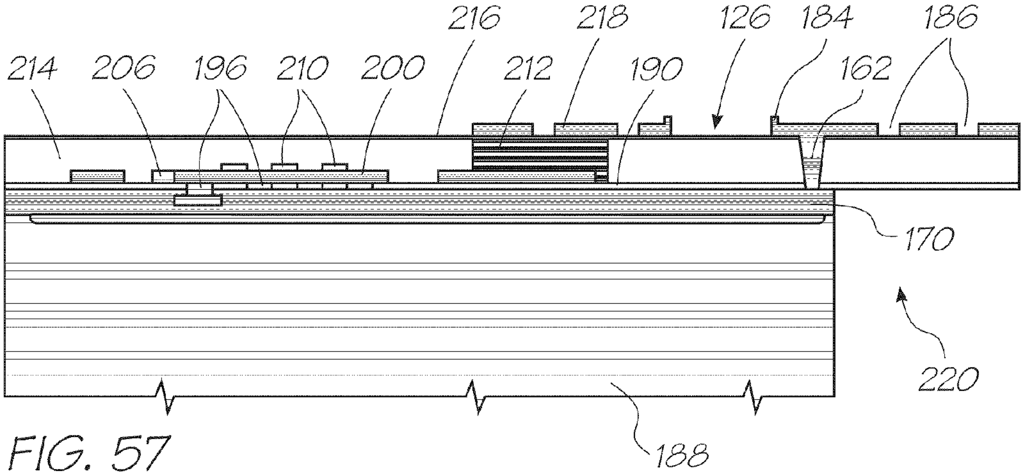

31. Back-etch completely through the silicon wafer (with, for example, an ASE Advanced Silicon Etcher from Surface Technology Systems) using Mask 11. Continue the back-etch through the CMOS glass layers until the sacrificial layer is reached. This mask defines ink inlets 220 which are etched through the wafer 168. The wafer 168 is also diced by this etch. This step is shown in FIG. 57.

Figure 58:
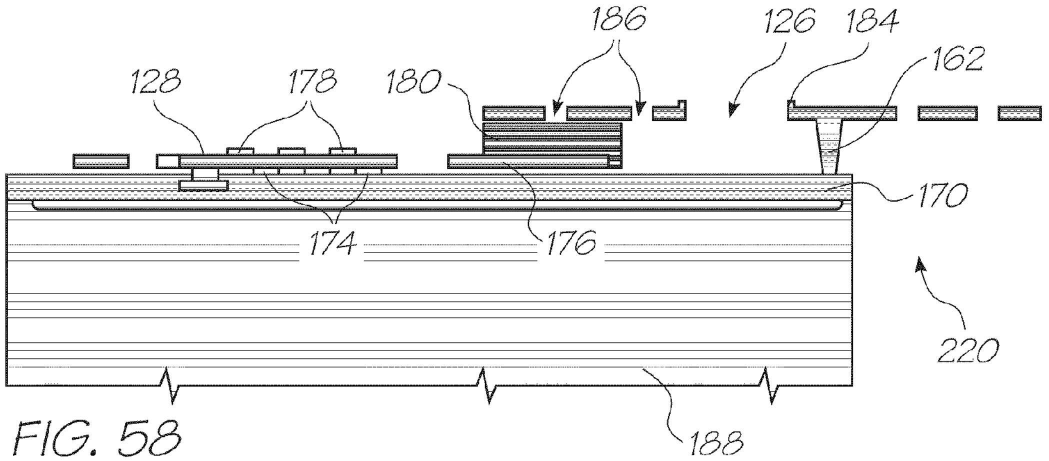

32. Etch the sacrificial material away. The nozzle chambers 122 are cleared, the actuators 128 freed, and the chips are separated by this etch. This step is shown in FIG. 58.

33. Mount the printheads in their packaging, which may be a molded plastic former incorporating ink channels which supply the appropriate color ink to the ink inlets 220 at the back of the wafer. The package also includes a piezoelectric actuator attached to the rear of the ink channels. The piezoelectric actuator provides the oscillating ink pressure required for the ink jet operation.

34. Connect the printheads to their interconnect systems. For a low profile connection with minimum disruption of airflow, TAB may be used. Wire bonding may also be used if the printer is to be operated with sufficient clearance to the paper.

35. Hydrophobize the front surface of the printheads.

Figure 59:
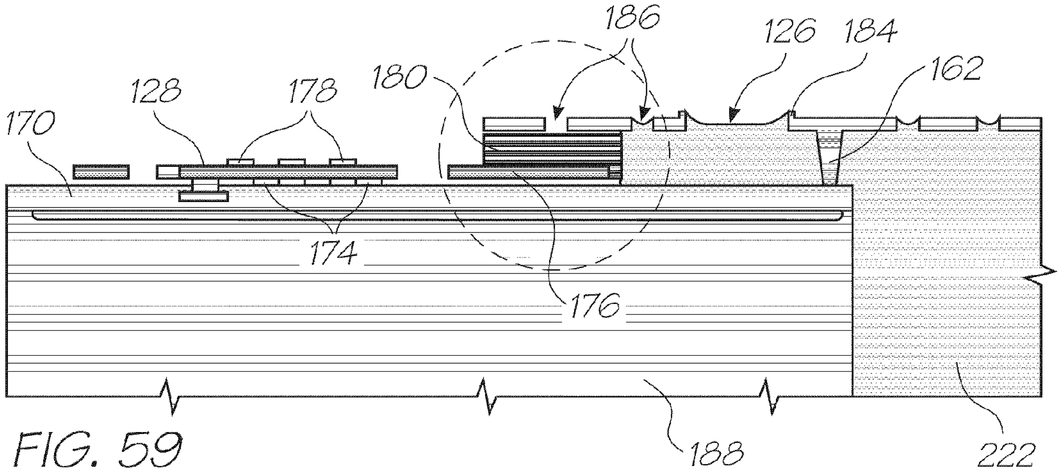
Figure 59A:
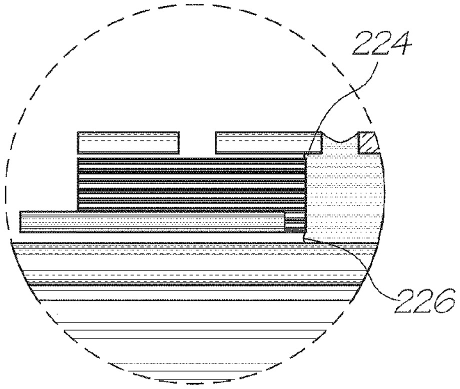

36. Fill the completed printheads with ink 222 and test them. A filled nozzle is shown in FIG. 59.

IJ27 Printhead—U.S. Pat. No. 6,390,603

The following embodiment is referred to by the Applicant as the IJ27 printhead. This printhead is described below with reference to FIGS. 60 to 75, and in U.S. Pat. No. 6,390,603 the contents of which are incorporated by cross reference above. In the description of the IJ27 embodiment, features and elements shown in FIGS. 60 to 75 are indicated by the same reference numerals as those used to indicate the same or closely corresponding features and elements of the embodiments shown in FIGS. 1 to 59.

In the IJ27 embodiment, a "roof shooting" ink jet printhead is constructed utilizing a buckle plate actuator for the ejection of ink. In the preferred embodiment, the buckle plate actuator is constructed from polytetrafluoroethylene (PTFE) which provides superior thermal expansion characteristics. The PTFE is heated by an integral, serpentine shaped heater, which preferably is constructed from a resistive material, such as copper.

Figure 60:
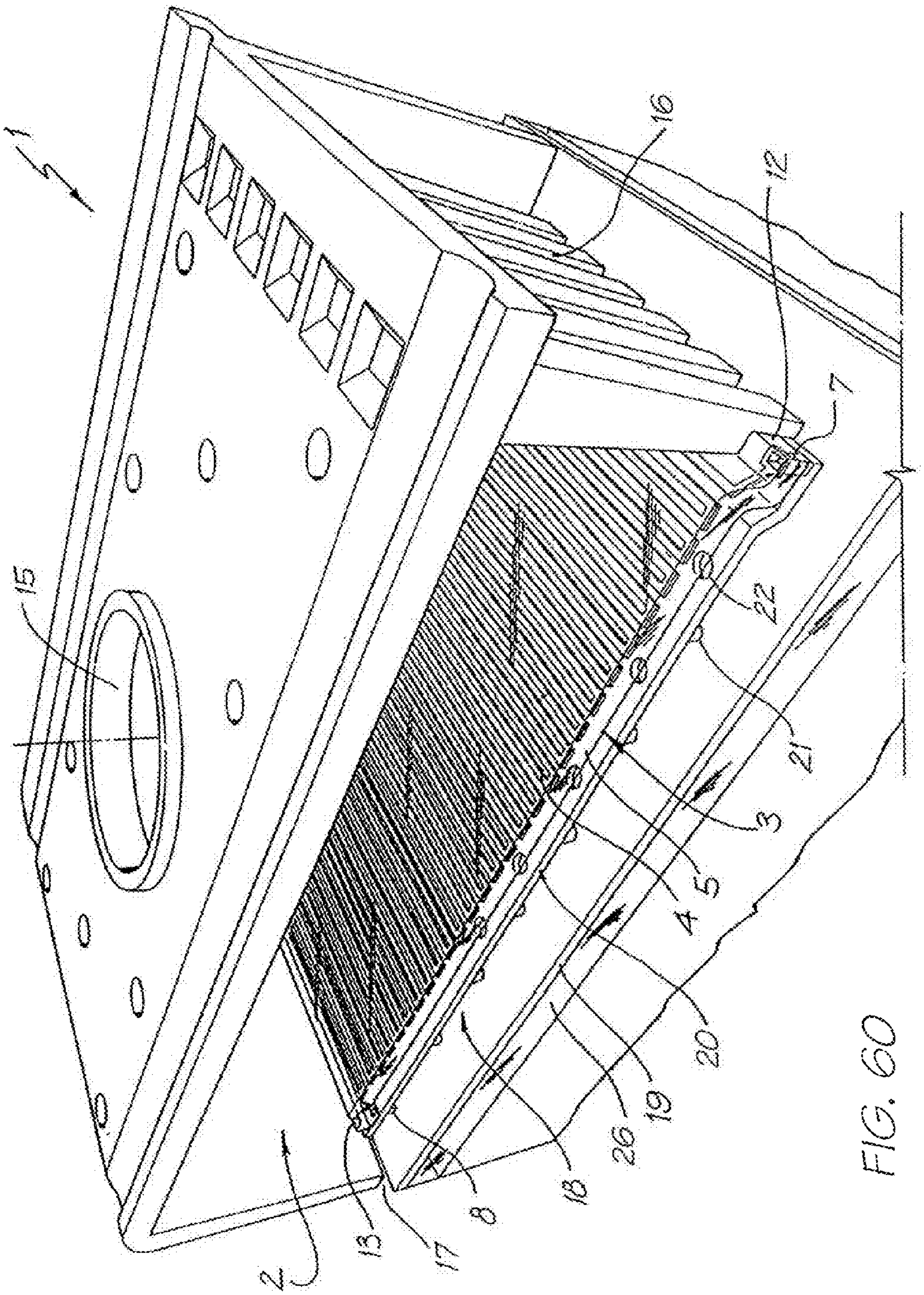
FIG. 60 is a perspective view partly in sections of a single ink jet nozzle constructed in accordance with the preferred embodiment.

Turning now to FIG. 60 there is shown a sectional perspective view of an ink jet printhead 1 of the preferred embodiment. The ink jet printhead includes a nozzle chamber 2 in which ink is stored to be ejected. The chamber 2 can be independently connected to an ink supply (not shown) for the supply and refilling of the chamber. At the base of the chamber 2 is a buckle plate 3 which comprises a heater element 4 which can be of an electrically resistive material such as copper. The heater element 4 is encased in a polytetrafluoroethylene layer 5. The utilization of the PTFE layer 5 allows for high rates of thermal expansion and therefore more effective operation of the buckle plate 3. PTFE has a high coefficient of thermal expansion ($770\times10^{-6}$) with the copper having a much lower degree of thermal expansion. The copper heater element 4 is therefore fabricated in a serpentine pattern so as to allow the expansion of the PTFE layer to proceed unhindered. The serpentine fabrication of the heater element 4 means that the two coefficients of thermal expansion of the PTFE and the heater material need not be closely matched. The PTFE is primarily chosen for its high thermal expansion properties.

Current can be supplied to the buckle plate 3 by means of connectors 7, 8 which inter-connect the buckle plate 3 with a lower drive circuitry and logic layer 26. Hence, to operate the ink jet head 1, the heater coil 4 is energized thereby heating the PTFE 5. The PTFE 5 expands and buckles between end portions 12, 13. The buckle causes initial ejection of ink out of a nozzle 15 located at the top of the nozzle chamber 2. There is an air bubble between the buckle plate 3 and the adjacent wall of the chamber which forms due to the hydrophobic nature of the PTFE on the back surface of the buckle plate 3. An air vent 17 connects the air bubble to the ambient air through a channel 18 formed between a nitride layer 19 and an additional PTFE layer 20, separated by posts, e.g. 21, and through holes, e.g. 22, in the PTFE layer 20. The air vent 17 allows the buckle plate 3 to move without being held back by a reduction in air pressure as the buckle plate 3 expands. Subsequently, power is turned off to the buckle plate 3 resulting in a collapse of the buckle plate and the sucking back of some of the ejected ink. The forward motion of the ejected ink and the sucking back is resolved by an ink drop breaking off from the main volume of ink and continuing onto a page. Ink refill is then achieved by surface tension effects across the nozzle part 15 and a resultant inflow of ink into the nozzle chamber 2 through the grilled supply channel 16.

Subsequently the nozzle chamber 2 is ready for refiring.

It has been found in simulations of the preferred embodiment that the utilization of the PTFE layer and serpentine heater arrangement allows for a substantial reduction in energy requirements of operation in addition to a more compact design.

Figure 61:
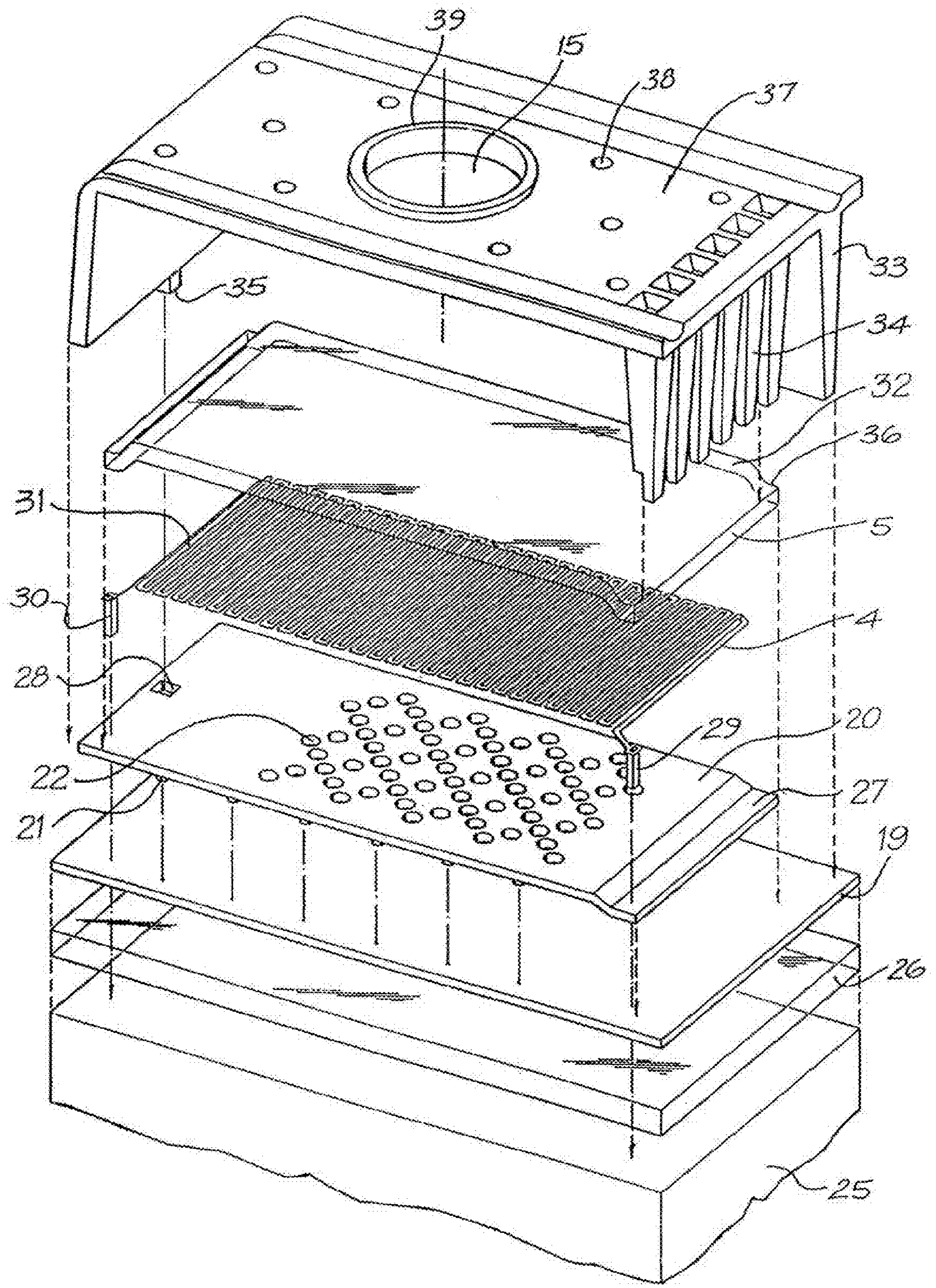
FIG. 61 is an exploded perspective view partly in section illustrating the construction of a single ink nozzle in accordance with the preferred embodiment of the present invention.

Turning now to FIG. 61, there is provided an exploded perspective view partly in section illustrating the construction of a single ink jet nozzle in accordance with the preferred embodiment. The nozzle arrangement 1 is fabricated on top of a silicon wafer 25. The nozzle arrangement 1 can be constructed on the silicon wafer 25 utilizing standard semi-conductor processing techniques in addition to those techniques commonly used for the construction of micro-electro-mechanical systems (MEMS). For a general introduction to a micro-electro mechanical system (MEMS) reference is made to standard proceedings in this field including the proceedings of the SPIE (International Society for Optical Engineering), volumes 2642 and 2882 which contain the proceedings for recent advances and conferences in this field.

On top of the silicon layer 25 is deposited a two level CMOS circuitry layer 26 which substantially comprises glass, in addition to the usual metal layers. Next a nitride layer 19 is deposited to protect and passivate the underlying layer 26. The nitride layer 19 also includes vias for the interconnection of the heater element 4 to the CMOS layer 26. Next, a PTFE layer 20 is constructed having the aforementioned holes, e.g. 22, and posts, e.g. 21. The structure of the PTFE layer 20 can be formed by first laying down a sacrificial glass layer (not shown) onto which the PTFE layer 20 is deposited. The PTFE layer 20 includes various features, for example, a lower ridge portion 27 in addition to a hole 28 which acts as a via for the subsequent material layers. The buckle plate 3 (FIG. 60) comprises a conductive layer 31 and a PTFE layer 32. A first, thicker PTFE layer is deposited onto a sacrificial layer (not shown). Next, a conductive layer 31 is deposited including contacts 29, 30. The conductive layer 31 is then etched to form a serpentine pattern. Next, a thinner, second PTFE layer is deposited to complete the buckle plate 3 (FIG. 60) structure.

Finally, a nitride layer can be deposited to form the nozzle chamber proper. The nitride layer can be formed by first laying down a sacrificial glass layer and etching this to form walls, e.g. 33, and grilled portions, e.g. 34. Preferably, the mask utilized results in a first anchor portion 35 which mates with the hole 28 in layer 20. Additionally, the bottom surface of the grill, for example 34 meets with a corresponding step 36 in the PTFE layer 32. Next, a top nitride layer 37 can be formed having a number of holes, e.g. 38, and nozzle port 15 around which a rim 39 can be etched through etching of the nitride layer 37. Subsequently the various sacrificial layers can be etched away so as to release the structure of the thermal actuator and the air vent channel 18 (FIG. 60).

Figure 62:
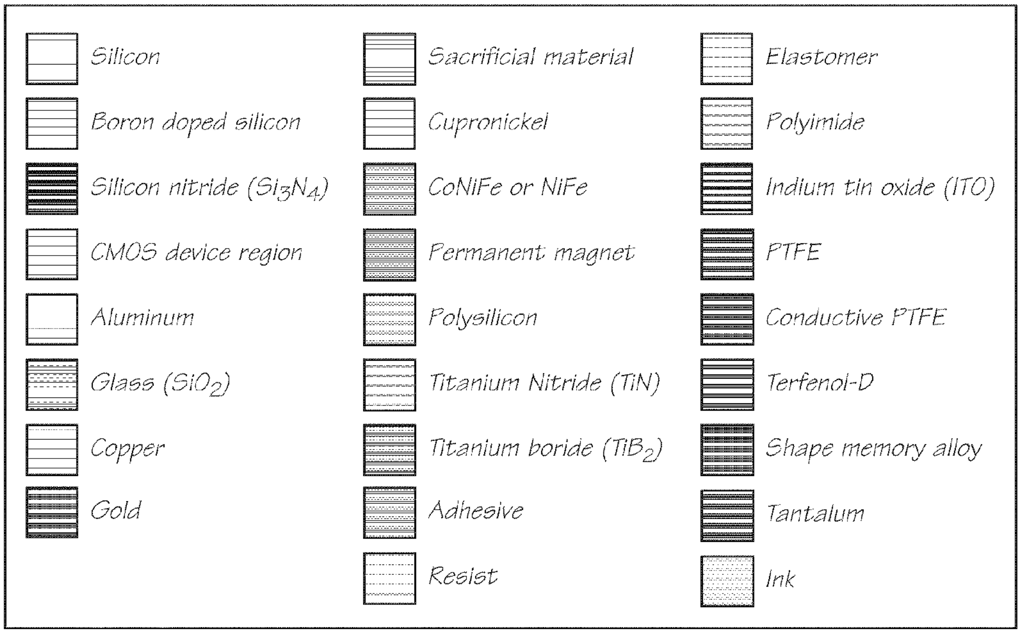
FIG. 62 provides a legend of the materials indicated in FIG. 63 to 75; and, FIGS. 63 to 75 illustrate sectional views of the manufacturing steps in one form of construction of an ink jet printhead nozzle.
Figure 63:
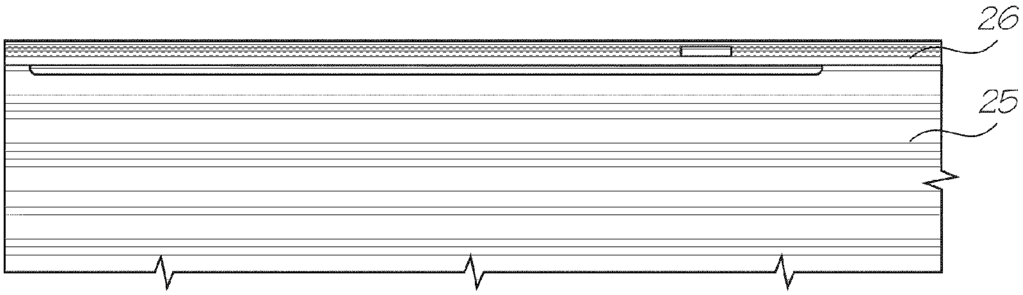

One form of detailed manufacturing process which can be used to fabricate monolithic ink jet print heads operating in accordance with the principles taught by the present embodiment can proceed utilizing the following steps:

1. Using a double sided polished wafer 25, complete drive transistors, data distribution, and timing circuits 26 using a 0.5 micron, one poly, 2 metal CMOS process. Relevant features of the wafer 25 at this step are shown in FIG. 63. For clarity, these diagrams may not be to scale, and may not represent a cross section though any single plane of the nozzle. FIG. 62 is a key to representations of various materials in these manufacturing diagrams, and those of other cross referenced ink jet configurations.

2. Deposit 1 micron of low stress nitride 19. This acts as a barrier to prevent ink diffusion through the silicon dioxide of the chip surface.

3. Deposit 2 microns of sacrificial material 50 (e.g. polyimide).

Figure 64:
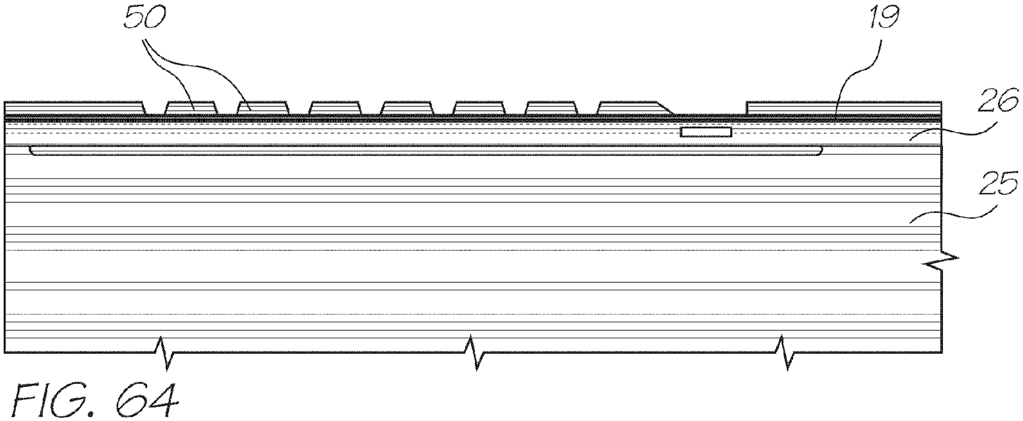

4. Etch the sacrificial layer 50 using Mask 1. This mask defines the PTFE venting layer support pillars 21 and anchor point. This step is shown in FIG. 64.

5. Deposit 2 microns of PTFE 20.

Figure 65:
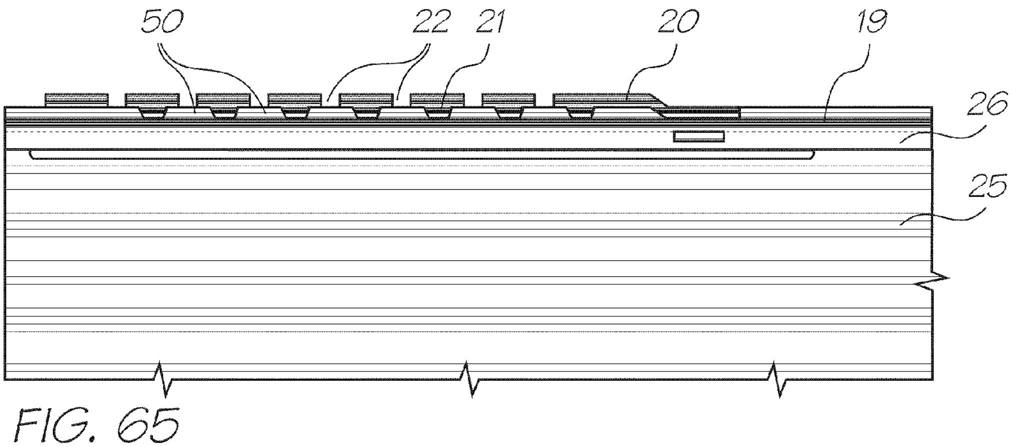

6. Etch the PTFE 20 using Mask 2. This mask defines the edges of the PTFE venting layer 20, and the holes 22 in this layer 20. This step is shown in FIG. 65.

7. Deposit 3 microns of sacrificial material 51.

Figure 66:
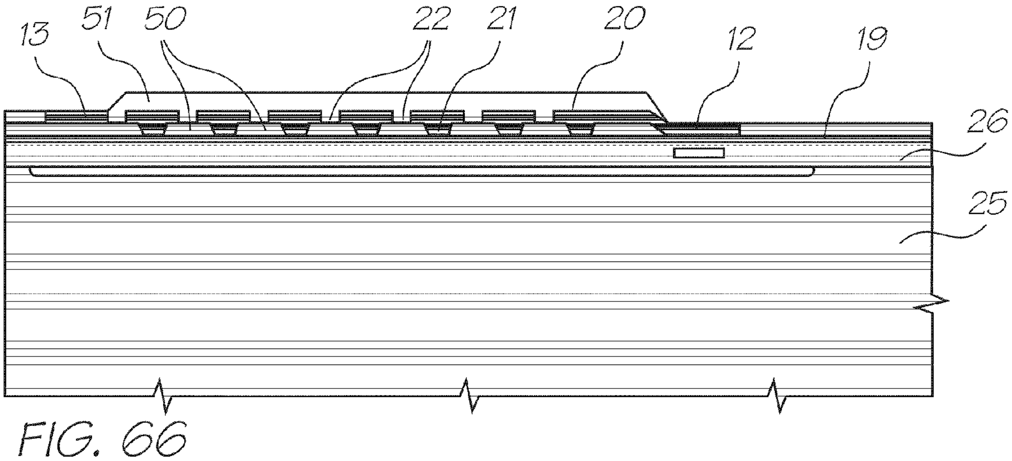

8. Etch the sacrificial layer 51 using Mask 3. This mask defines the anchor points 12, 13 at both ends of the buckle actuator. This step is shown in FIG. 66.

9. Deposit 1.5 microns of PTFE 31.

10. Deposit and pattern resist using Mask 4. This mask defines the heater 11.

Figure 67:
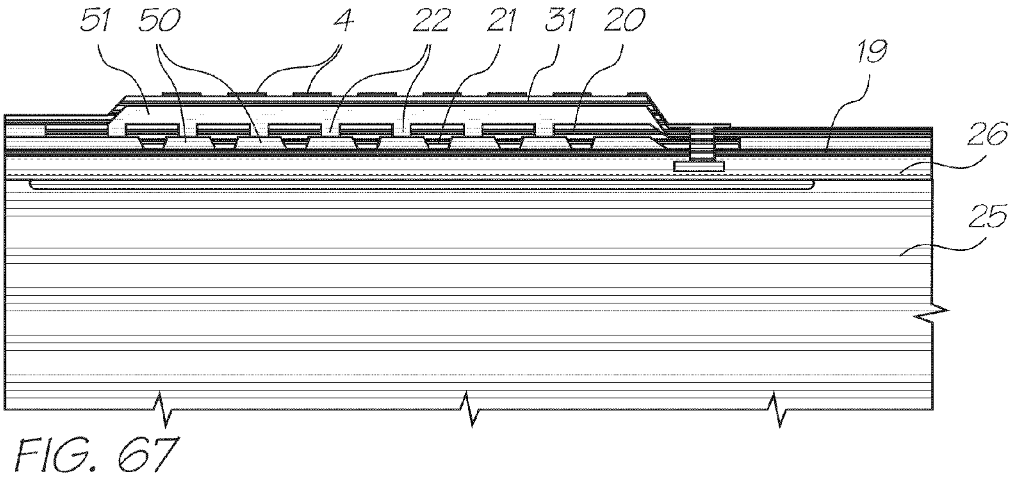

11. Deposit 0.5 microns of gold (or other heater material with a low Young's modulus) and strip the resist. Steps 10 and 11 form a lift-off process. This step is shown in FIG. 67.

12. Deposit 0.5 microns of PTFE 32.

Figure 68:
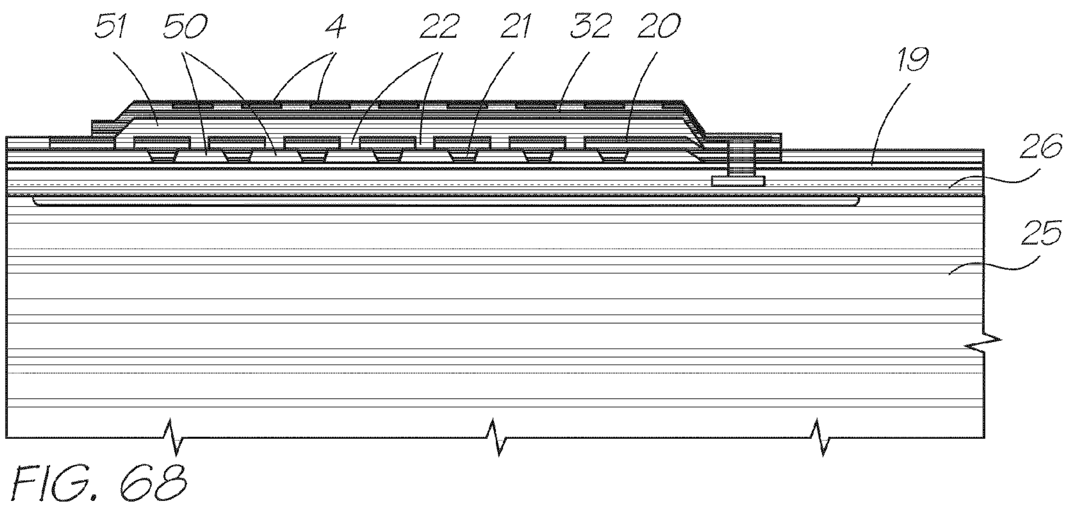

13. Etch the PTFE 32 down to the sacrificial layer 51 using Mask 5. This mask defines the actuator paddle 3 and the bond pads. This step is shown in FIG. 68.

14. Wafer probe. All electrical connections are complete at this point, and the chips are not yet separated.

15. Plasma process the PTFE to make the top and side surfaces of the buckle actuator hydrophilic. This allows the nozzle chamber 2 to fill by capillarity.

16. Deposit 10 microns of sacrificial material 52.

Figure 69:
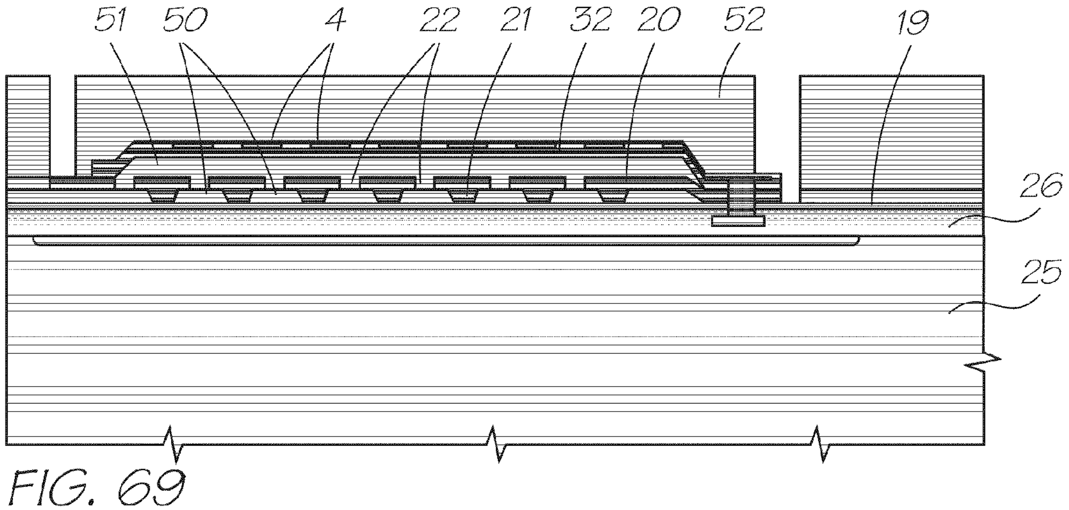

17. Etch the sacrificial material 52 down to nitride 19 using Mask 6. This mask defines the nozzle chamber 2. This step is shown in FIG. 69.

Figure 70:
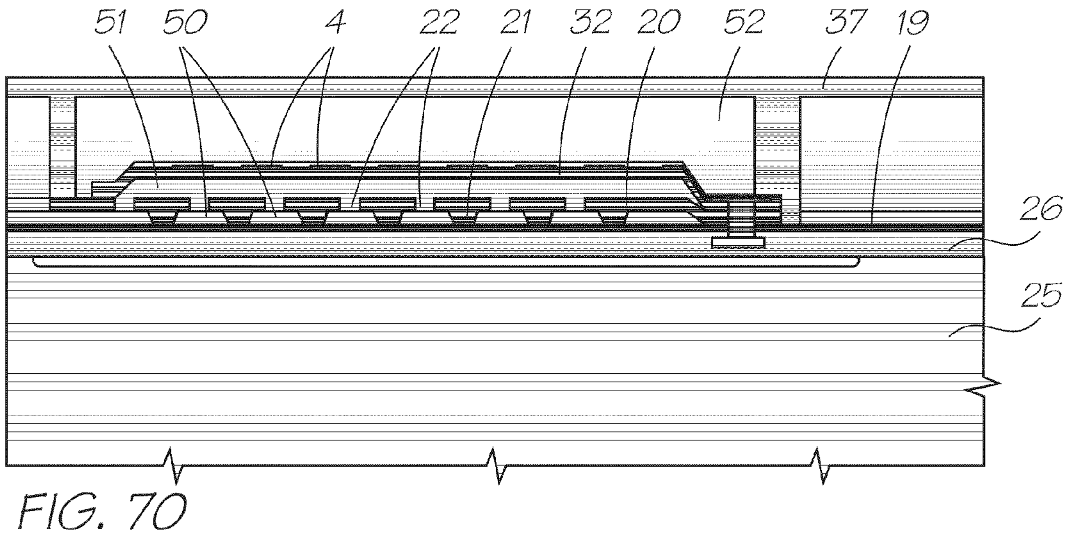

18. Deposit 3 microns of PECVD glass 37. This step is shown in FIG. 70.

Figure 71:
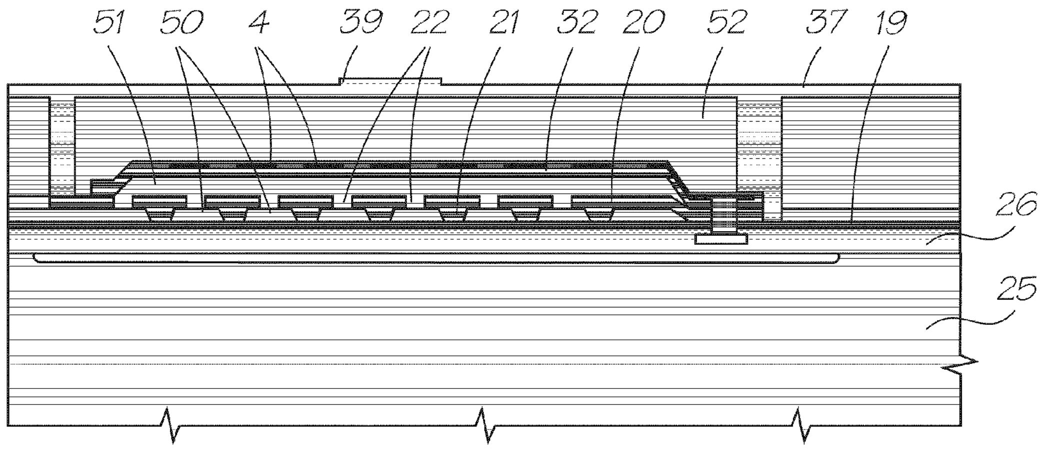

19. Etch to a depth of 1 micron using Mask 7. This mask defines the nozzle rim 39. This step is shown in FIG. 71.

Figure 72:
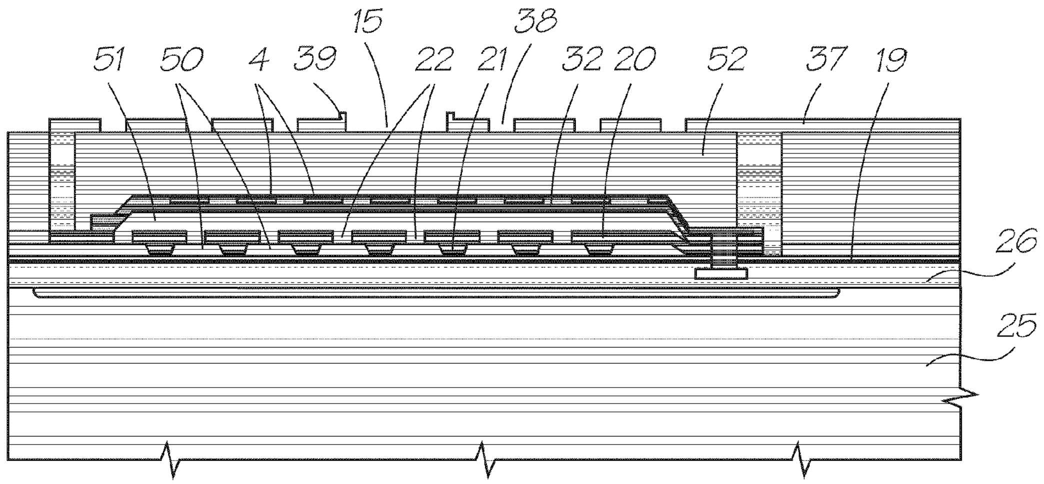

20. Etch down to the sacrificial layer 52 using Mask 8. This mask defines the nozzle 15 and the sacrificial etch access holes 38. This step is shown in FIG. 72.

Figure 73:
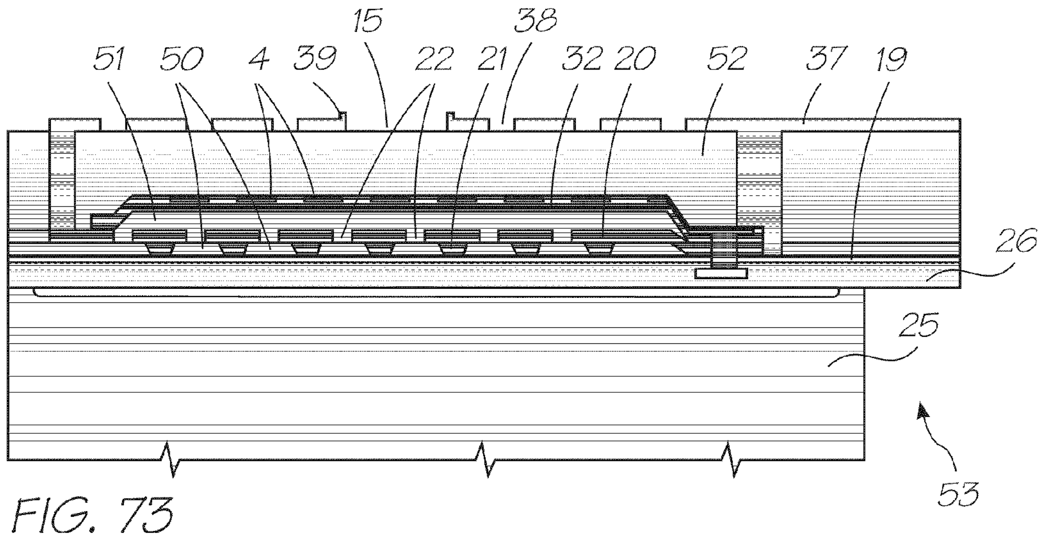

21. Back-etch completely through the silicon wafer 25 (with, for example, an ASE Advanced Silicon Etcher from Surface Technology Systems) using Mask 9. This mask defines the ink inlets which are etched through the wafer 25. The wafer 25 is also diced by this etch. This step is shown in FIG. 73.

22. Back-etch the CMOS oxide layers 26 and subsequently deposited nitride layers 19 and sacrificial layer 50 and 51 through to PTFE 20 and 32 using the back-etched silicon as a mask.

Figure 74:
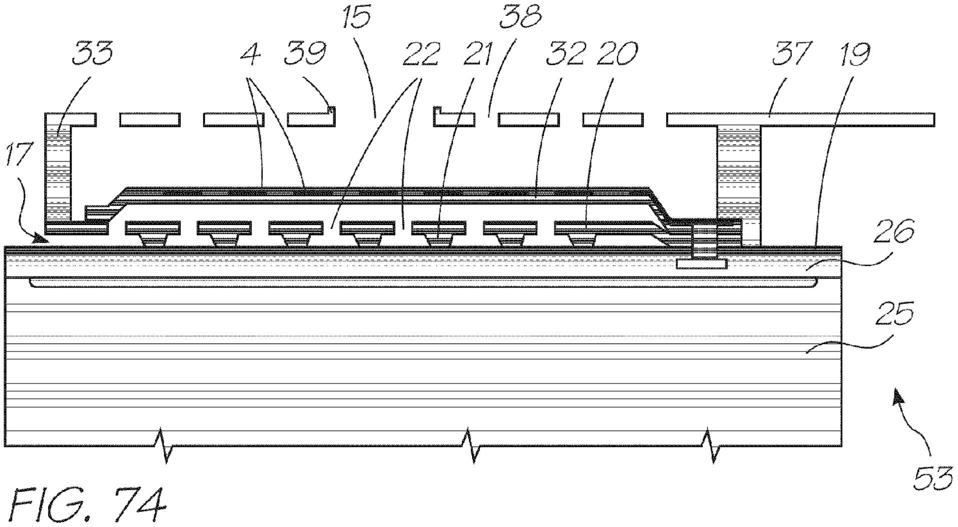

23. Etch the sacrificial material 52. The nozzle chambers are cleared, the actuators freed, and the chips are separated by this etch. This step is shown in FIG. 74.

24. Mount the printheads in their packaging, which may be a molded plastic former incorporating ink channels which supply the appropriate color ink to the ink inlets at the back of the wafer.

25. Connect the printheads to their interconnect systems. For a low profile connection with minimum disruption of airflow, TAB may be used. Wire bonding may also be used if the printer is to be operated with sufficient clearance to the paper.

26. Hydrophobize the front surface of the printheads.

Figure 75:
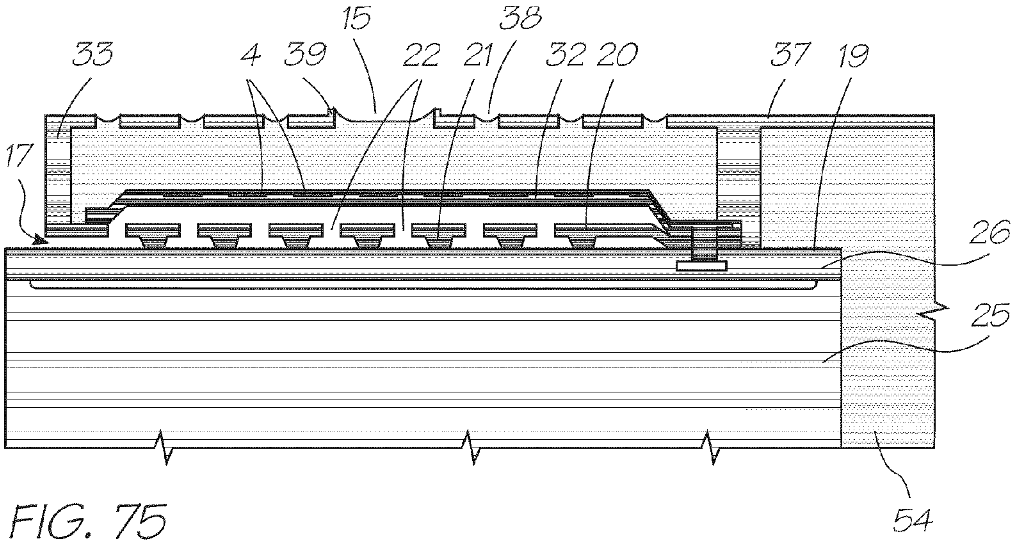
Figure 4:
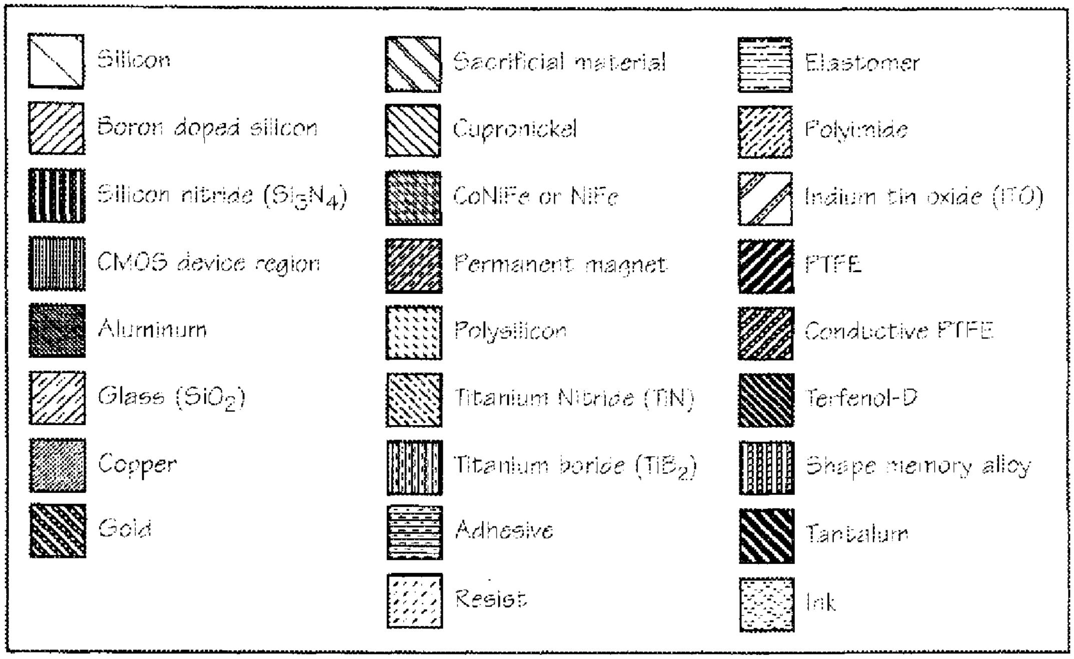
Figure 5:
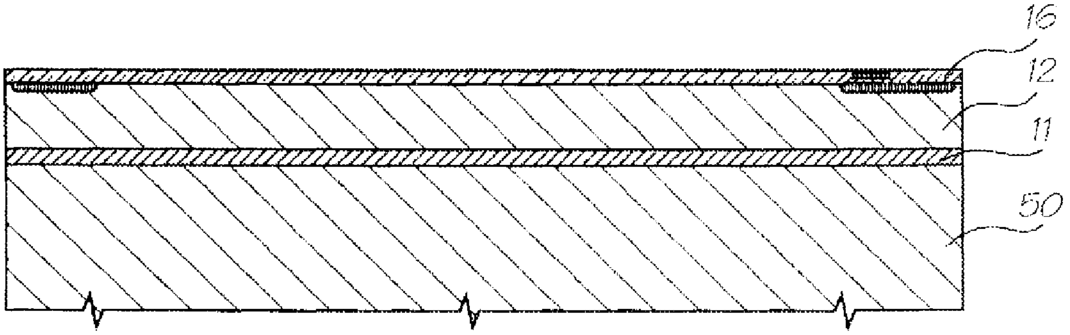
Figure 6:
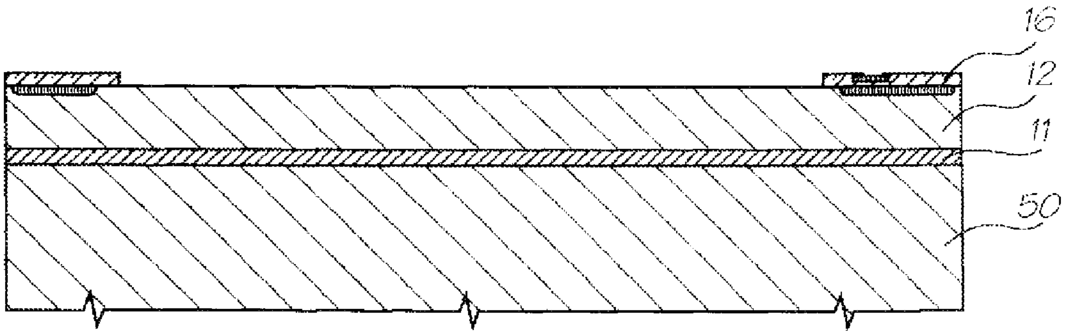
Figure 7:
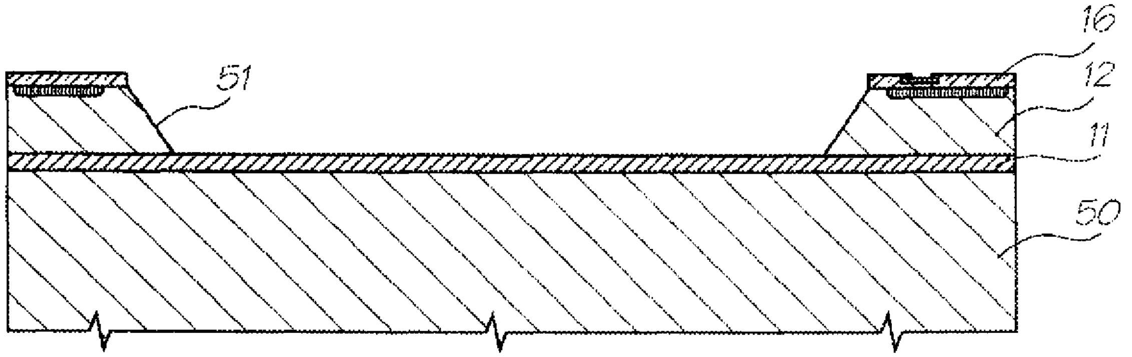
Figure 8:
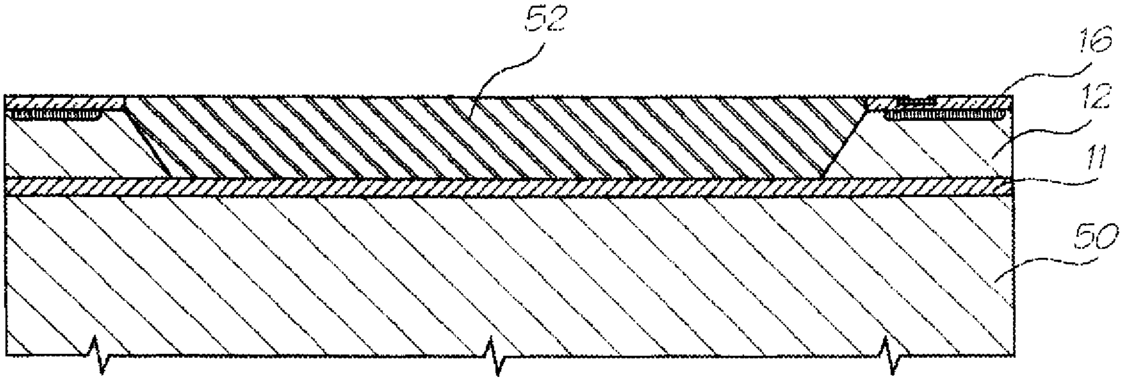
Figure 9:
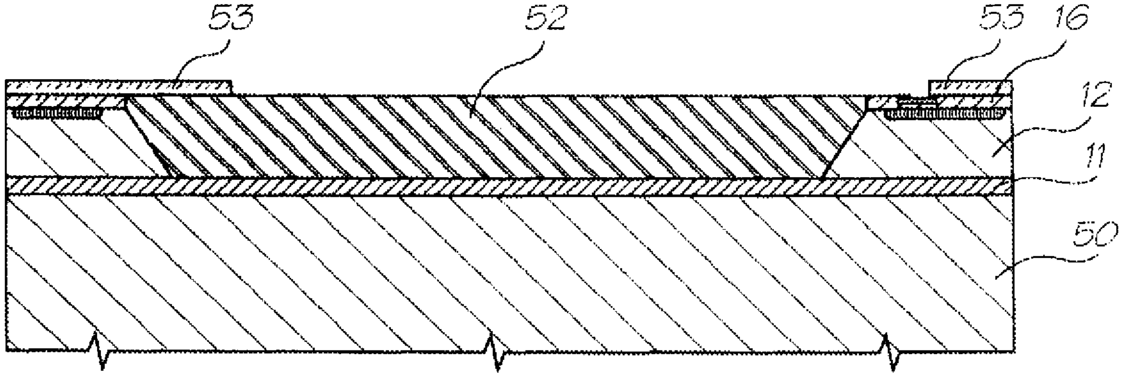
Figure 10:
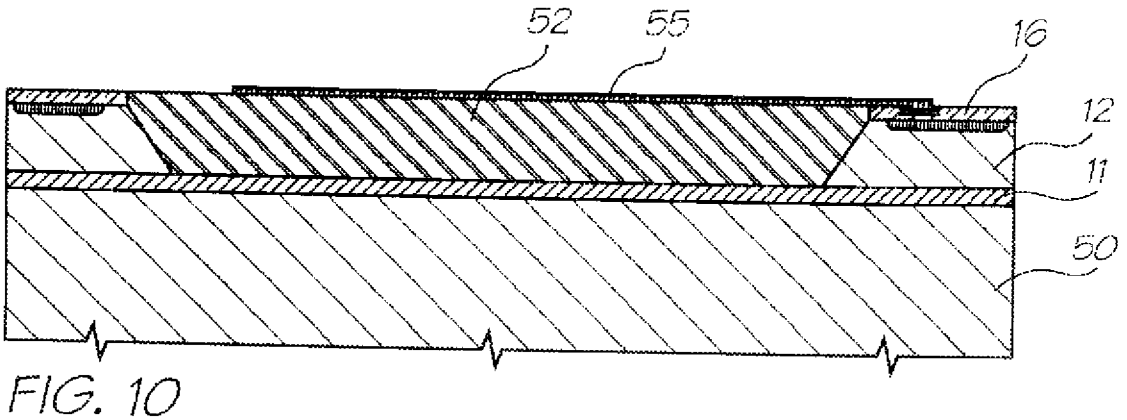
Figure 11:
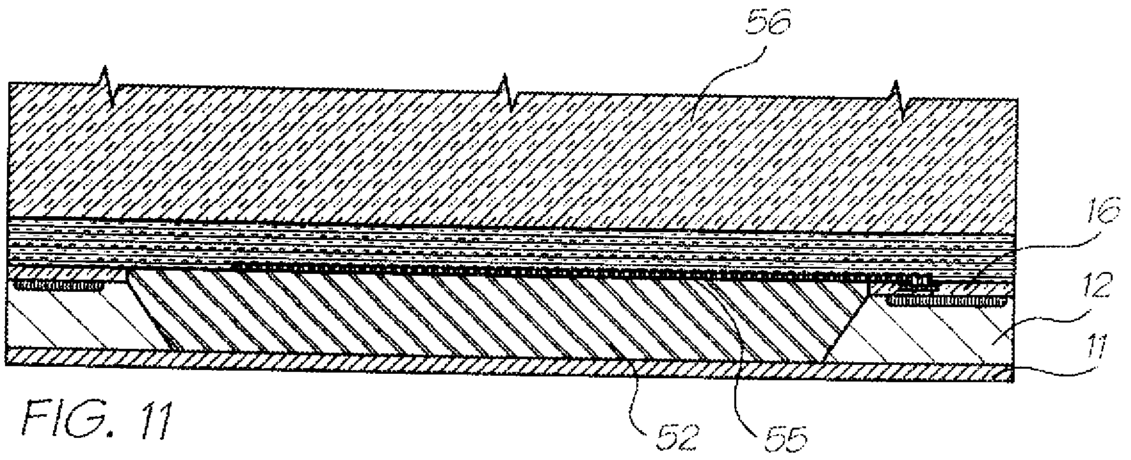
Figure 12:
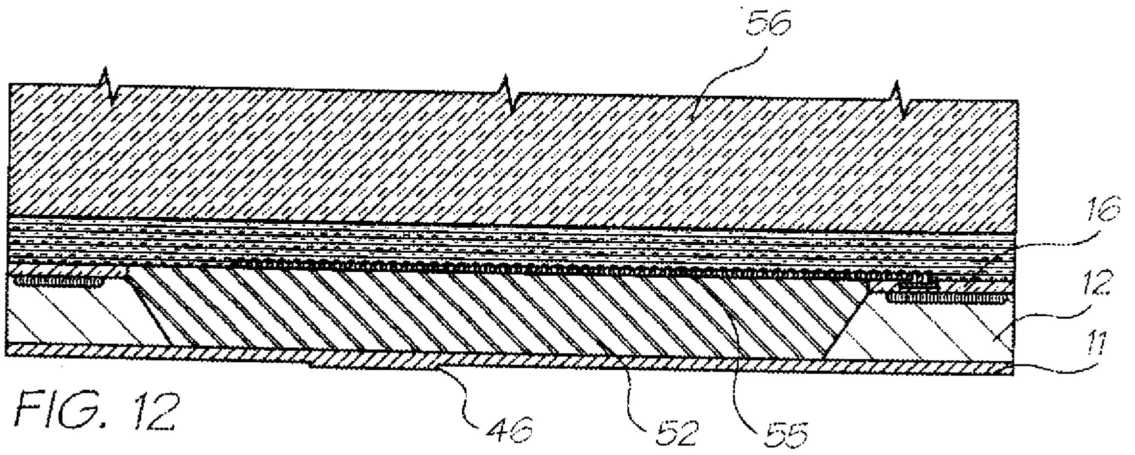
Figure 13:
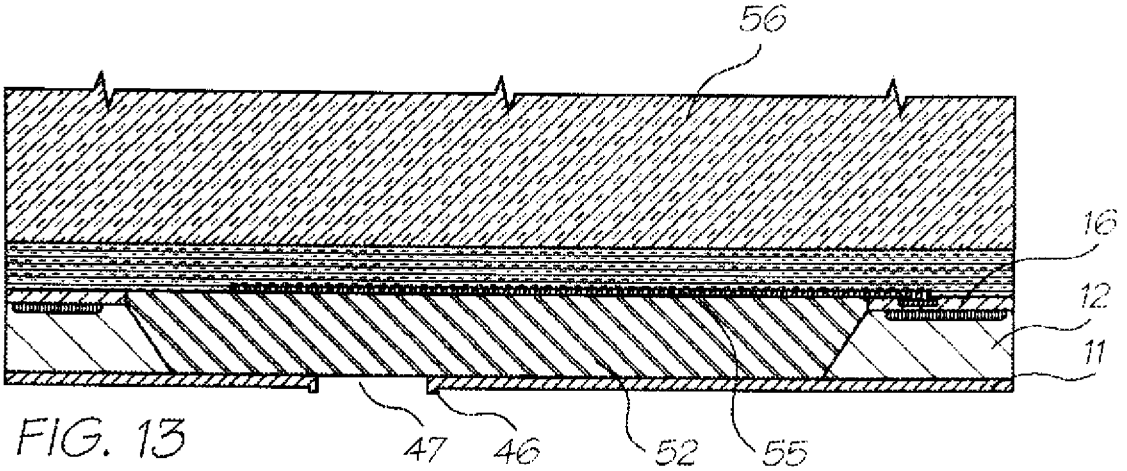
Figure 14:
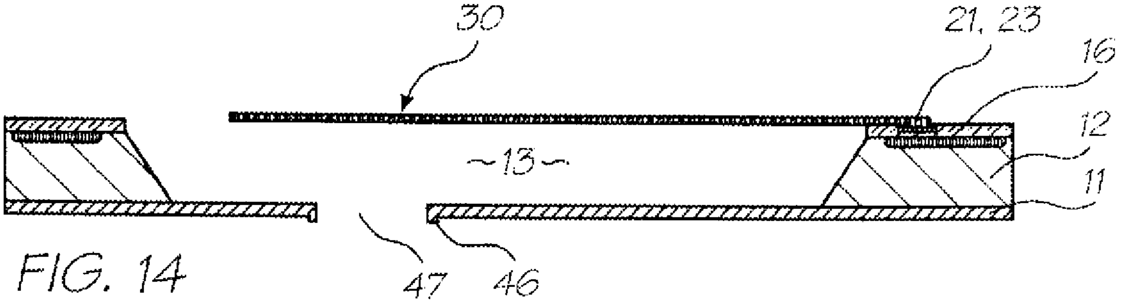
Figure 15:
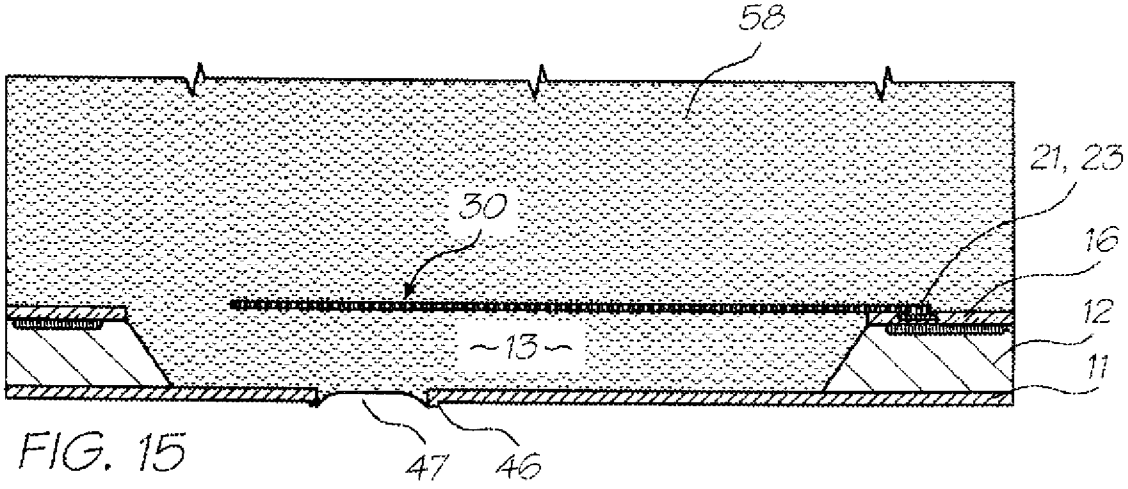
Figure 18:
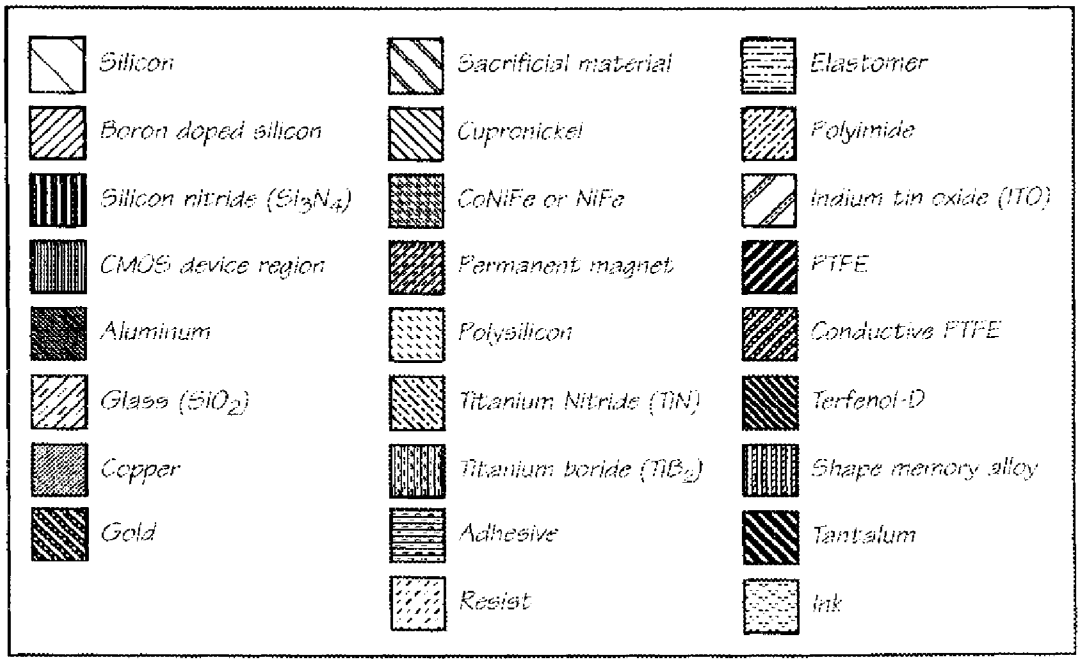
Figure 19:
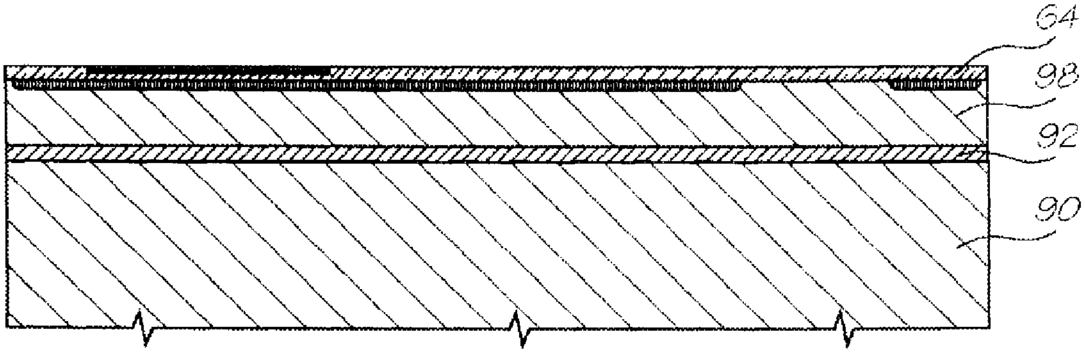
Figure 20:
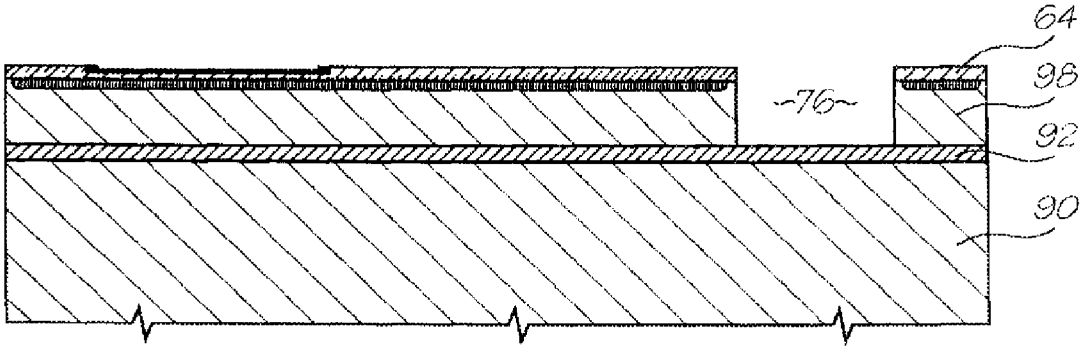
Figure 21:
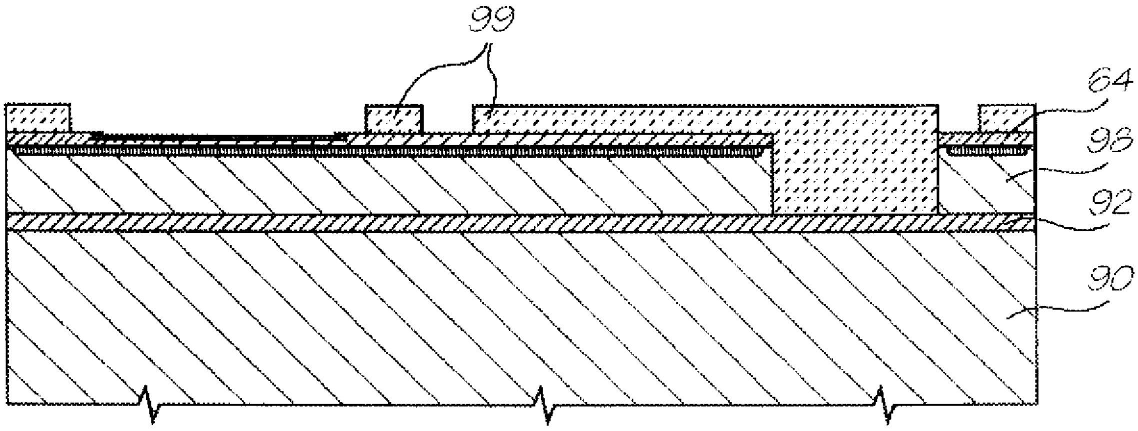
Figure 22:
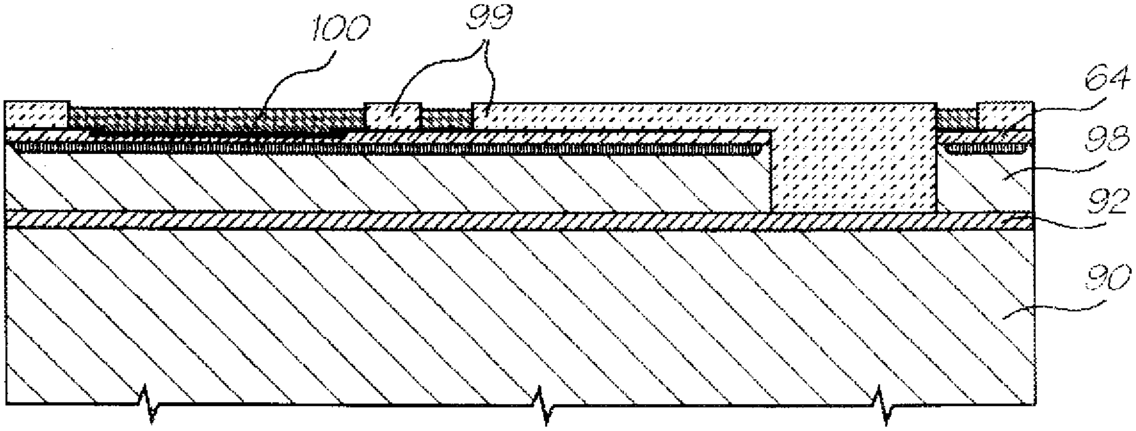
Figure 23:
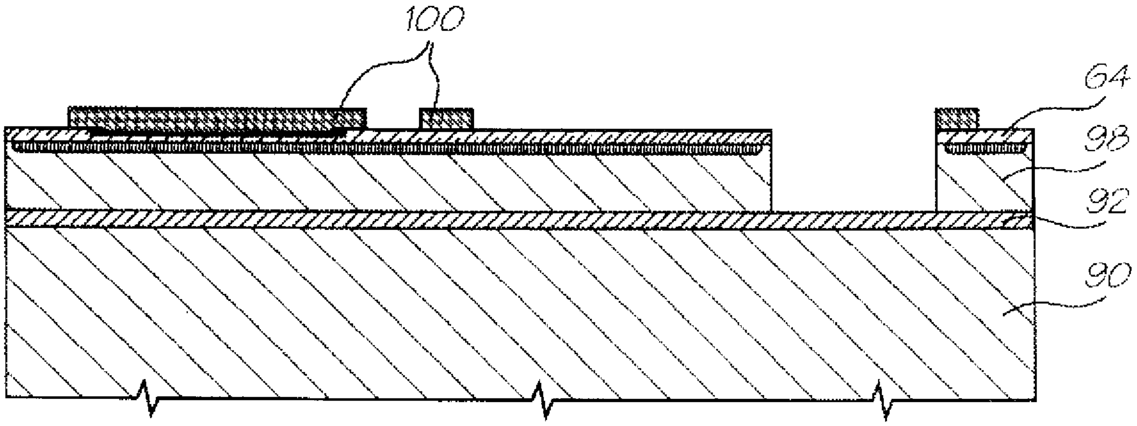
Figure 24:
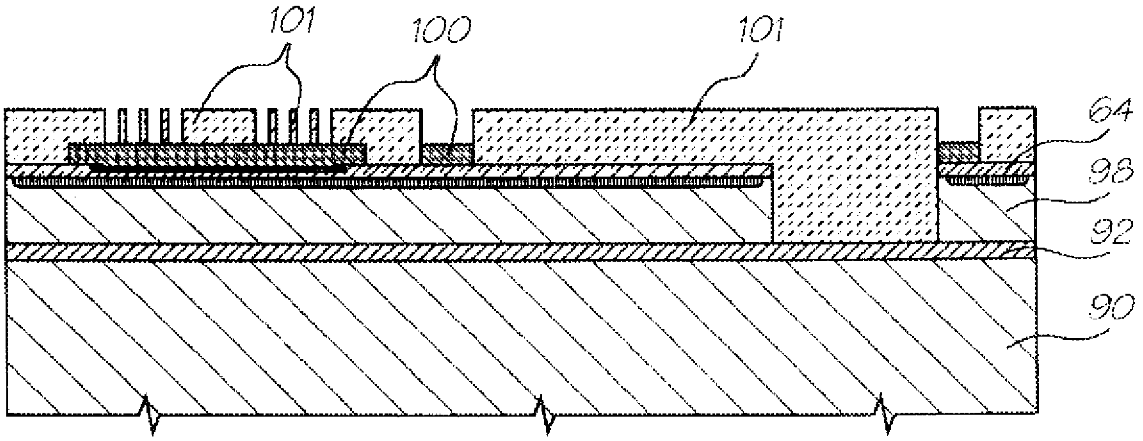
Figure 25:
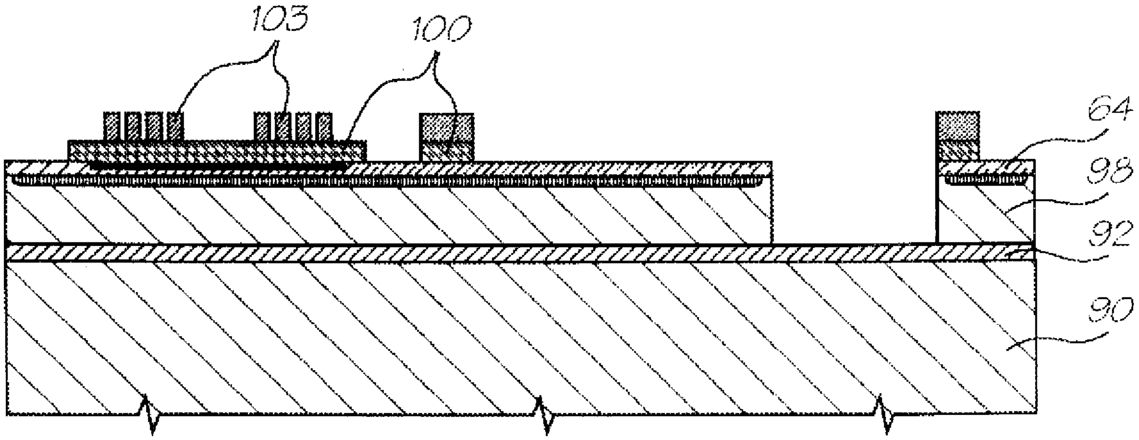
Figure 26:
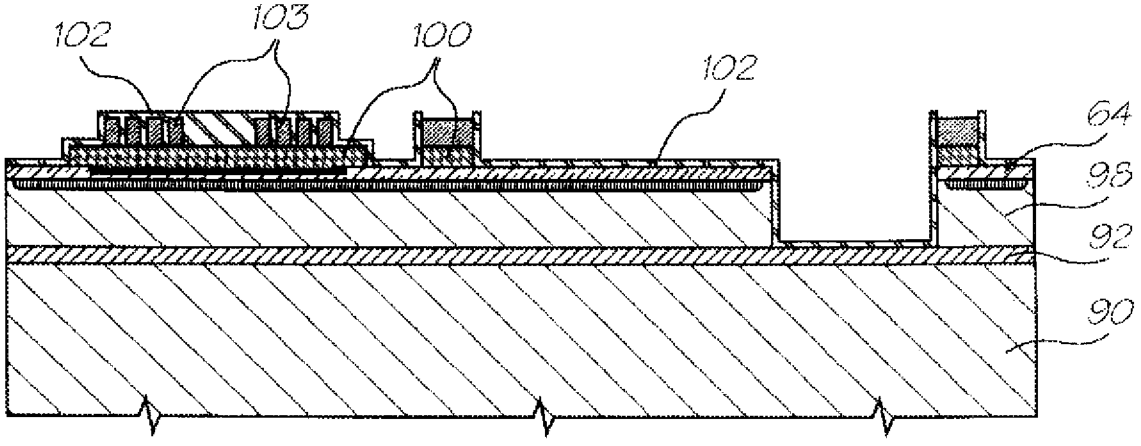
Figure 27:
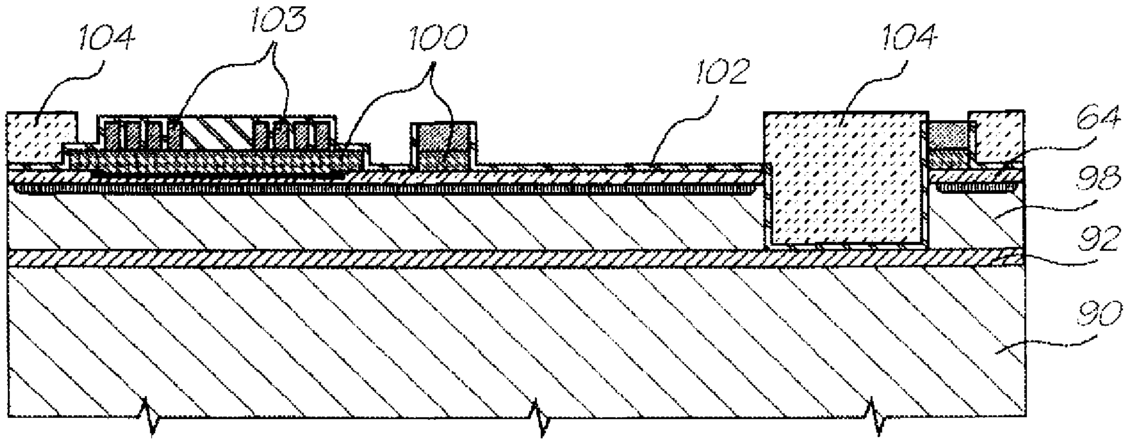
Figure 28:
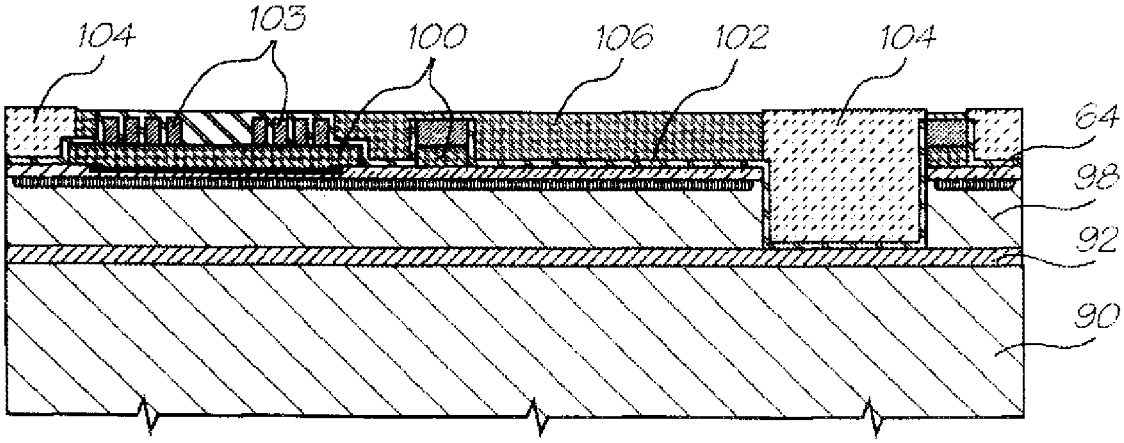
Figure 29:
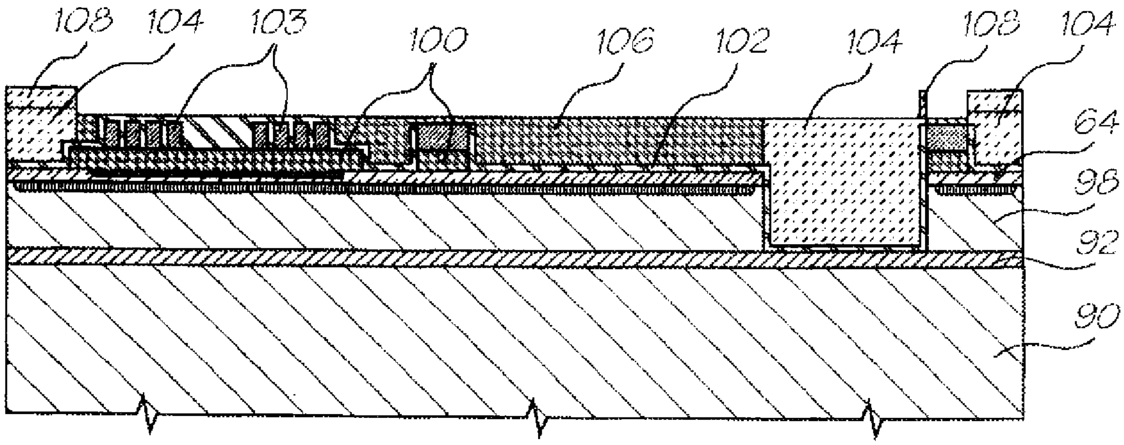
Figure 30:
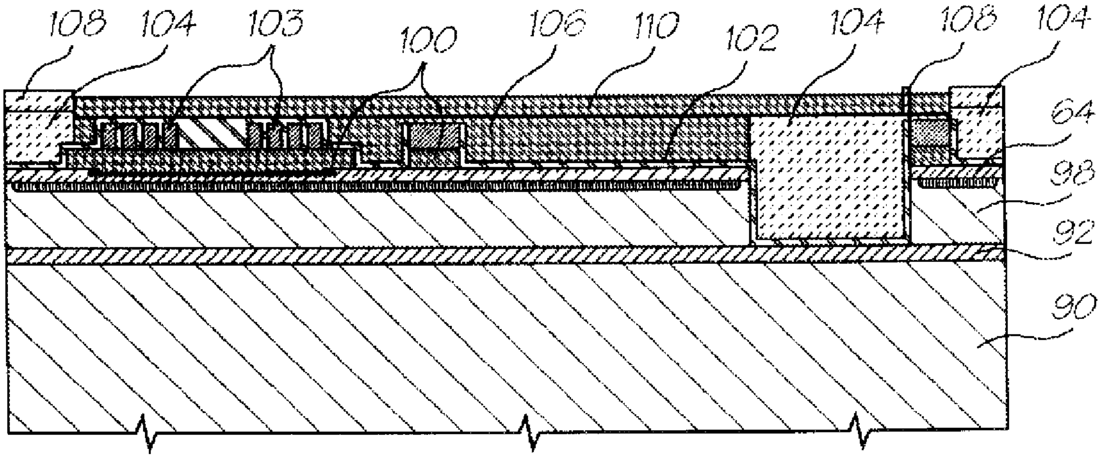
Figure 31:
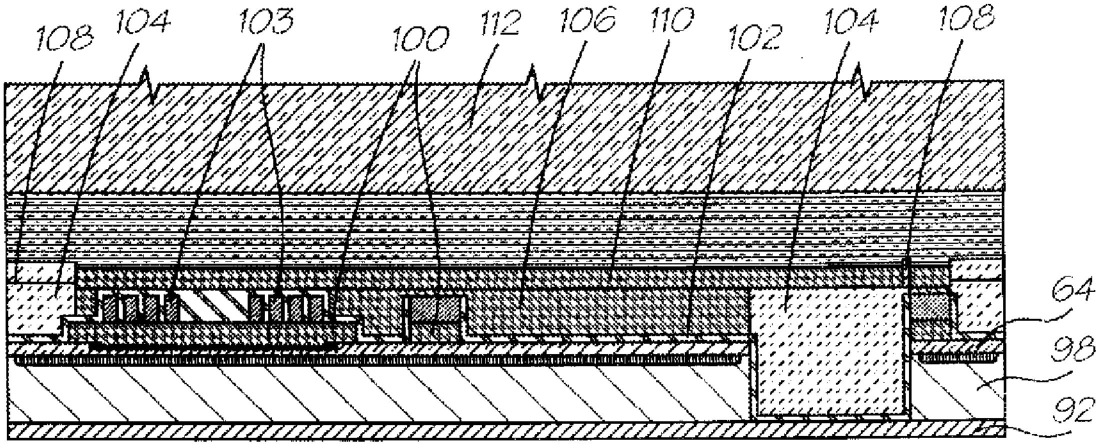
Figure 32:
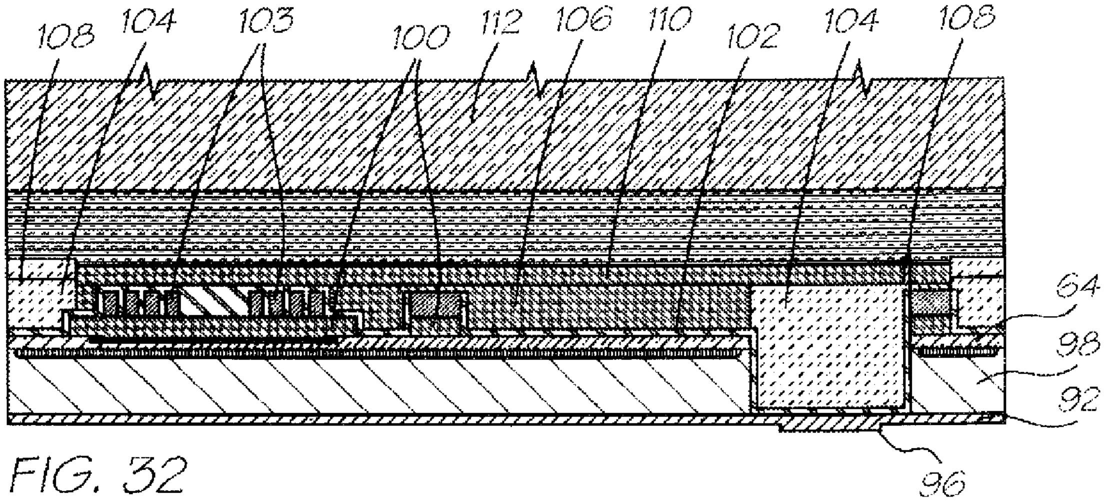
Figure 33:
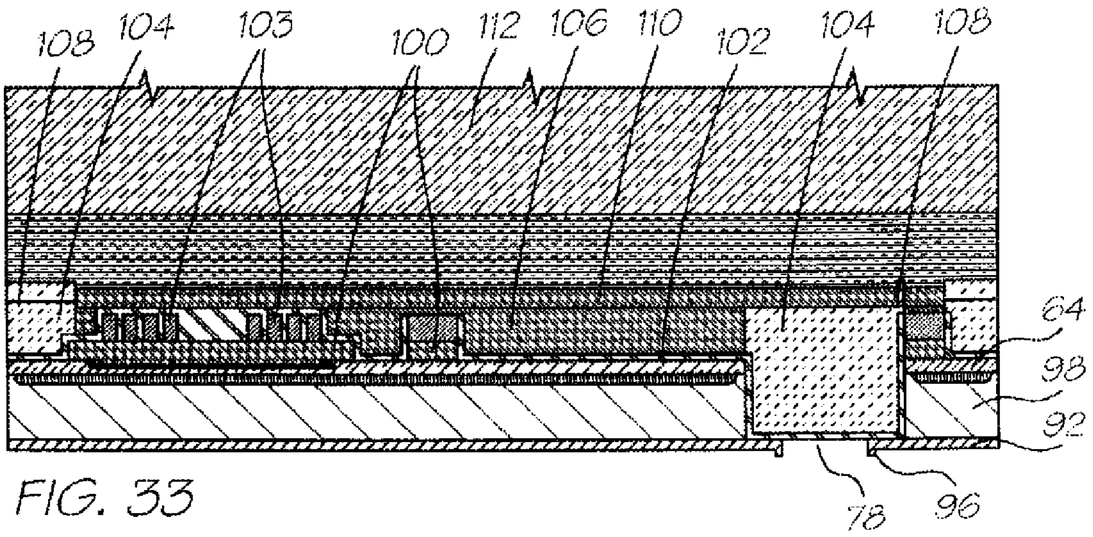
Figure 34:
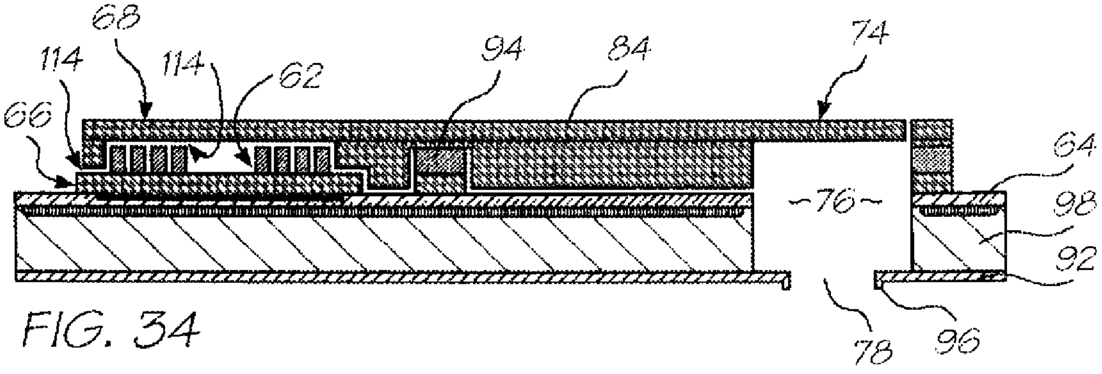
Figure 35:
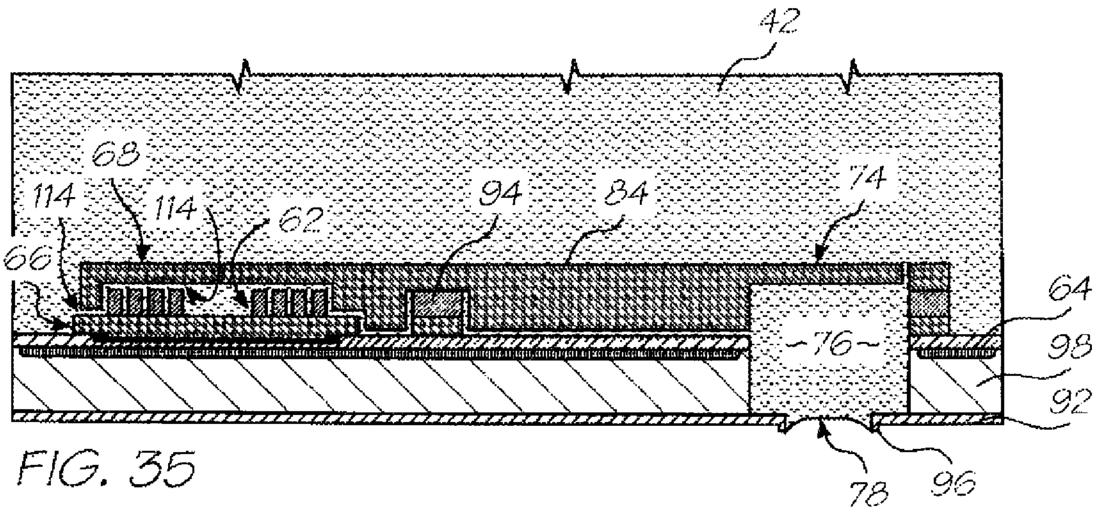
Figure 38:
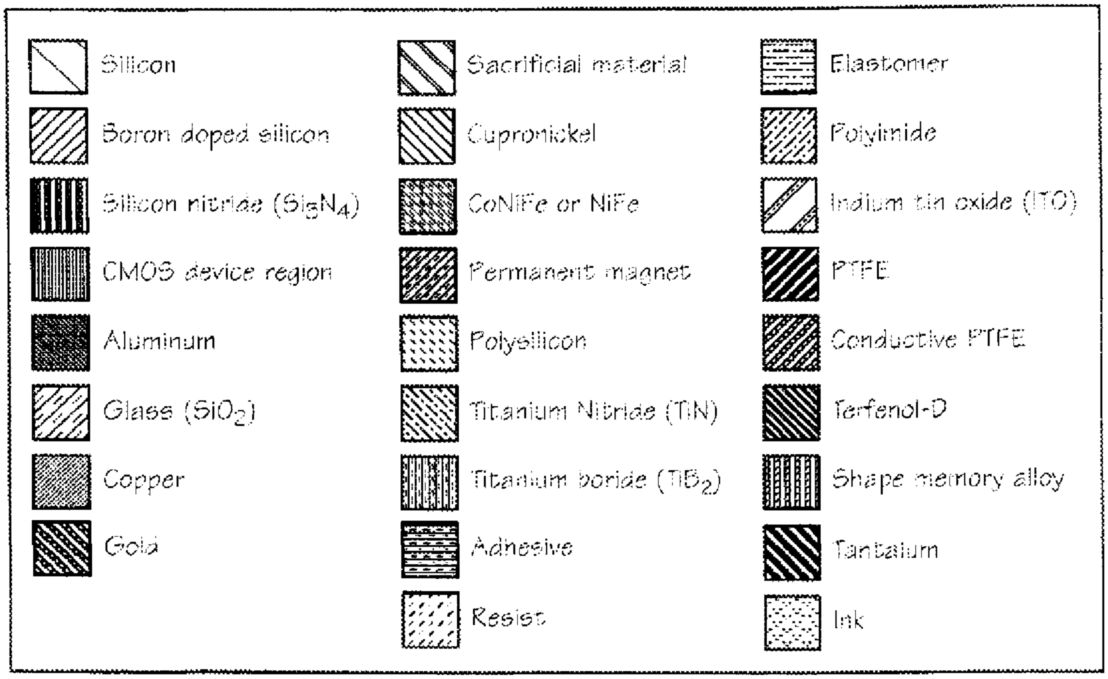
Figure 39:
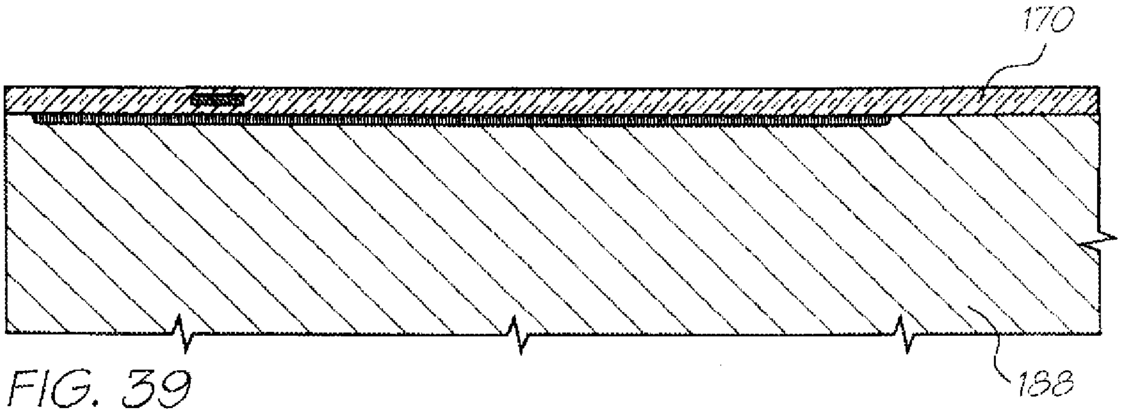
Figure 40:
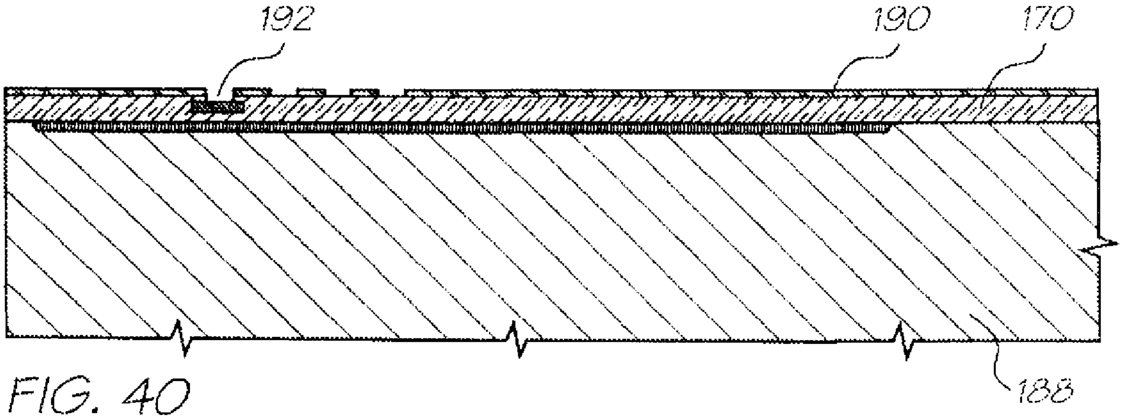
Figure 41:
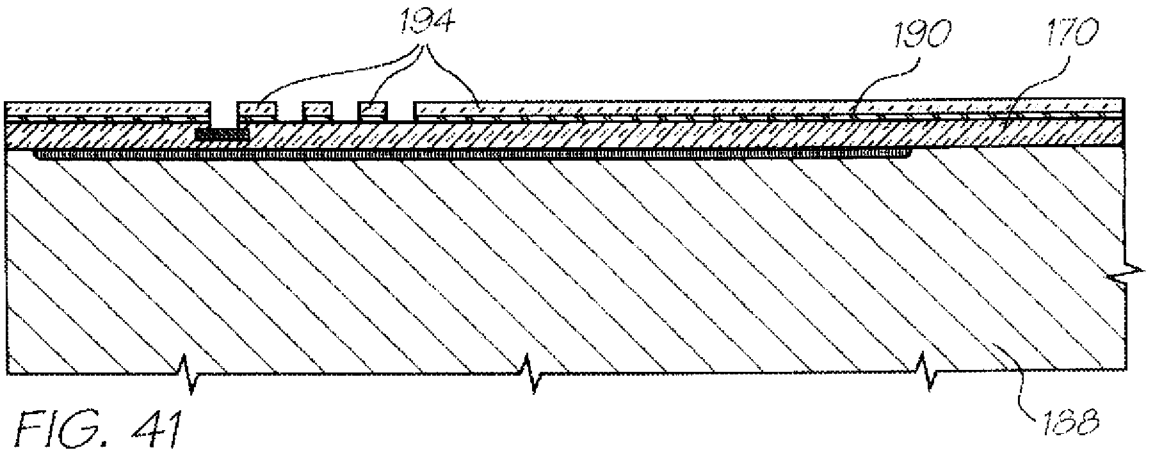
Figure 42:
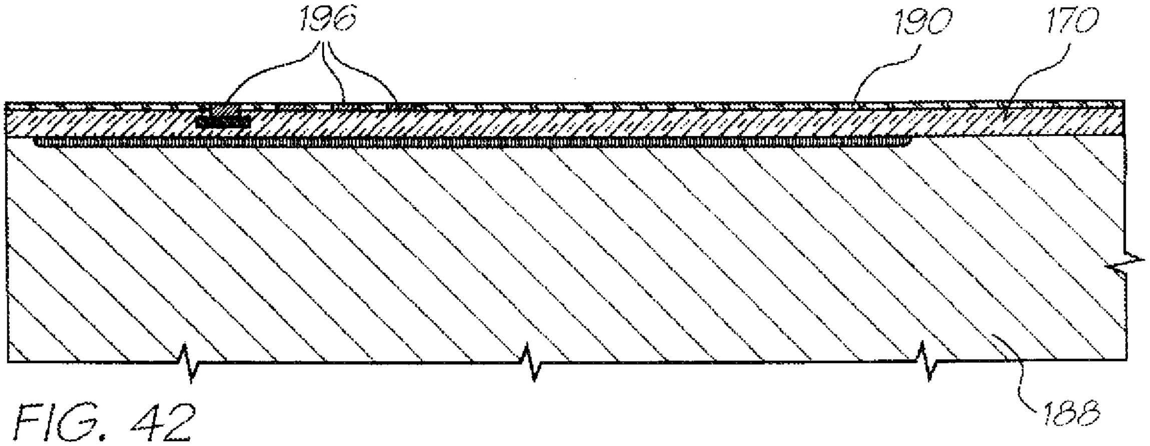
Figure 43:
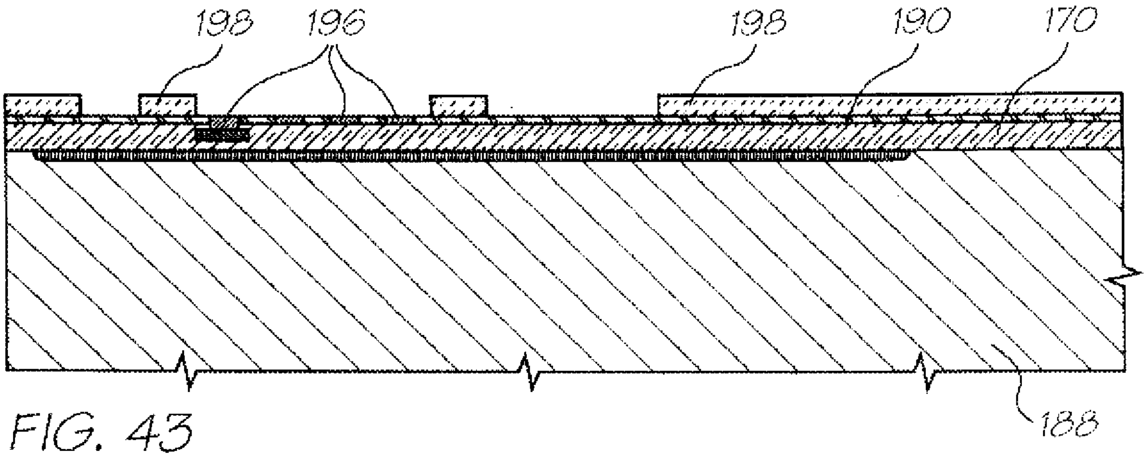
Figure 44:
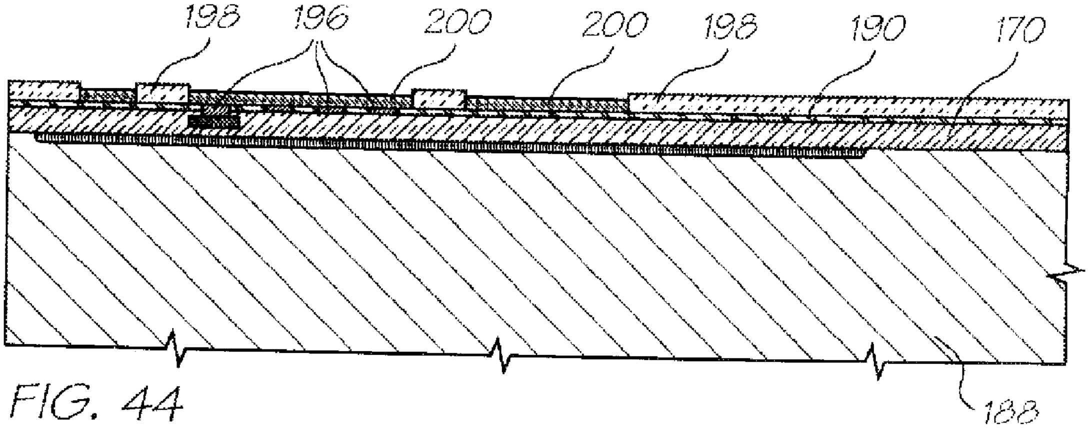
Figure 45:
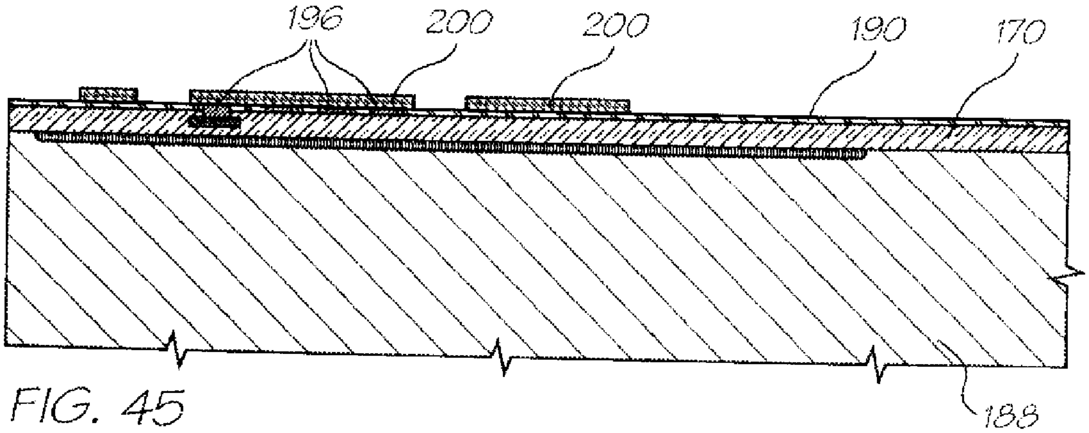
Figure 46:
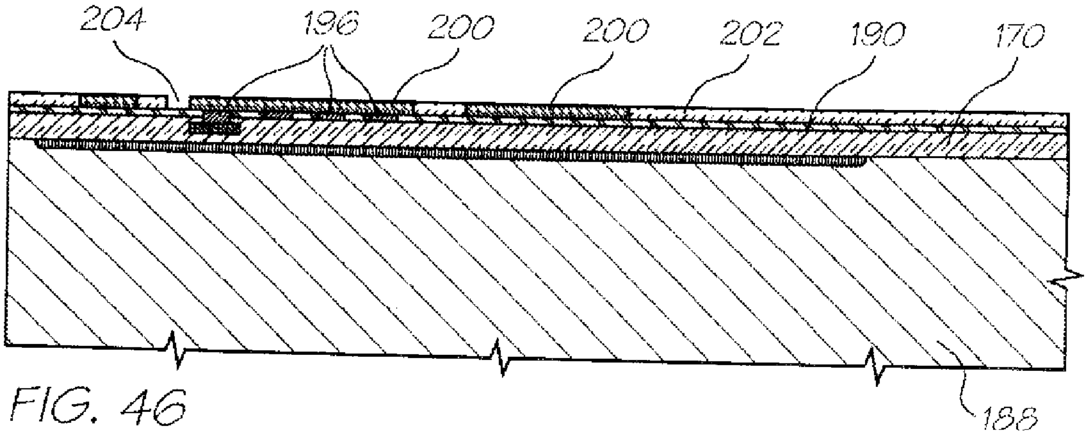
Figure 47:
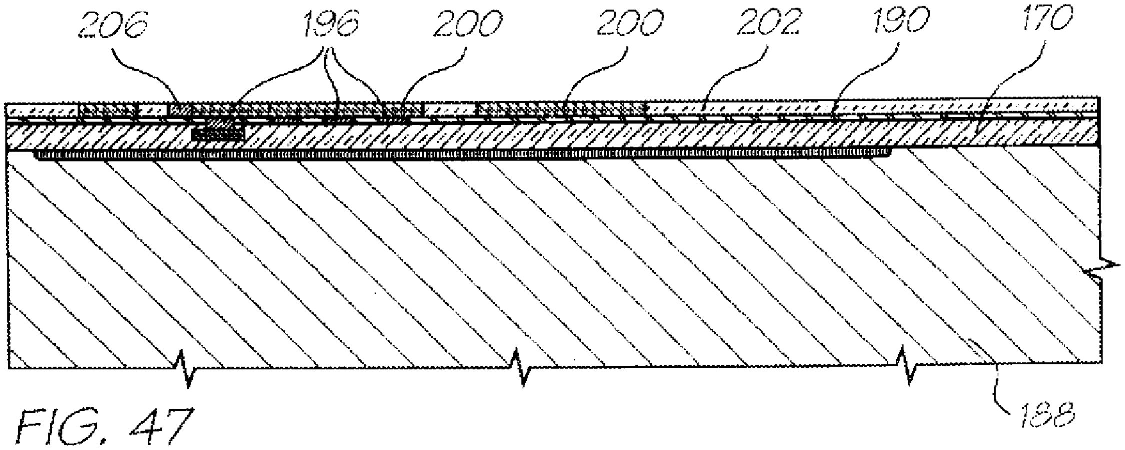
Figure 48:
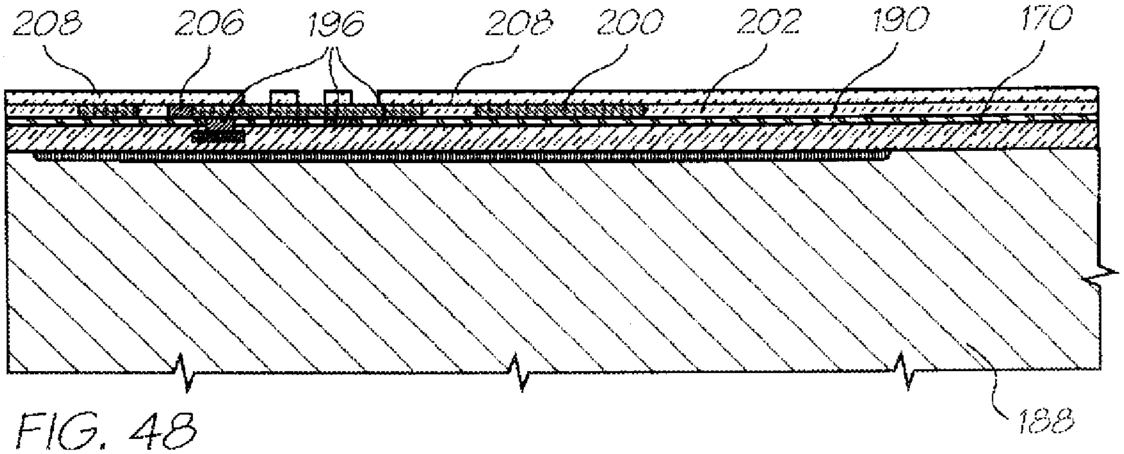
Figure 49:
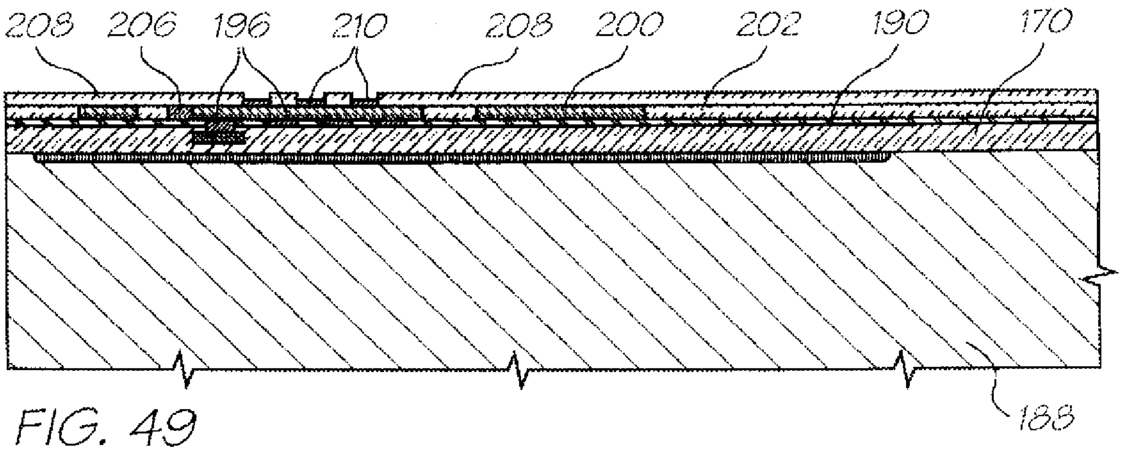
Figure 50:
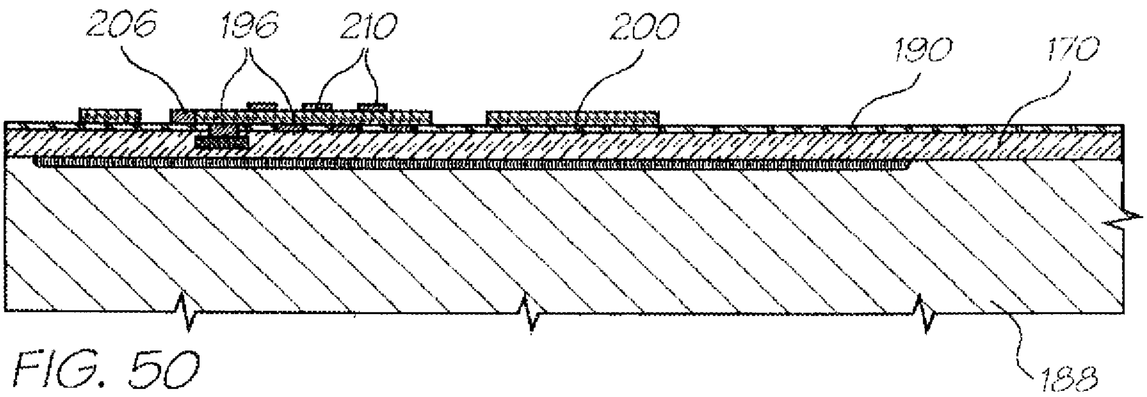
Figure 51:
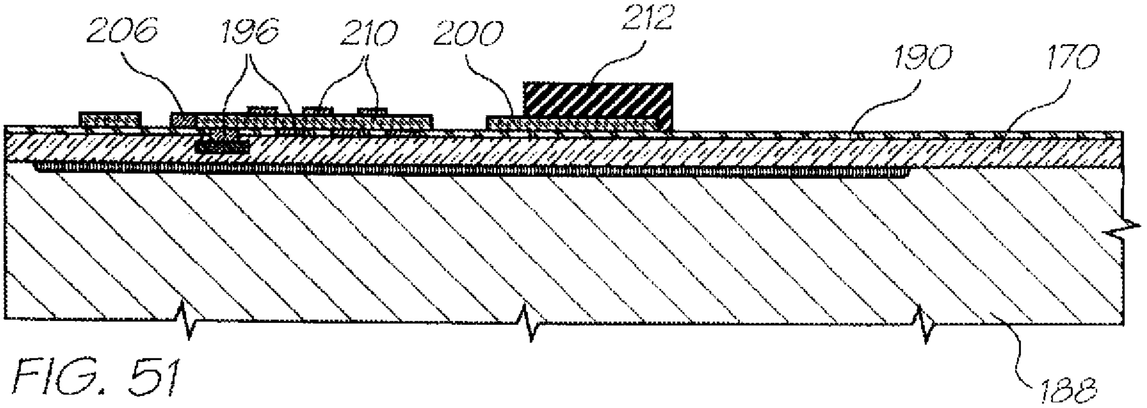
Figure 52:
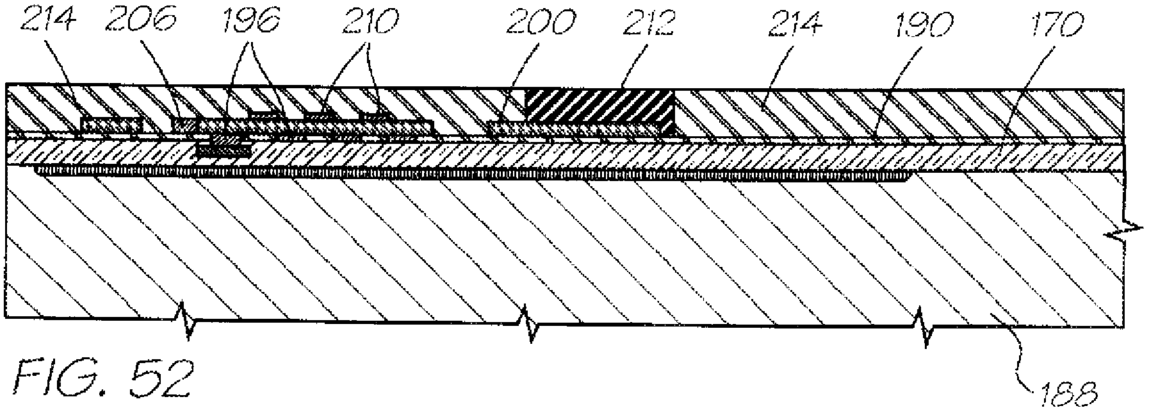
Figure 53:
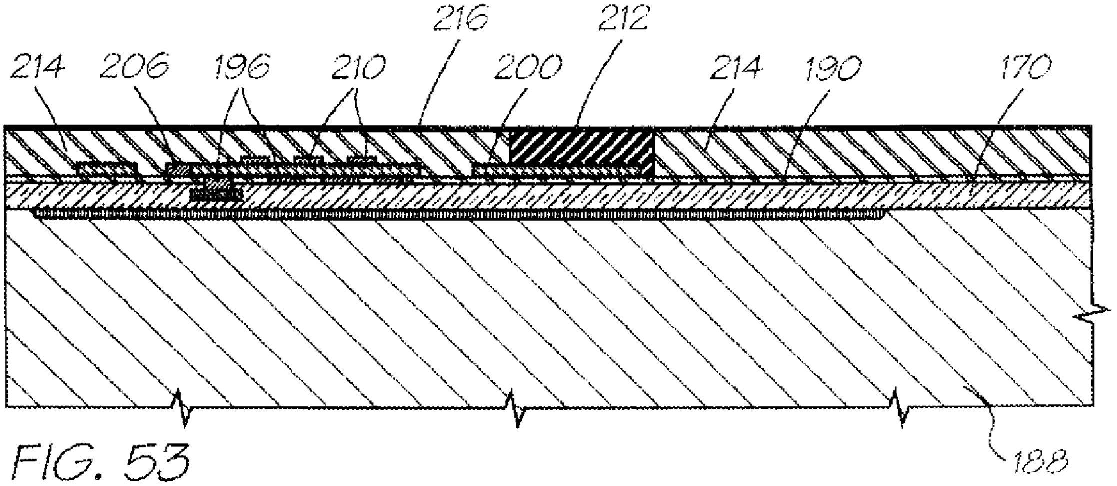
Figure 54:
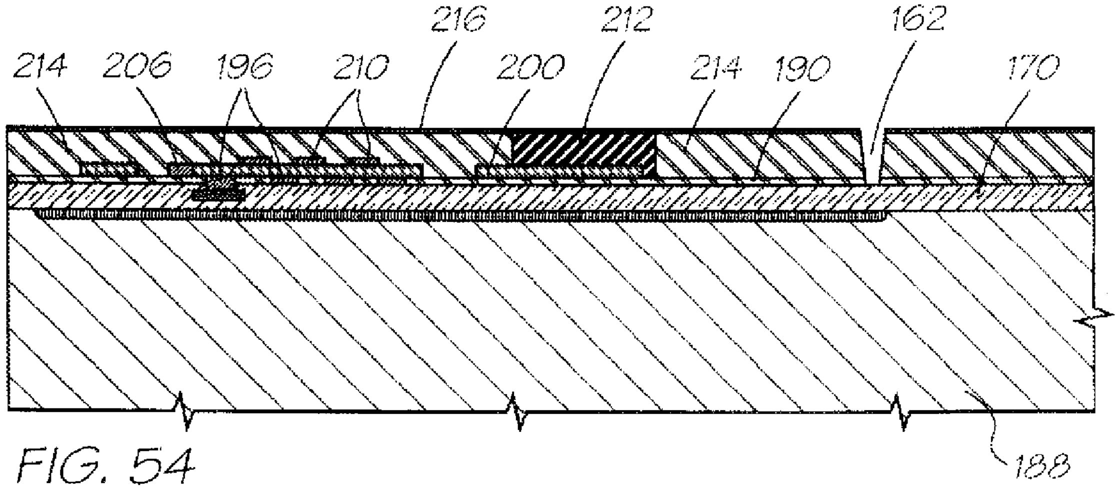
Figure 55:
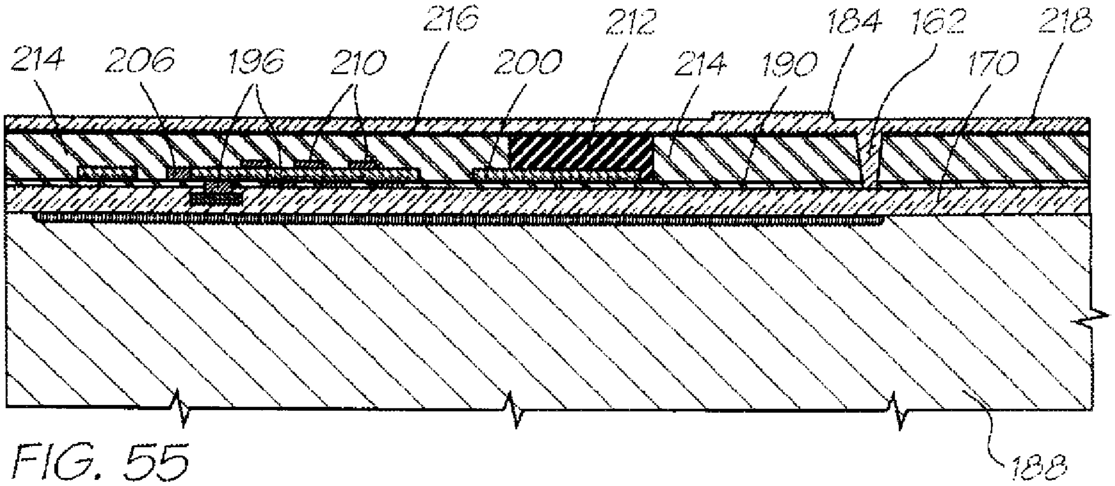
Figure 56:
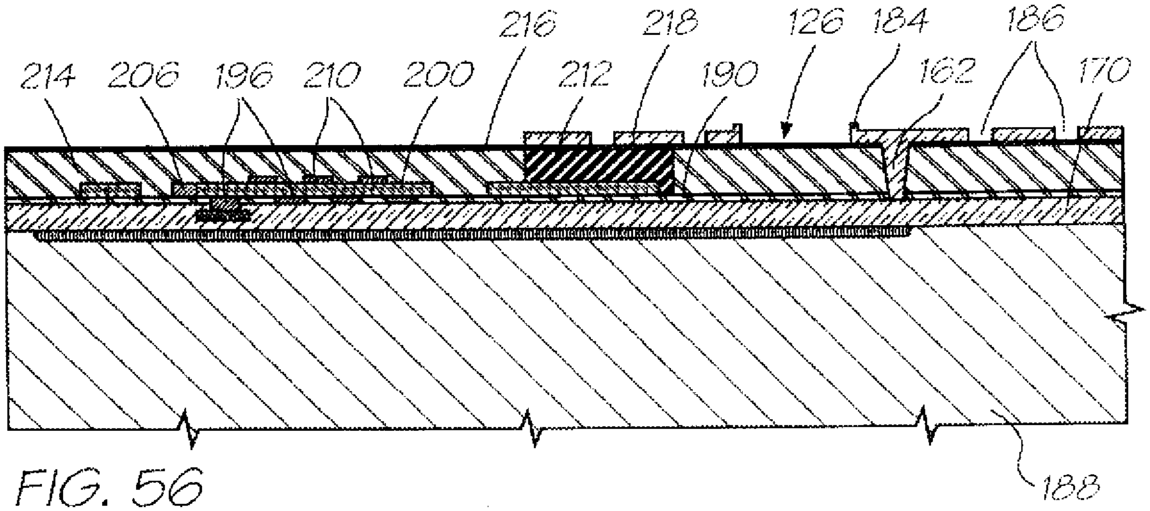
Figure 57:
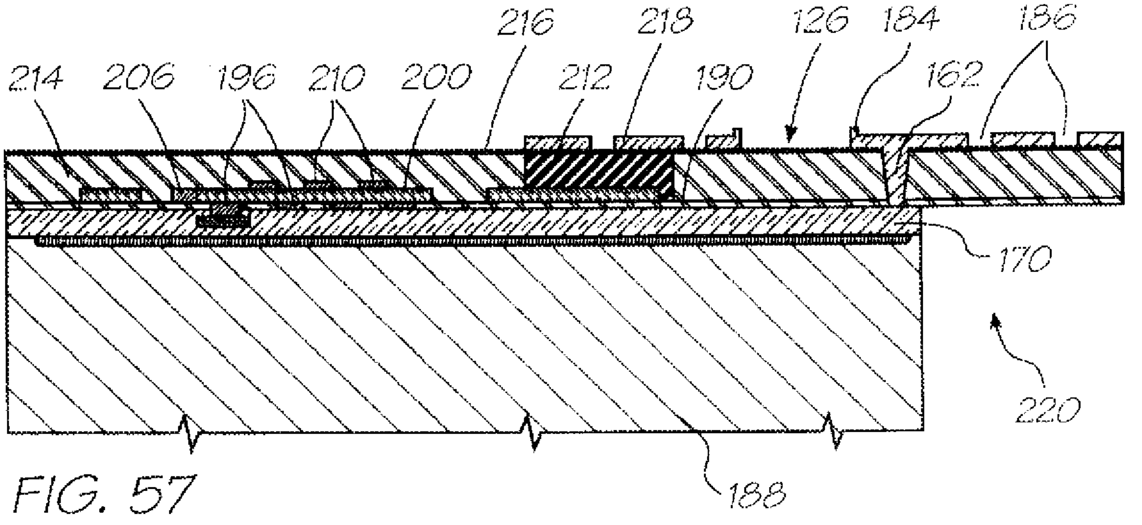
Figure 58:
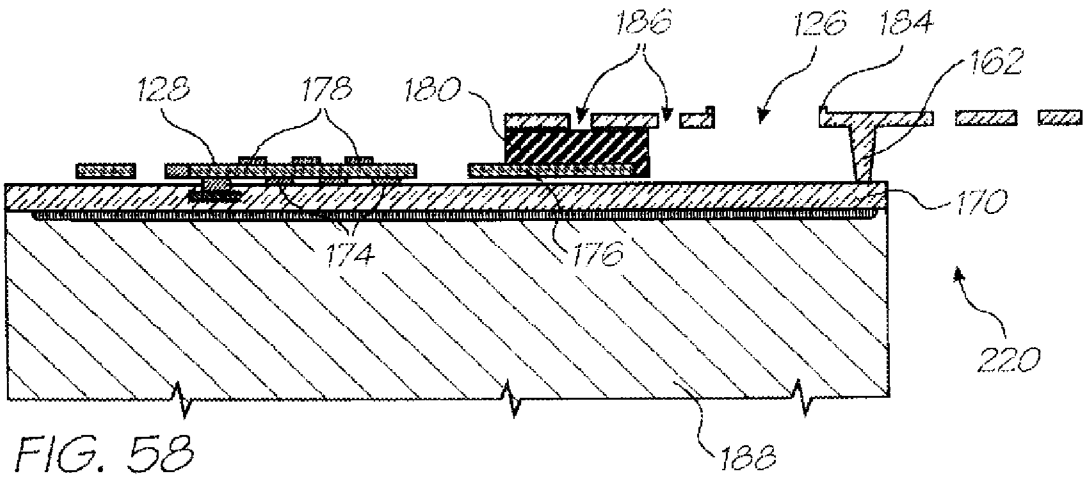
Figure 59:
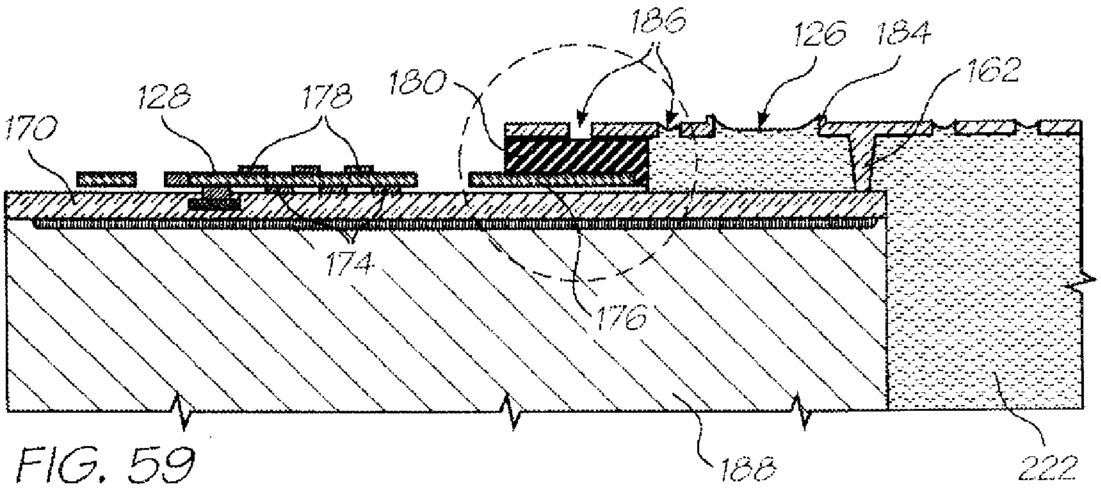
Figure 59A:
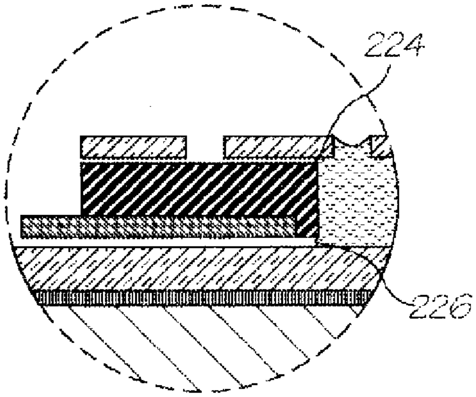
Figure 62:
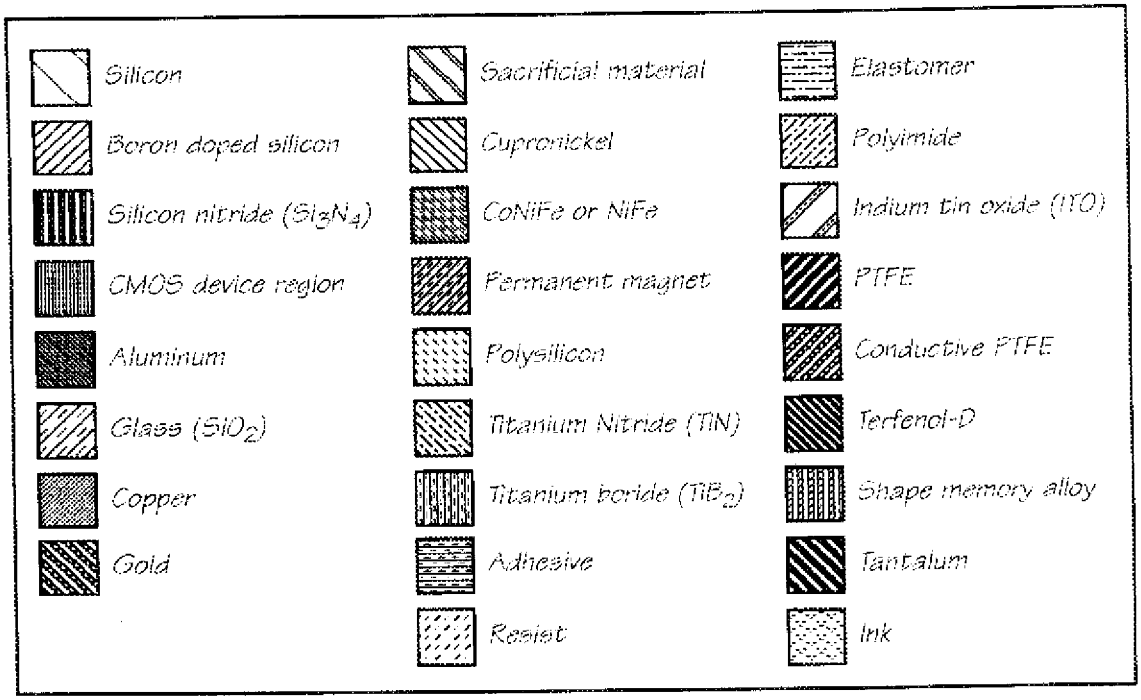
Figure 63:
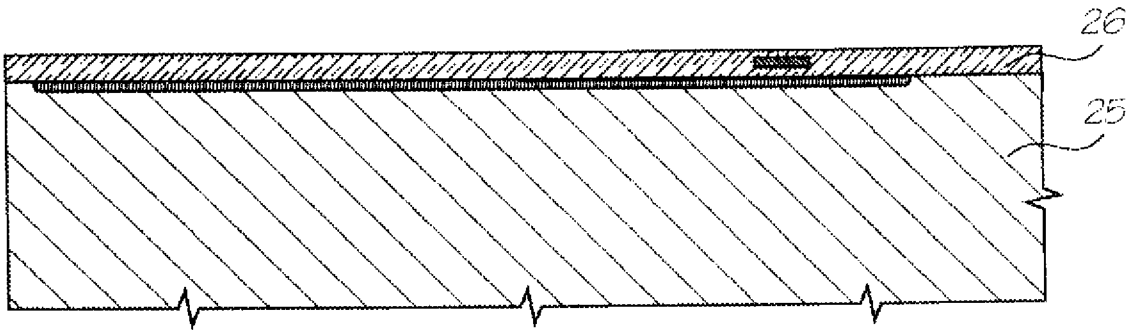
Figure 64:
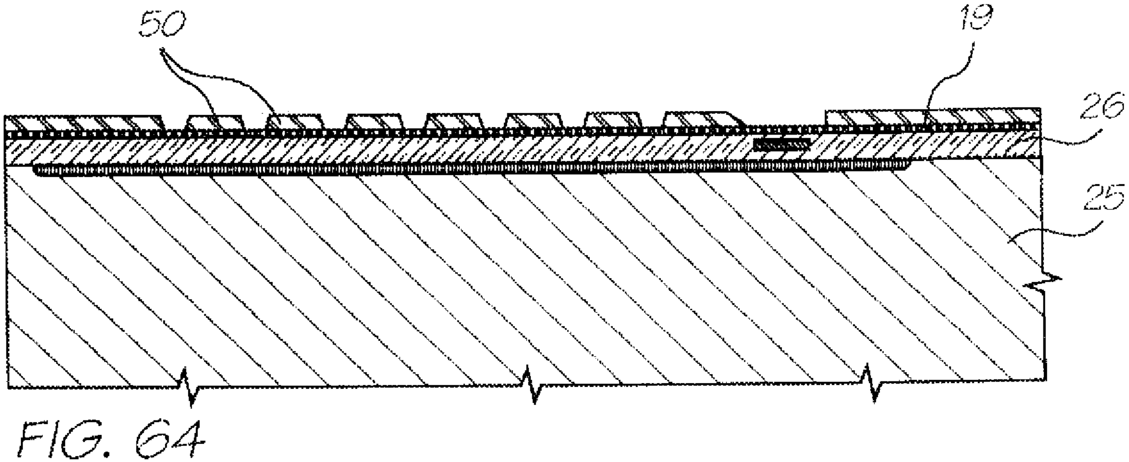
Figure 65:
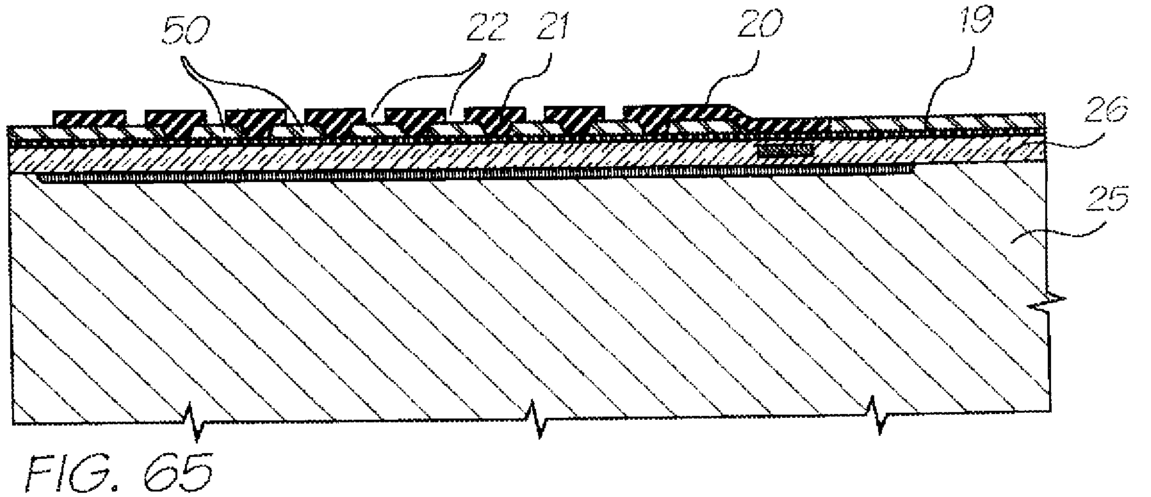
Figure 66:
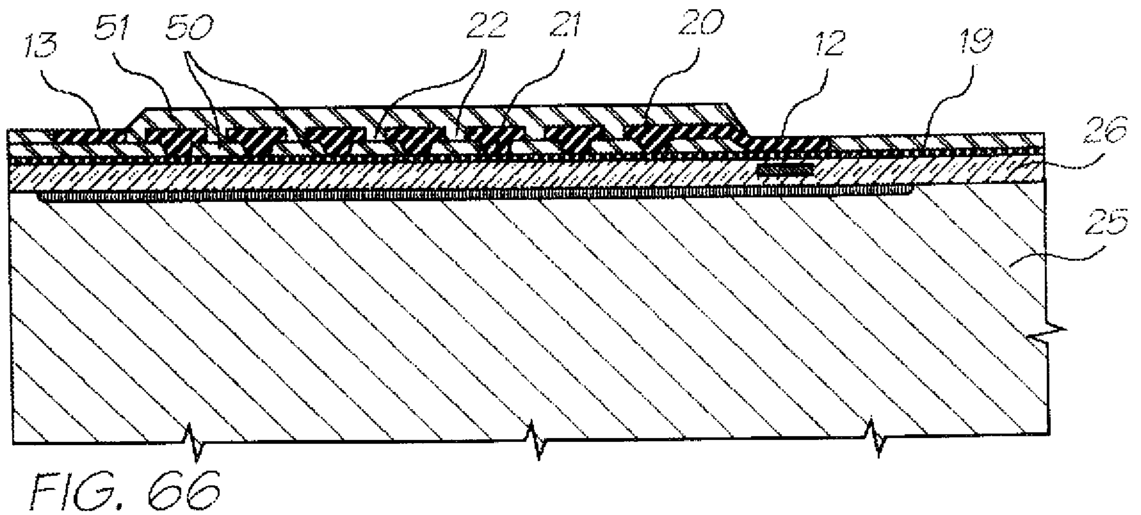
Figure 67:
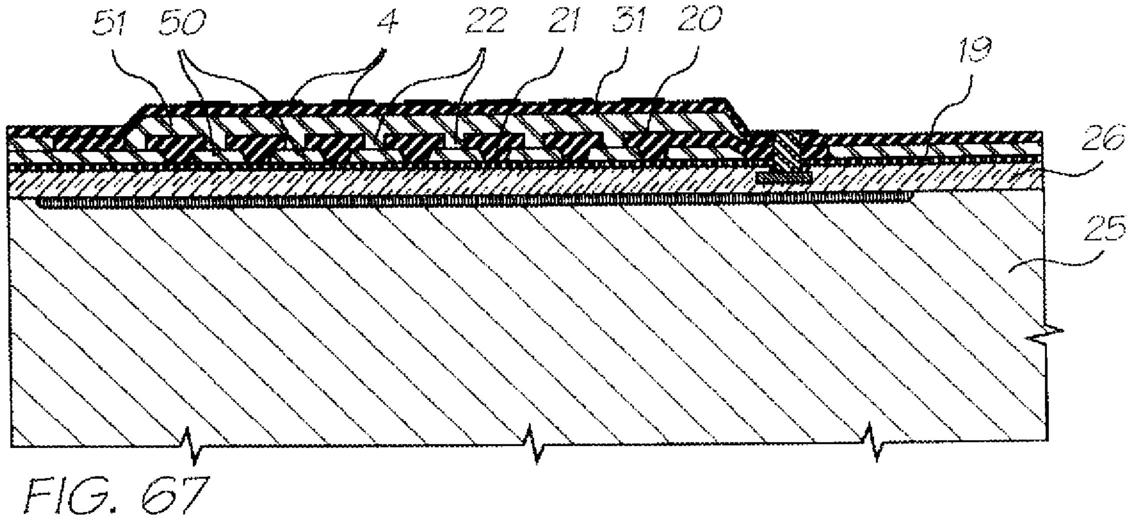
Figure 68:
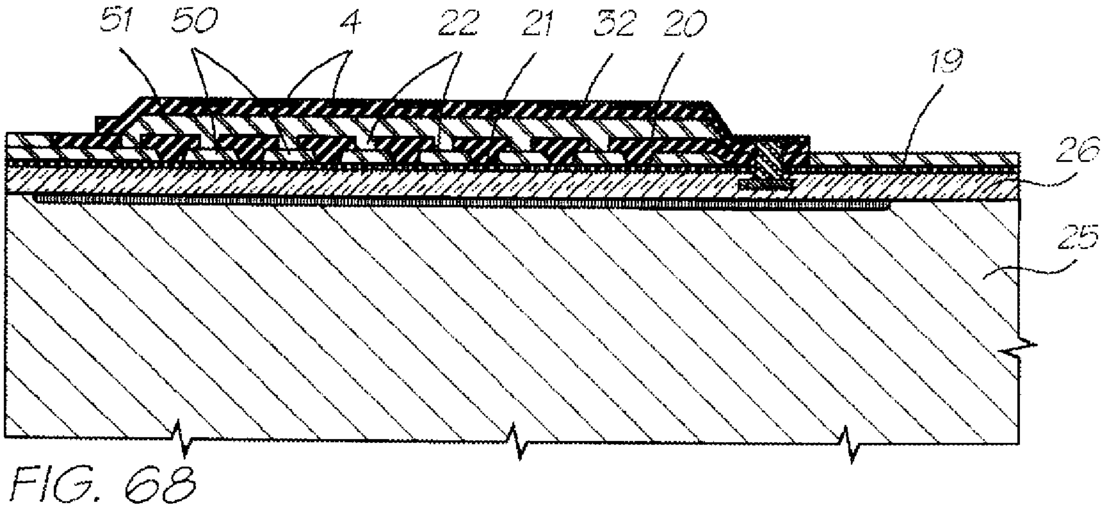
Figure 69:
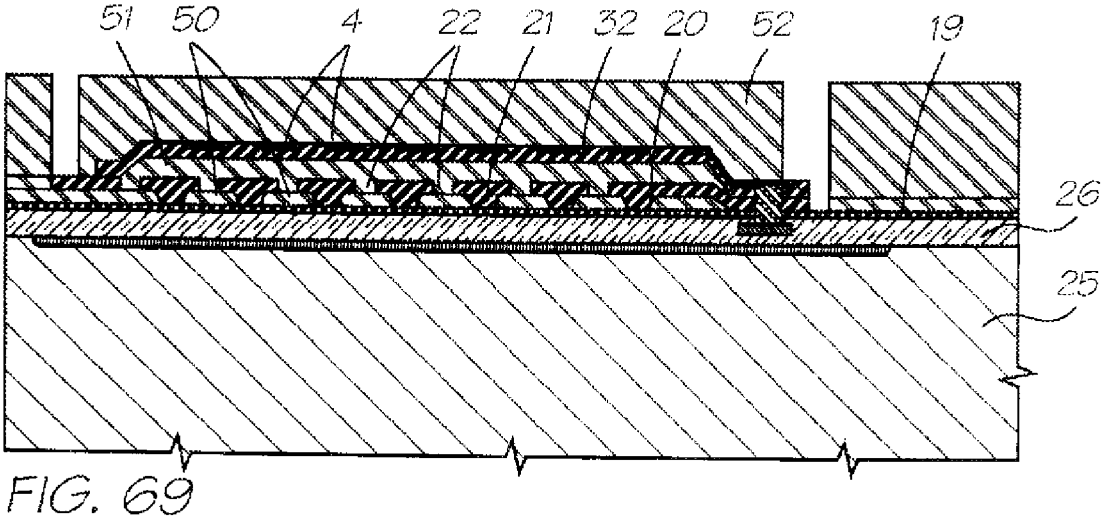
Figure 70:
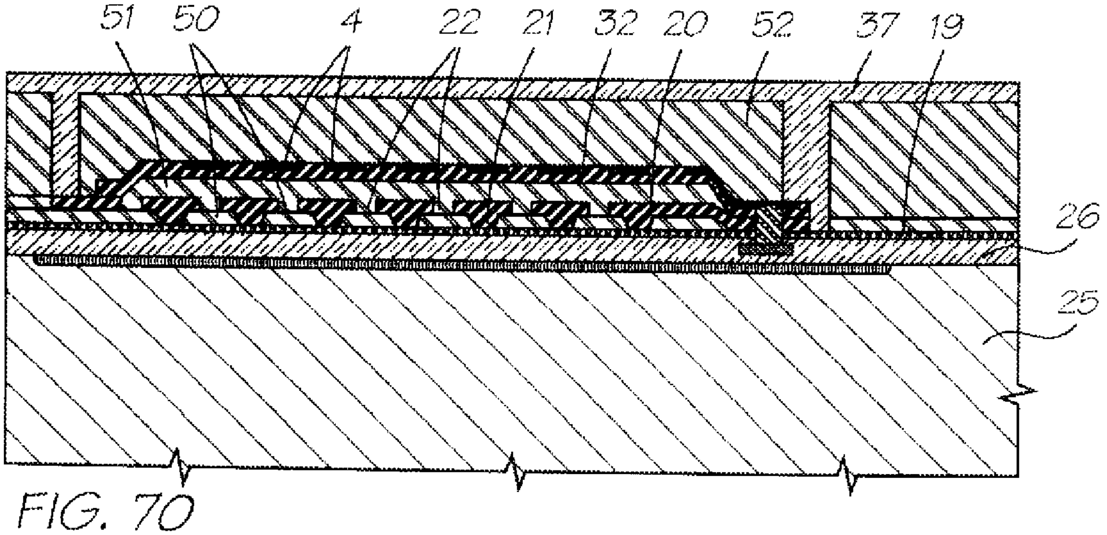
Figure 71:
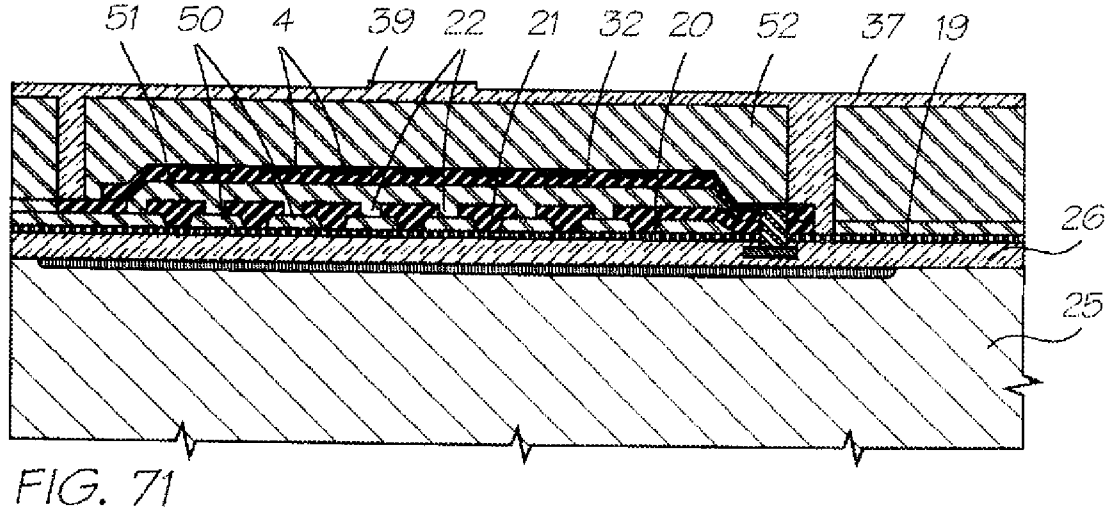
Figure 72:
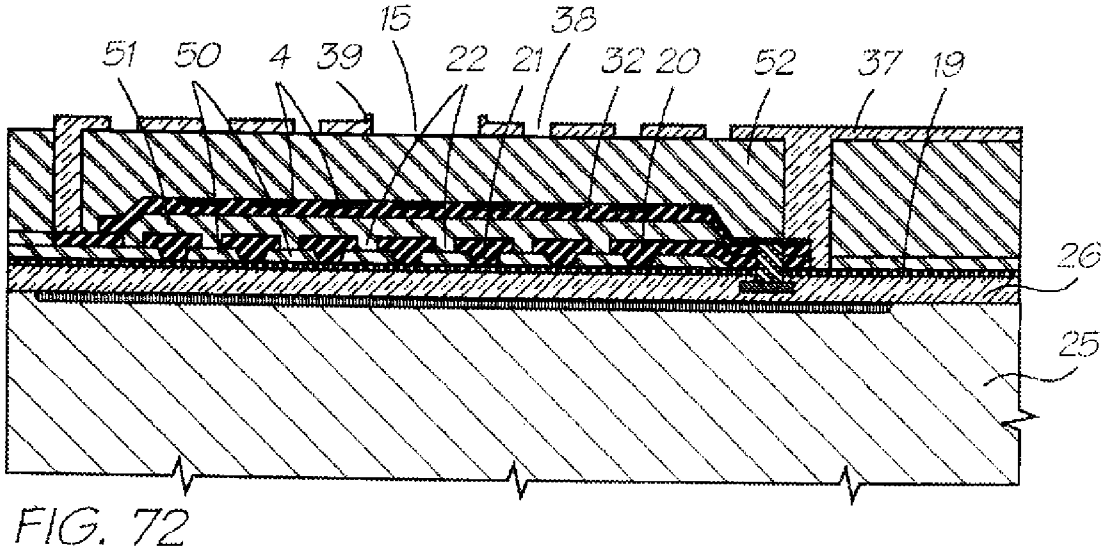
Figure 73:
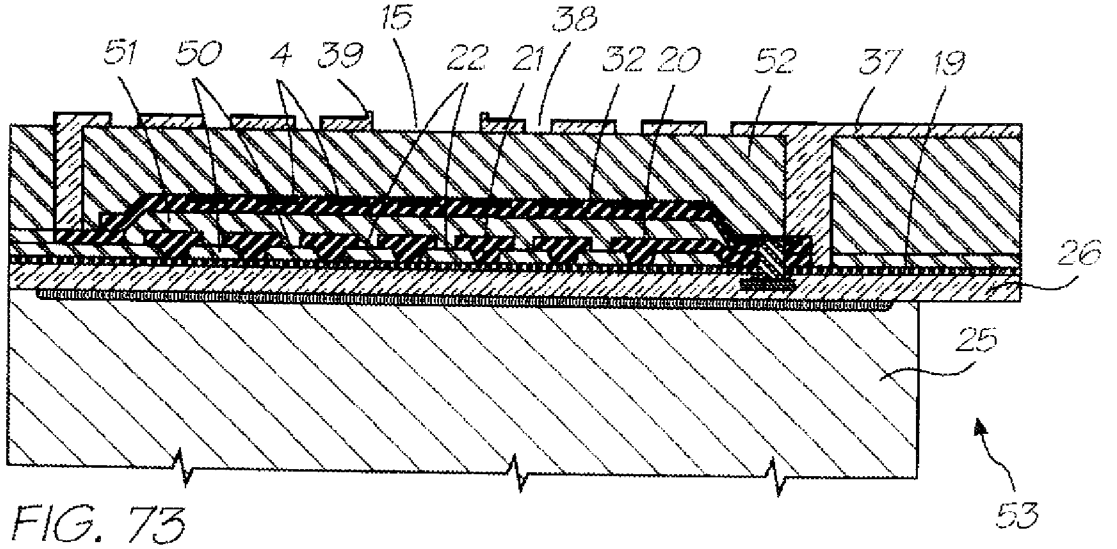
Figure 74:
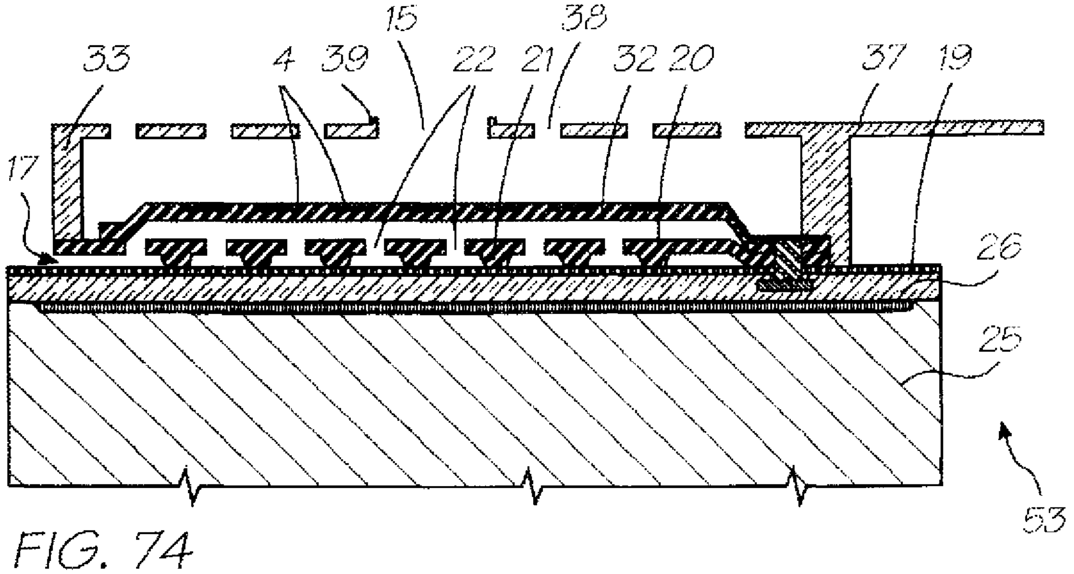
Figure 75:
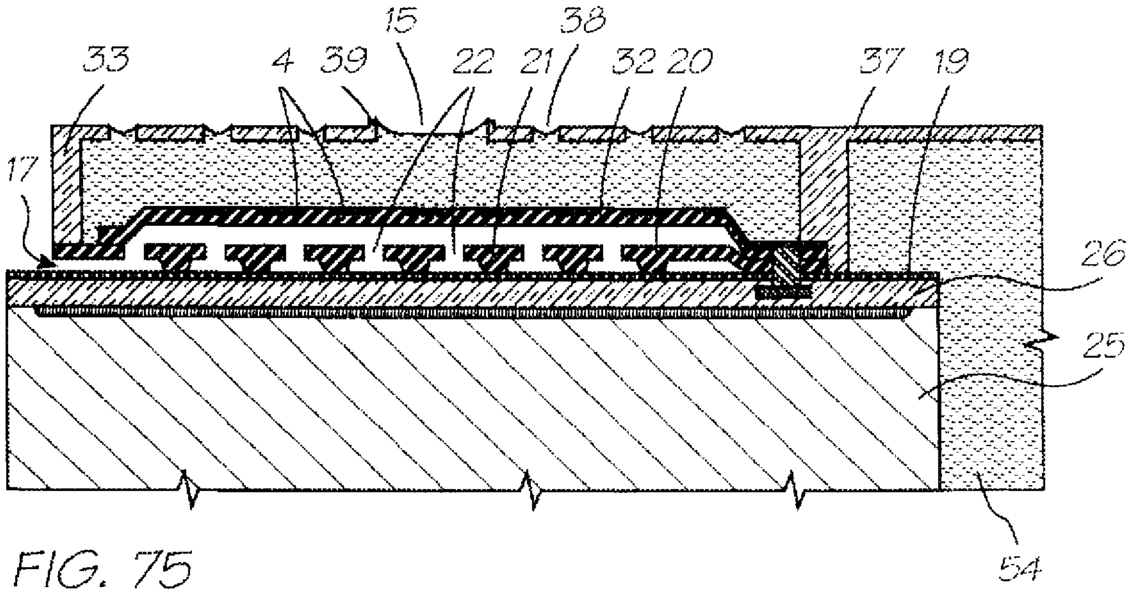

27. Fill the completed printheads with ink 54 and test them. A filled nozzle is shown in FIG. 75.

It will be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with inbuilt pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a registered trademark of the Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per printhead, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

| |
|---|
| low power (less than 10 Watts) |
| high resolution capability (1,600 dpi or more) |
| photographic quality output |
| low manufacturing cost |
| small size (pagewidth times minimum cross section) |
| high speed (<2 seconds per page). |

All of these features can be met or exceeded by the ink jet systems described above.

The invention claimed is:

1. A method of fabricating an inkjet printhead comprising the steps of:
   - forming a plurality of actuators on a monolithic substrate;
   - covering the actuators with a sacrificial material;
   - covering the sacrificial material with a printhead surface layer;
   - defining a plurality of nozzle apertures in the printhead surface layer such that each of the actuators corresponds to one of the nozzle apertures; and,
   - removing at least some of the sacrificial material on each of the actuators through the nozzle aperture corresponding to each of the actuators.

* * * * *

UNITED STATES PATENT AND TRADEMARK OFFICE

CERTIFICATE OF CORRECTION

PATENT NO. : 8,117,751 B2
APPLICATION NO. : 12/501473
DATED : February 21, 2012
INVENTOR(S) : Silverbrook It is certified that error appears in the above-identified patent and that said Letters Patent is hereby corrected as shown below:

The title page showing the illustrative figures should be deleted to be replaced with the attached title page.

In the drawing sheets, consisting of Figs. 4-15, 18-35, 38-59A and 62-75, should be deleted to be replaced with the drawing sheets, consisting of Figs. 4-15, 18-35, 38-59A and 62-75, as shown on the attached pages.

Signed and Sealed this
Twenty-ninth Day of May, 2012

David J. Kappos
*Director of the United States Patent and Trademark Office*

(12) United States Patent
Silverbrook

(10) Patent No.: US 8,117,751 B2
(45) Date of Patent: Feb. 21, 2012

(54) METHOD OF FORMING PRINTHEAD BY REMOVING SACRIFICIAL MATERIAL THROUGH NOZZLE APERTURES

(75) Inventor: Kia Silverbrook, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 173 days.

(21) Appl. No.: 12/501,473

(22) Filed: Jul. 12, 2009

(65) Prior Publication Data

US 2009/0275151 A1 Nov. 5, 2009

Related U.S. Application Data

(63) Continuation-in-part of application No. 11/926,109, filed on Oct. 28, 2007, now Pat. No. 7,568,788, which is a continuation of application No. 11/778,572, filed on Jul. 16, 2007, now Pat. No. 7,566,113, which is a continuation of application No. 11/349,074, filed on Feb. 8, 2006, now Pat. No. 7,255,424, which is a continuation of application No. 10/982,789, filed on Nov. 8, 2004, now Pat. No. 7,086,720, which is a continuation of application No. 10/421,823, filed on Apr. 24, 2003, now Pat. No. 6,830,316, which is a continuation of application No. 09/113,122, filed on Jul. 10, 1998, now Pat. No. 6,557,977.

(30) Foreign Application Priority Data

Jul. 15, 1997 (AU) .................................. PO7991
Jul. 15, 1997 (AU) .................................. PO8004

(51) Int. Cl.

| | |
|---|---|
| ***B21D 53/76*** | (2006.01) |
| ***B23P 17/00*** | (2006.01) |
| ***H01L 41/22*** | (2006.01) |
| ***H04R 17/00*** | (2006.01) |
| ***B41J 2/15*** | (2006.01) |
| ***B41J 2/145*** | (2006.01) |
| ***B41J 2/135*** | (2006.01) |

(52) U.S. Cl. .......... 29/890.1; 29/25.35; 347/40; 347/44

(58) Field of Classification Search .............. 29/890.1, 29/25.35; 310/311, 316.01, 317; 347/20, 347/40, 44, 65, 68–70

See application file for complete search history.

(56) References Cited

U.S. PATENT DOCUMENTS

| | | | | | |
|---|---|---|---|---|---|
| 4,032,929 | A | * | 6/1977 | Fischbeck et al. | 347/42 |
| 4,210,920 | A | * | 7/1980 | Burnett et al | 347/75 |
| 4,460,905 | A | * | 7/1984 | Thomas | 347/54 |
| 4,499,480 | A | * | 2/1985 | Takatori et al | 347/42 |
| 4,576,111 | A | * | 3/1986 | Slomianny | 118/313 |
| 4,633,267 | A | * | 12/1986 | Meinhof | 347/54 |
| 4,684,913 | A | * | 8/1987 | Yaeger | 337/140 |

(Continued)

FOREIGN PATENT DOCUMENTS

DE 3245283 A 6/1984

(Continued)

*Primary Examiner* — David Angwin

(57) ABSTRACT

A method of fabricating an inkjet printhead by forming a plurality of actuators on a monolithic substrate, covering the actuators with a sacrificial material, covering the sacrificial material with a printhead surface layer, defining a plurality of nozzle apertures in the printhead surface layer such that each of the actuators corresponds to one of the nozzle apertures and then, removing at least some of the sacrificial material on each of the actuators through the nozzle aperture corresponding to each of the actuators.

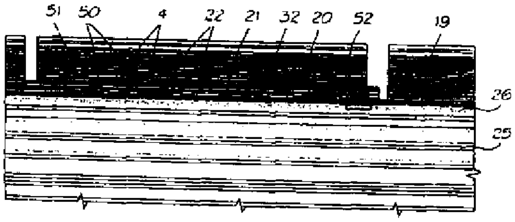

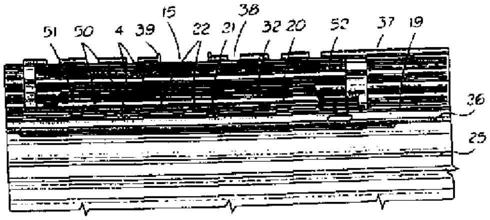

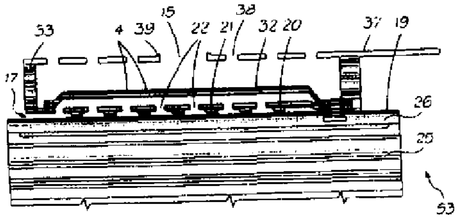

1 Claim, 32 Drawing Sheets